US011932129B2

(12) United States Patent
Kalouche

(10) Patent No.: US 11,932,129 B2
(45) Date of Patent: Mar. 19, 2024

(54) MOBILE ROBOT HAVING PNEUMATIC CHARGING SYSTEM

(71) Applicant: Nimble Robotics, Inc., San Francisco, CA (US)

(72) Inventor: Simon Kalouche, San Francisco, CA (US)

(73) Assignee: Nimble Robotics, Inc., San Francisco, CA (US)

(*) Notice: Subject to any disclaimer, the term of this patent is extended or adjusted under 35 U.S.C. 154(b) by 623 days.

(21) Appl. No.: 17/128,805

(22) Filed: Dec. 21, 2020

(65) Prior Publication Data

US 2022/0194248 A1 Jun. 23, 2022

(51) Int. Cl.
*B60L 53/50* (2019.01)
*B60L 53/30* (2019.01)
*B65G 1/04* (2006.01)
*B65G 1/06* (2006.01)
*B66F 9/075* (2006.01)
*H10N 30/30* (2023.01)

(52) U.S. Cl.
CPC ............. *B60L 53/50* (2019.02); *B60L 53/30* (2019.02); *B65G 1/0464* (2013.01); *B65G 1/065* (2013.01); *B66F 9/07504* (2013.01); *H10N 30/30* (2023.02)

(58) Field of Classification Search
CPC .......... B60L 53/50; B60L 53/30; B60L 53/14; B60L 50/60; B60L 2200/44; B65G 1/0464; B65G 1/065; B65G 1/0485; B65G 1/1375; B65G 47/91; B66F 9/07504; B66F 9/063; B66F 9/181; B66F 9/205; H10N 30/30; H02N 2/185; Y02T 90/12

USPC ........................................................ 320/109
See application file for complete search history.

(56) References Cited

U.S. PATENT DOCUMENTS 4,610,263 A * 9/1986 Barnes ................ G05D 16/202
   137/85
4,630,631 A * 12/1986 Barnes ...................... F15C 3/14
   137/487.5

(Continued)

FOREIGN PATENT DOCUMENTS

CA      2764948 A1 * 12/2010 ............. B60L 15/38
CA      3117483 A1 *  9/2019 .......... B25J 15/0019

(Continued)

OTHER PUBLICATIONS

Akira Wada et al., (Akira) "Untethered Three-Arm Pneumatic Robot using Hose-free Pneumatic Actuator", 2016 IEEE/RSJ International Conference on Intelligent Robots and Systems (IROS) Daejeon Convention Center Oct. 9-14, 2016, Daejeon, Korea, pp. 543-548 (Year: 2016).*

(Continued)

*Primary Examiner* — M Baye Diao
(74) *Attorney, Agent, or Firm* — Lerner David LLP

(57) ABSTRACT

A mobile manipulator robot having a pneumatic charging system. The mobile robot includes an energy source and a charging system to charge the energy source. The charging system includes a coupler having a mating end configured to mate with an external pneumatic supply system to access a pneumatic supply and a pneumatic actuator disposed downstream of the coupler. The pneumatic actuator is configured to convert energy from the pneumatic supply to charge the energy source. The pneumatic actuator may be an air motor or a piezo.

22 Claims, 38 Drawing Sheets

(56) References Cited

U.S. PATENT DOCUMENTS

| | | | |
|---|---|---|---|
| 4,809,747 | A | 3/1989 | Choly et al. |
| 4,836,111 | A | 6/1989 | Kaufmann |
| 5,121,604 | A * | 6/1992 | Berger .................. F02B 37/18 60/602 |
| 5,640,995 | A * | 6/1997 | Packard .................. A61M 1/14 137/884 |
| 5,738,303 | A * | 4/1998 | Hamatani .............. B64D 25/14 244/905 |
| 5,993,365 | A | 11/1999 | Stagnitto et al. |
| 6,654,662 | B1 | 11/2003 | Hognaland |
| 7,181,314 | B2 | 2/2007 | Zhang et al. |
| 8,240,726 | B2 | 8/2012 | Subotincic |
| 8,434,414 | B2 | 5/2013 | Wessel et al. |
| 8,718,814 | B1 | 5/2014 | Clark et al. |
| 9,266,440 | B2 * | 2/2016 | Gao .................. B60L 53/35 |
| 9,458,604 | B2 * | 10/2016 | Zhang .................. E02F 9/2292 |
| 9,465,386 | B2 | 10/2016 | Huang et al. |
| 9,486,926 | B2 | 11/2016 | Kawano |
| 9,540,171 | B2 | 1/2017 | Elazary et al. |
| 9,550,624 | B2 | 1/2017 | Khodl et al. |
| 9,623,569 | B2 | 4/2017 | McCollum et al. |
| 9,642,759 | B2 * | 5/2017 | Stryker .................. A61G 7/012 |
| 9,650,215 | B2 | 5/2017 | Girtman |
| 9,682,822 | B2 | 6/2017 | Lindbo et al. |
| 9,688,472 | B1 | 6/2017 | Stubbs et al. |
| 9,785,911 | B2 | 10/2017 | Galluzzo et al. |
| 9,815,625 | B2 | 11/2017 | DeWitt et al. |
| 9,873,408 | B2 * | 1/2018 | Capizzo .................. B60L 53/66 |
| 9,909,889 | B2 * | 3/2018 | Hall .................. G06Q 50/06 |
| 9,940,604 | B2 | 4/2018 | Galluzzo et al. |
| 9,987,748 | B2 | 6/2018 | Stubbs et al. |
| 10,000,337 | B2 | 6/2018 | Lindbo et al. |
| 10,054,950 | B2 * | 8/2018 | Carrasco Zanini ..... H02J 50/10 |
| 10,086,519 | B2 | 10/2018 | Wagner et al. |
| 10,112,771 | B2 | 10/2018 | D'Andrea et al. |
| 10,147,069 | B2 | 12/2018 | Galluzzo et al. |
| 10,189,641 | B2 | 1/2019 | Hognaland |
| 10,272,566 | B2 | 4/2019 | Wellman et al. |
| 10,315,315 | B2 | 6/2019 | Wagner et al. |
| 10,322,506 | B2 | 6/2019 | Ding et al. |
| 10,350,755 | B2 | 7/2019 | Wagner et al. |
| 10,379,143 | B2 * | 8/2019 | Books .................. G01R 19/0092 |
| 10,435,241 | B2 | 10/2019 | Lert et al. |
| 10,438,034 | B2 | 10/2019 | Wagner et al. |
| 10,500,735 | B1 | 12/2019 | Menon et al. |
| 10,549,928 | B1 | 2/2020 | Chavez et al. |
| 10,576,507 | B2 | 3/2020 | Jain et al. |
| 10,611,037 | B1 | 4/2020 | Polido et al. |
| 10,669,768 | B2 * | 6/2020 | Amacker .................. H02J 50/10 |
| 10,828,767 | B2 * | 11/2020 | Smith .................. A61F 2/64 |
| 10,940,999 | B2 * | 3/2021 | Kalouche .................. B25J 9/162 |
| 10,953,555 | B2 * | 3/2021 | Altman .................. H02J 7/0045 |
| 11,027,921 | B2 * | 6/2021 | Cole .................. B25J 15/0047 |
| 11,429,099 | B2 * | 8/2022 | Smith .................. G05D 1/0276 |
| 11,724,381 | B2 * | 8/2023 | Kalouche .................. B25J 5/007 700/214 |
| 2006/0278454 | A1 * | 12/2006 | Maggio .................. B63B 59/10 180/164 |
| 2013/0110280 | A1 | 5/2013 | Folk |
| 2014/0014470 | A1 | 1/2014 | Razumov |
| 2015/0098775 | A1 | 4/2015 | Razumov |
| 2015/0192149 | A1 * | 7/2015 | Ma .................. E02F 9/2292 60/484 |
| 2015/0230369 | A1 | 8/2015 | Danek et al. |
| 2016/0132059 | A1 * | 5/2016 | Mason .................. G05D 1/0291 701/28 |
| 2016/0268823 | A1 * | 9/2016 | Gonzalez .................. H02J 7/00 |
| 2016/0272421 | A1 | 9/2016 | Hognaland |
| 2016/0297610 | A1 | 10/2016 | Grosse |
| 2016/0347545 | A1 | 12/2016 | Lindbo et al. |
| 2016/0361821 | A1 | 12/2016 | Lessing et al. |
| 2017/0080579 | A1 | 3/2017 | Wagner et al. |
| 2017/0157649 | A1 | 6/2017 | Wagner et al. |
| 2017/0197316 | A1 | 7/2017 | Wagner et al. |
| 2017/0313514 | A1 | 11/2017 | Lert, Jr. et al. |
| 2018/0029797 | A1 | 2/2018 | Hance et al. |
| 2018/0057263 | A1 | 3/2018 | Beer |
| 2018/0127219 | A1 | 5/2018 | Wagner et al. |
| 2018/0133968 | A1 | 5/2018 | Zeulner |
| 2018/0265291 | A1 | 9/2018 | Wagner et al. |
| 2018/0265311 | A1 | 9/2018 | Wagner et al. |
| 2018/0319590 | A1 | 11/2018 | Lindbo et al. |
| 2018/0346243 | A1 | 12/2018 | Lindbo et al. |
| 2018/0354723 | A1 | 12/2018 | Peebles et al. |
| 2019/0084152 | A1 | 3/2019 | Deacon |
| 2019/0135555 | A1 | 5/2019 | Wagner et al. |
| 2019/0176348 | A1 | 6/2019 | Bingham et al. |
| 2019/0291955 | A1 * | 9/2019 | Bastian, II .......... B65G 1/1373 |
| 2019/0339693 | A1 | 11/2019 | Menon et al. |
| 2019/0361672 | A1 | 11/2019 | Odhner et al. |
| 2020/0017314 | A1 | 1/2020 | Rose et al. |
| 2020/0031575 | A1 | 1/2020 | Hognaland |
| 2020/0094997 | A1 | 3/2020 | Menon et al. |
| 2020/0189122 | A1 | 6/2020 | Polido et al. |
| 2020/0324975 | A1 * | 10/2020 | Cole .................. B25J 15/0047 |
| 2020/0407165 | A1 | 12/2020 | Roth et al. |

FOREIGN PATENT DOCUMENTS

| | | |
|---|---|---|
| CN | 103122771 | 1/2015 |
| DE | 102010002317 A1 | 8/2011 |
| EP | 2708335 A1 | 3/2014 |
| JP | 2017132002 A | 8/2017 |
| KR | 20170052784 A | 5/2017 |
| NO | 317366 B1 | 10/2004 |
| WO | 2012083333 A2 | 6/2012 |
| WO | 2014040843 A1 | 3/2014 |
| WO | 2015019055 A1 | 2/2015 |
| WO | 2016063197 A1 | 4/2016 |
| WO | WO-2017044576 A1 * | 3/2017 ............... B60R 1/00 |
| WO | 2018234155 A1 | 12/2018 |
| WO | 2019084457 A9 | 9/2019 |
| WO | 2020018468 A1 | 1/2020 |
| WO | 2020023861 A1 | 1/2020 |

OTHER PUBLICATIONS

Partial International Search Report including Provisional Opinion for Application No. PCT/US2020/043873, dated Nov. 2, 2020, pp. 1-37.

* cited by examiner

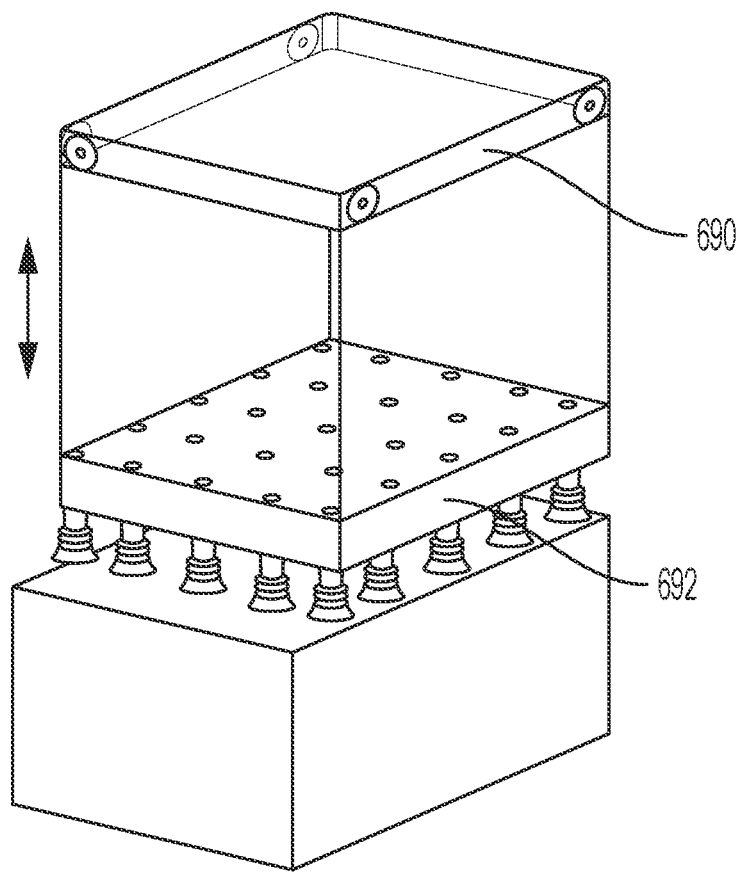
FIG. 16C
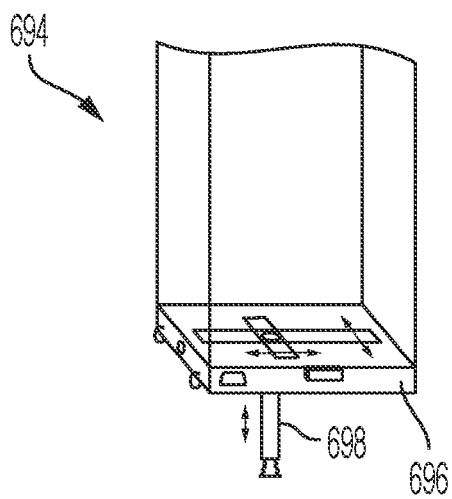 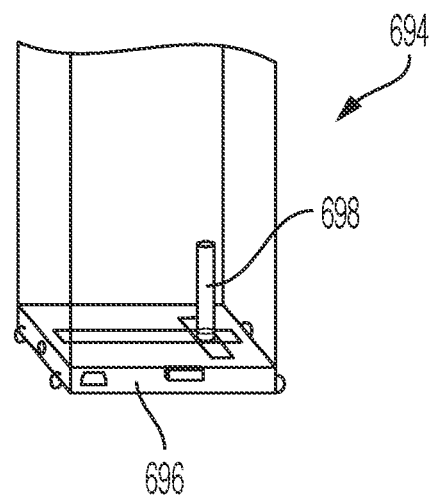
FIG. 16D  FIG. 16E

MOBILE ROBOT HAVING PNEUMATIC CHARGING SYSTEM

BACKGROUND OF THE DISCLOSURE

The present disclosure relates generally to storage systems and inventory retrieval methods, and more particularly, to a storage system and a mobile, manipulator robot for retrieving inventory items from the storage system.

Warehouses, or distribution fulfillment centers, require systems that enable the efficient storage and retrieval of a large number of diverse products. Traditionally, inventory items are stored in containers and arranged on rows of shelving on either side of an aisle. Each container, or bin, holds a plurality of items of one or more product types. The aisles provide access between the shelving for an operator or robot to migrate the aisles and retrieve the items. It is well understood that the aisles reduce the storage density of the system. In other words, the amount of space actually used for the storage of products (e.g., the shelving) is relatively small compared to the amount of space required for the storage system as a whole. As warehouse space is often scarce and expensive, alternative storage systems that maximize storage space are desired.

In one alternative approach, which offers a significant improvement in storage density, containers are stacked on top of one another and arranged in adjacent rows. That is, no aisle is provided between the adjacent rows of stacked containers. Thus, more containers, and in turn inventory, can be stored in a given space.

Various methods for retrieving inventory from the stacked containers have been contemplated. U.S. Pat. No. 10,189,641, for example, discloses a system in which containers are stacked and arranged in a plurality of rows underneath a grid. Vehicles equipped with a lifting apparatus navigate the grid and lift a desired container. The container is then transported down a port to a picking/sorting zone, where an operator or robot picks individual products from the container and sorts the products into one or more order containers. To minimize unnecessary transportation of the containers, each container is typically transported to the picking/sorting zone only after multiple orders of a specific product have been received.

Despite the increased storage density provided by the known stacked storage system, various shortcoming remain. For example, order fulfilment times are often lengthy, particularly for products that are ordered infrequently because the containers are retrieved in priority as a function of the number of products of one type that have been ordered. Additionally, the vehicles are required to navigate long distances (which takes considerable time and consumes considerable battery power) while driving bins back-and-fourth to the transportation ports. Furthermore, the required picking/sorting zones reduce the overall storage density of the warehouse and add additional complexity and costs. While the throughput of the stacked storage system can be increased by adding additional vehicles to the grid (or by modifying the system to include additional container transportation ports), there is a limit to the amount of vehicles that can be operated on the grid before the grid becomes overly congested with vehicles and the throughput of the system declines due to gridlock.

BRIEF SUMMARY OF THE DISCLOSURE

In accordance with a first aspect of the present disclosure, a high density storage structure is provided. The storage structure includes support members configured to house a plurality of containers, a first set of parallel rails to support a mobile, manipulator robot and a fluid supply line having a plurality of valves disposed within the supply line. Each of the valves have a closed condition in which the supply line is in fluid isolation from an outside environment and an open condition in which the supply line is in fluid communication with the outside environment such that a mobile, manipulator robot traversing the first set of parallel rails may receive a fluid supply from the fluid supply line.

In accordance with another aspect of the disclosure, a mobile, manipulator robot for retrieving inventory from the storage structure is provided. The robot may include a body having an interface configured to send processor readable data to a central processor and receive processor executable instructions from the central processor, a mobility assembly coupled to the body, a coupler selectively mateable to a port to receive a fluid supply from a supply line, and a picking arm connected to the body. The picking arm may be coupled to a first pneumatic gripping tool configured to grasp inventory items.

In accordance with yet another aspect of the disclosure, a method for controlling a mobile, manipulator robot to retrieve a product from a container located in a storage structure is provided. The method may include moving the mobile, manipulator robot over a first set of parallel rails of the storage structure and to a picking location, identifying a grasping region located on a product based at least in part upon image data obtained by a sensor attached to the mobile, manipulator robot, adjusting a picking arm equipped with a pneumatic gripping tool to a grasping pose, and grasping the product using the pneumatic gripping tool.

BRIEF DESCRIPTION OF THE DRAWINGS

FIG. 16C is a schematic perspective view of a hoist plate including a plurality of suction cups according to another embodiment of the present disclosure.

FIGS. 16D and 16E are schematic perspective views of a hoist plate including a retractable and moveable picking arm according to yet another embodiment of the present disclosure.

DETAILED DESCRIPTION

As used herein, when terms of orientation, for example, "vertical" and "horizontal" or relative terms such as, "above," "upwards," "beneath," "downwards" and the like are used to describe the orientation or relative position of specific features of the storage structure or mobile, manipulator robot, the terms are in reference to the orientation or the relative position of the features in the normal gravitational frame of reference when the storage structure is positioned with a bottom of the storage structure resting on a surface. Also as used herein, the terms "substantially," "generally,"

and "about" are intended to mean that slight deviations from absolute are included within the scope of the term so modified.

Figure 1:
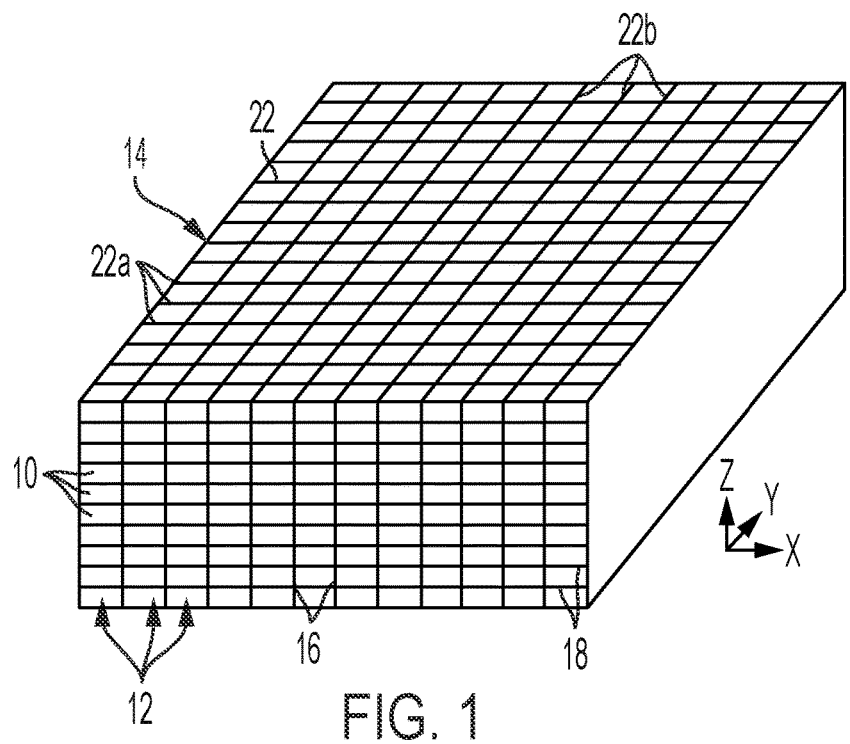
FIG. 1 is a schematic perspective view of a frame structure for housing a plurality of stacked containers according to the prior art.
Figure 2:
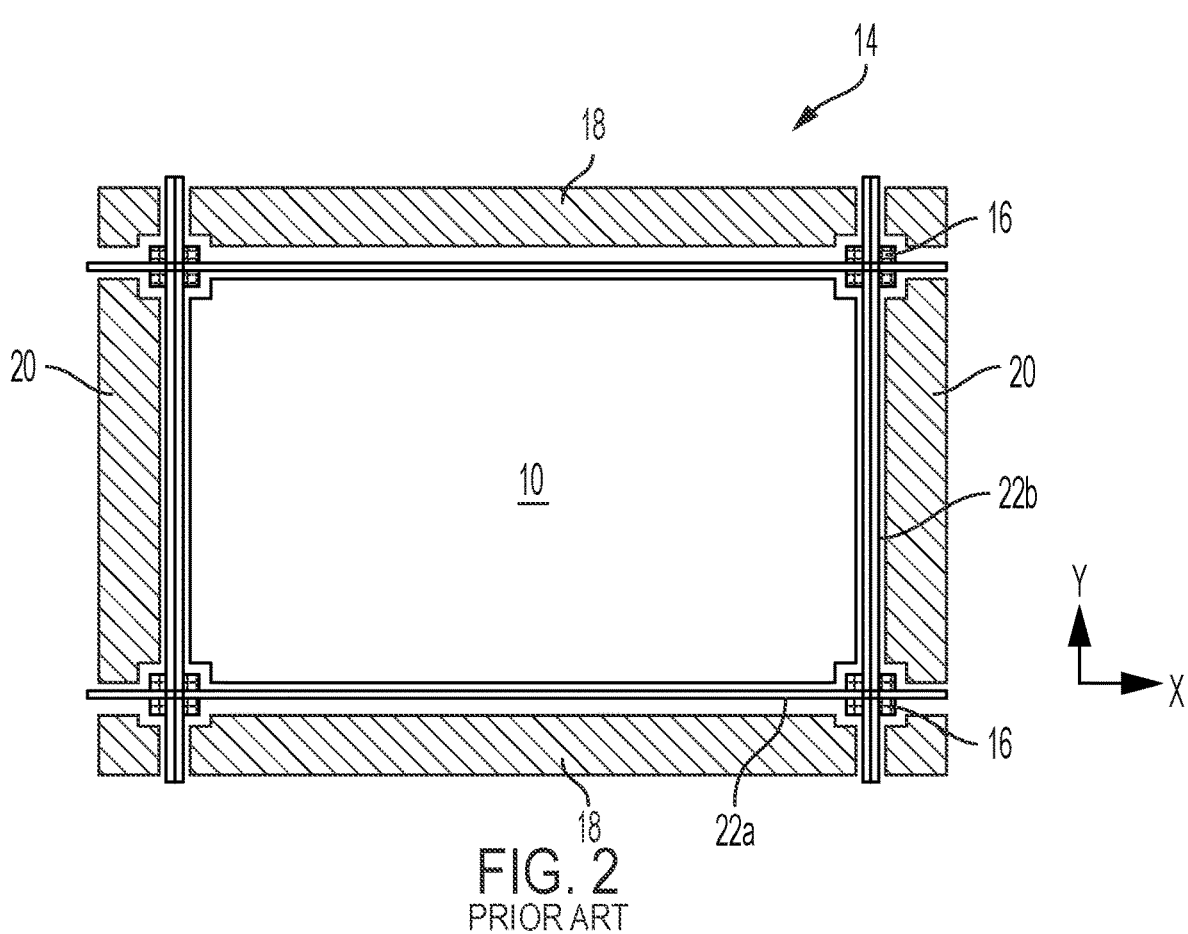
FIG. 2 is a schematic plan view of a portion of the frame structure of FIG. 1.

FIGS. 1 and 2 illustrate a storage structure for efficiently storing a plurality of stackable containers 10, also known as bins, according to the prior art. Containers 10 are stacked on top of one another to form stacks 12 and are arranged in a frame structure 14. Each container 10 typically holds a plurality of product items (not shown). The product items within each container 10 may be identical, or may be of different product types.

Frame structure 14 includes a plurality of vertical members 16 that support a first set of parallel horizontal members 18 extending in a first direction (e.g., the X-direction), and a second set of parallel horizontal members 20 extending in a second direction (e.g., the Y-direction). Horizontal members 18 and horizontal members 20 form a plurality of horizontal grid spaces within which stacks 12 are housed. Frame structure 14 is thus constructed to guard against horizontal movement of the stacks 12 of bins 10 and to guide vertical movement of the bins.

The uppermost level of frame structure 14 includes rails 22 arranged in a grid pattern across the top of horizontal members 18 and horizontal members 20. With additional reference to FIGS. 3A-3C and 4, rails 22 support a plurality of robotic load handling devices 30. A first set of parallel rails 22a guides movement of load handling devices 30 in a first direction (e.g., the X-direction) across the top of frame structure 14, and a second set of parallel rails 22b, arranged perpendicular to the first set of parallel rails, guides movement of the load handling devices in a second direction (e.g., the Y-direction) across the top of the frame structure. In this manner, rails 22 allow load handling devices 30 to move laterally in two directions (in the X-direction and in the Y-direction) across the top of frame structure 14 so that the load handling devices can be moved into position above any one of the stacks 12 of bins 10.

Each load handling device 30 includes a vehicle 32 with a first set of wheels 34, consisting of a pair of wheels on the front of the vehicle and a pair of wheels on the back of the vehicle, arranged to engage with two adjacent rails of the first set of rails 22a. Similarly, a second set of wheels 36, consisting of a pair of wheels on each lateral side of the vehicle, is arranged to engage with two adjacent rails of the second set of rails 22b. Each set of wheels 34, 36 can be lifted and lowered, so that either the first set of wheels 34 or the second set of wheels 36 is engaged with the respective set of rails 22a, 22b depending on the desired direction of movement of vehicle 32.

When the first set of wheels 34 is engaged with the first set of rails 22a and the second set of wheels 36 is lifted clear from the second set of rails 22b, the first set of wheels can be driven, by way of a drive mechanism (not shown) housed in vehicle 32, to move the load handling device 30 in the X-direction. To move the load handling device 30 in the Y-direction, the first set of wheels 34 is lifted clear of rails 22a, and the second set of wheels 36 is lowered into engagement with the second set of rails 22b. A drive mechanism (not shown) associated with the second set of wheels 36 can then be used to drive the second set of wheels in the Y-direction.

Load handling device 30 is also equipped with a crane device 40 having a cantilever arm 42 that extends laterally from the top of vehicle 32. A gripper plate 44 is suspended from cantilever arm 42 by cables 46 that are connected to a winding mechanism (not shown) housed within vehicle 32. Cables 46 thus can be spooled into or out from cantilever arm 42 to adjust gripper plate 44 with respect to the vehicle 32 in the Z-direction.

Gripper plate 44 is adapted to engage with the top of a bin 10. For example, gripper plate 44 may include pins (not shown) that mate with corresponding holes (not shown) in the rim that forms the top surface of bin 10 and sliding clips (not shown) that are engageable with the rim to grip the bin. The clips are driven into engagement with bin 10 by a suitable drive mechanism housed within gripper plate 44, which may be powered and controlled by signals carried through cables 46, or through a separate control cable (not shown).

Figure 3A:
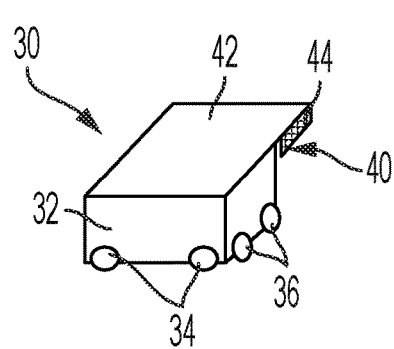
FIGS. 3A and 3B are schematic perspective views, from the rear and front respectively, of a load handling device according to the prior art for use with the frame structure depicted in FIGS. 1 and 2.
Figure 3B:
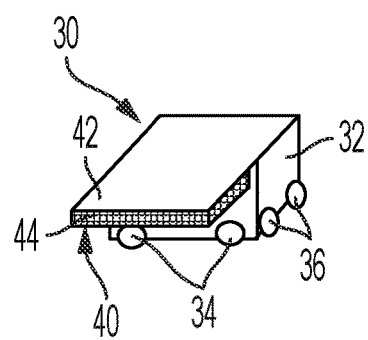
Figure 3C:
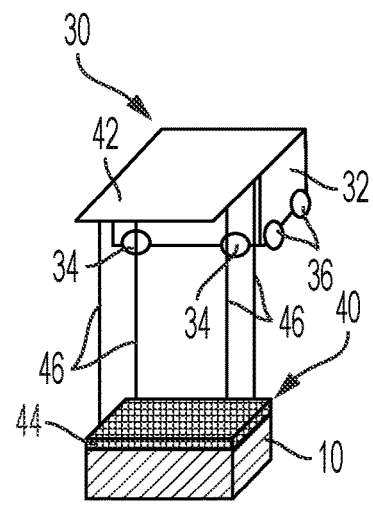
FIG. 3C is a schematic perspective view depicting a container being lifted by the load handling device of FIGS. 3A and 3B.

To remove a bin 10 from the top of a stack 12, the load handling device 30 is moved as necessary in the X and Y directions so that the gripper plate 44 is positioned above the stack in which the desired bin is located. Gripper plate 44 is then lowered and brought into engagement with the bin 10 on top of stack 12, as shown in FIG. 3C. After the clips have engaged with and secured bin 10, gripper plate 44 and, in turn the bin, may then be pulled upwards by spooling cables 46. At the peak of its vertical travel, bin 10 is accommodated beneath cantilever arm 42 and is held above rails 22. In this way, load handling device 30 can transport bin 10 to another location. Cables 46 are long enough to allow handling device 30 to retrieve and place bins 10 at any depth within stack 12, including the floor level. Vehicle 32 is sufficiently heavy to counterbalance the weight of bin 10 and to remain stable during the lifting process. Much of the weight of vehicle 32 is attributed to the large and heavy batteries that are required to power and operate the drive mechanisms of wheels 34, 36.

Figure 4:
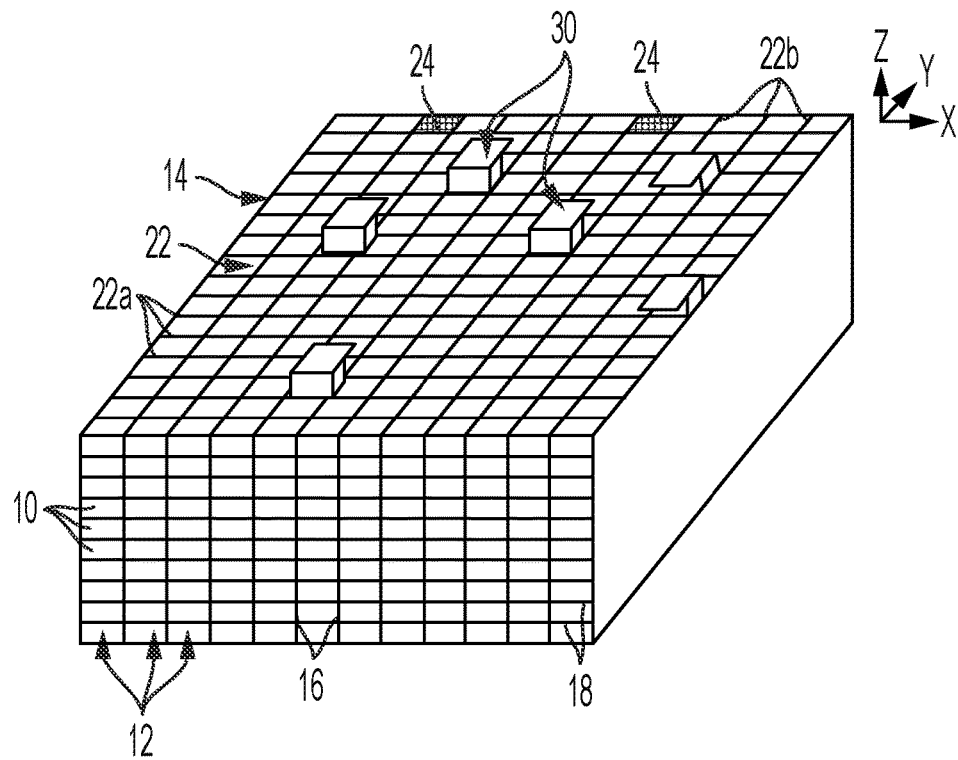
FIG. 4 is a schematic perspective view of the frame structure of FIG. 1 having a plurality of the load handling devices of FIGS. 3A-3C installed on the frame structure.

The known storage structure, as shown in FIG. 4, may include a plurality of load handling devices 30 that operate simultaneously to increase the throughput of the system. The storage structure depicted in FIG. 4 includes two ports 24, or shafts, for transferring bins 10 into or out of the storage structure. An additional conveyor system (not shown) may be associated with each port 24. In this manner, bins 10 that are transported to port 24 by load handling device 30 can be subsequently transferred to a picking/sorting station (not shown) where the products contained in the bins are picked and sorted into individual orders. Similarly, bins 10 can be moved by the conveyor system to port 24 from an external location, such as a bin-filling station (not shown), and transported to a stack 12 by the load handling devices 30 to restock the storage structure.

If it is necessary to retrieve a bin ("target bin") that is not located on the top of stack 12, then the overlying bins 10a ("non-target bins") (e.g., the bins located between the target bin 10b and rails 22) must first be moved to allow load handling device 30 to access the target bin. This operation is referred to as "digging".

Figure 5:
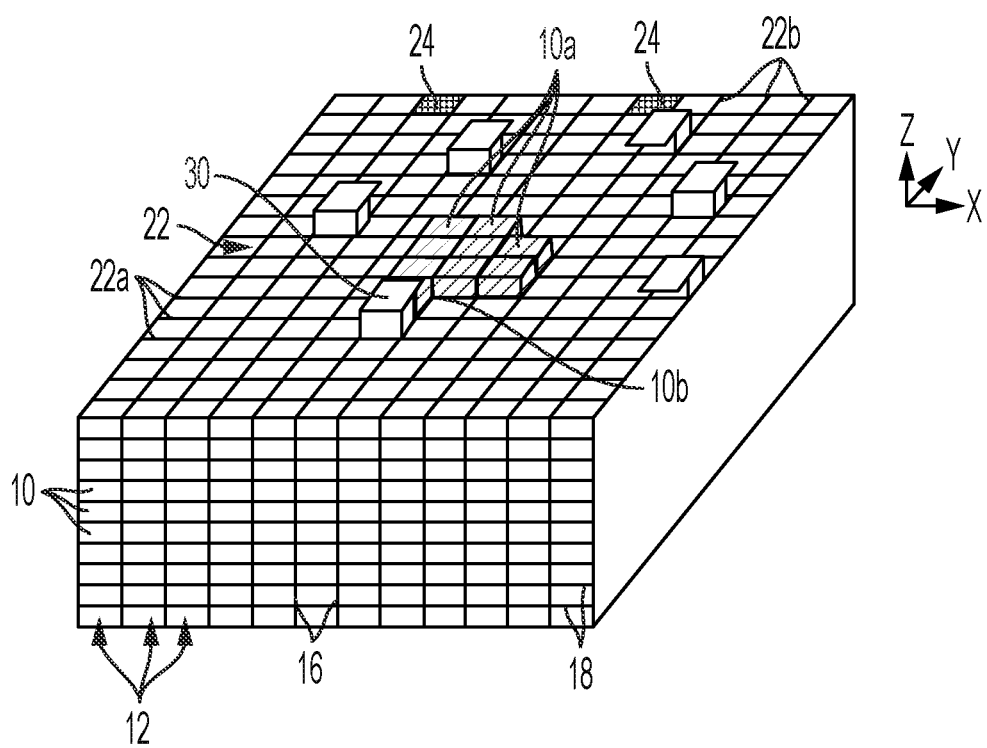
FIG. 5 is a schematic perspective view of the frame structure of FIG. 4 illustrating a digging operation to retrieve a target container from a stack of containers.

FIG. 5 illustrates a known digging operation in which one of the load handling devices 30 sequentially lifts each non-target bin 10a from the stack 12 of bins 10 containing target bin 10b. Each of the non-target bins 10a may be placed in a temporary location on top of another stack 12. After each of the non-target bins 10a have been removed, target bin 10b can be extracted from frame 14 by load handling device 30 and transported to port 24. After target bin 10b has been extracted, non-target bins 10a may be placed back in the original stack 12 to restore the original order of the stack less the target bin.

Each of the load handling devices 30 may be operated under the control of a central computer. Each individual bin 10 in the system is tracked, so that the appropriate bins can be retrieved, transported and replaced as necessary. For example, during a digging operation, the temporary locations of each of the non-target bins 10a is logged, so that the non-target bins can be replaced in the stack in a particular order.

While the system illustrated in FIGS. 1-5 allows for the dense storage of products, it requires the transportation of entire containers of products back-and-forth between the stacks and the picking/sorting zones, during which time products cannot be picked and sorted into new incoming orders, thus reducing total system throughput. In order to minimize bin transportation, target bins 10b are typically only retrieved and transported to the picking/sorting stations after multiple orders have been placed for a product item of one type. Although this method reduces bin transportation, order fulfilment times are often lengthier than desired, particularly if an order contains one or more products that are infrequently ordered by consumers. For this reason, "piece picking" inventory from the known frame structure 14 has been contemplated. U.S. Pat. Pub. Nos. 2018/0319590 and 2018/0346243, for example, disclose a robot equipped with a picking arm to pick individual items from a container located in the frame structure. Nevertheless, the picking robots and systems disclosed in U.S. Pat. Pub. Nos. 2018/0319590 and 2018/0346243 are not robust enough to handle the picking of a wide variety of products.

The present disclosure, on the other hand, provides a robot having a picking manipulator (sometimes referred to herein as a "picking arm") coupleable to a gripping tool for grasping a variety of products and placing the products into one of a plurality of order containers. To date, a major barrier in developing robotic picking arms has been the inability of the picking arm to consistently grasp products of varying sizes, shapes, weights, materials, surface textures, densities, mass distributions, stiffnesses and fragilities. While picking arms equipped with pneumatic gripping tools have been contemplated as one potential solution for gripping a wide variety of products, these gripping tools require extensive suction force and flow rate that can only be produced by large vacuum pumps and/or compressors (e.g., smaller vacuum pumps/compressors are only capable of providing adequate suction for a very small range of items). Oversized pneumatic compressors and/or vacuum pumps, however, are prohibitively large for load handling device 30 or similarly sized vehicles. In other words, load handling device 30 is not capable of carrying a large pneumatic compressor and/or vacuum pump within vehicle body 32. Increasing the size of the vehicle body 32 to allow load handling device 30 to carry an oversized pneumatic compressor and/or vacuum pump would require modifying the footprint of the vehicle body to a size that would consume a large number of grid spaces. As a result, fewer load handling devices would be able occupy the grid at a single time and throughput of the system would be reduced. For this reason, robots with pneumatic gripping tools have generally been confined to the floor of a warehouse and are often fixed to a stationary base.

The present disclosure provides a robotic system including a storage structure equipped with a pneumatic air supply system and a compact mobile, manipulator robot selectively coupleable to the pneumatic air supply system to allow the mobile, manipulator robot to grasp inventory items with its pneumatic gripping tool. As a result, the robot can grasp a large variety of products while traversing across the storage structure and support larger payloads during grasping. The ability of the mobile, manipulator robot to quickly and efficiently grasp a wide variety of inventory items is further improved by the robots ability to quickly switch between two or more pneumatic gripping tools and request grasping assistance from a teleoperator if the robot is unable to autonomously grasp an item during an edge case scenario (or the predicted control instructions have high uncertainty or low confidence). The mobile, manipulator robot can thus to continue its normal operation with minimal downtime or interruption. These improvements, among other advantages, are discussed in further detail in this disclosure.

Figure 6A:
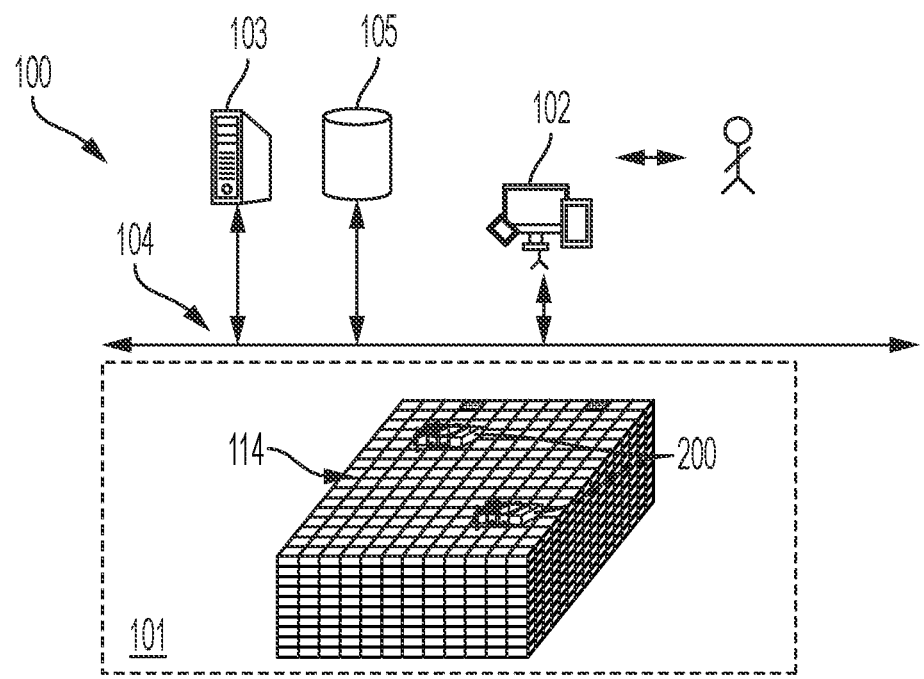
FIG. 6A is a schematic illustration of a robotic system including a storage structure for housing a plurality of stacked containers according to an embodiment of the present disclosure.

FIG. 6A is a schematic illustration of a robotic system 100 according to an embodiment of the present disclosure. A robot, such as mobile, manipulator robot 200 (sometimes referred to herein as "manipulator robot" or "robot"), may be housed in a storage system 101 such as a warehouse, or other fulfillment center (hereinafter "warehouse"), and tasked with picking inventory items contained within storage structure 114. Robot 200 may operate in one of two modes: an autonomous mode, by executing autonomous control instructions, or a tele-operated mode, in which the control instructions are manually piloted (e.g., directly controlled) by an operator. While the term "control instructions" (whether autonomous or piloted) is primarily described herein as instructions for grasping an item, it will be appreciated that the term may additionally refer to a variety of other robotic tasks such as the recognition of an inventory item, the placement or release of a grasped item (e.g., in a particular location or orientation) or any other robotic task that facilitates order fulfillment. In one embodiment, robot 200 may be a machine learning robot capable of executing autonomous or piloted control instructions.

Robotic system 100 includes one or more operator interfaces 102, at least one of which may be located at a remote site outside of warehouse 101, one or more processor-based computer systems 103, each of which are communicatively coupled via one or more network or non-network communication channels 104, and one or more storage devices 105, which store, for example, a machine learning grasp pose prediction algorithm used to predict grasping poses for manipulator robot 200 to execute and grasp inventory items. While storage device 105 is illustrated as being separate from computer system 103, in at least some implementations, the storage devices can be an integral part or component of the computer system (e.g., memory such as RAM, ROM, FLASH, registers; hard disk drives, solid state drives). As used herein, the terms "remote processor" or "remote computer" refer to a processor in communication with and located remote from the hardware of the referenced robot and may include, for example, one or more processors or a single central processor for coordinating and automating fulfillment tasks between the robots. On the other hand, when the term "onboard" is used herein, the term means that the component is being carried by the referenced robot. For example, an "onboard processor" means that the processor is located within the hardware of the referenced robot. When the general term "processor" or "computer" is used herein, the term may refer to any remote processor, any on-board processor or a combination of the same, unless explicitly indicated otherwise.

Operator interface 102 includes one or more input devices to capture control instructions from an operator and one or more output devices. The one or more user interface devices 102 may be, for example, a personal computer, a tablet, (smart) phone, a wearable computer, and the like. Exemplary input devices include keyboards, mice, touch screen displays, displays (e.g., LCD or OLED screen), controllers, joysticks and the like. In this regard, a teleoperator may input synchronous (real-time) or asynchronous (scheduled or queued) control instructions which may be, for example, click point control instructions, 3d mouse control instructions, click drag control instructions, keyboard or arrow key control instructions, and/or image captured hand or body control instructions. Exemplary output devices include, without limitation, displays (e.g., LCD or OLED screen), head mounted displays, speakers, and/or haptic feedback controllers (e.g., vibration element, piezo-electric actuator, rumble, kinesthetic, rumble motor). Operator interface 102 thus may be utilized by an operator to observe robotic picking, for example, aspects of manipulator robot 200 and/or the inventory stored within storage structure 114. Operator(s) may view or see a representation of manipulator robot 200 performing one or more tasks such as grasping an item by reviewing one or more still and/or moving images of the manipulator robot and/or its environment. These images and/or video may be replayed and/or viewed in real time. If manipulator robot 200 is unsuccessful at autonomously performing the task, the operator can utilize operator interface 102 to instruct the robot to grasp a product item and/or release the product item into a desired order container. Although operator interface 102 is primarily described herein in connection with assisting robot 200 in performing grasping tasks, it will be appreciated that the interface may be used at any time (including prior to a failed grasping attempt) to allow a teleoperator to manually control the robot and to perform any manipulation task including the picking, rearranging, packing or repackaging of one or more items, picking up dropped items, manipulating items in inventory bins or any other order fulfillment tasks including the performance of inventory audits, replenishment tasks, system inspections, product identification and/or to override other autonomous control instructions.

Computer system 103 coordinates the operation of robotic system 100. Computer system 103 can be a processor based computer system. The processor may be any logic processing unit, such as one or more microprocessors, central processing units (CPUs), digital signal processors (DSPs), graphics processing units (GPUs), application-specific integrated circuits (ASICs), programmable gate arrays (PGAs), programmed logic units (PLUs), and the like. In some implementations, computer system 103 may include a control subsystem including at least one processor.

Examples of a suitable network or non-network communication channels 104 include a wire based network or non-network communication channels, optical based network or non-network communication channels, wireless (i.e., radio and/or microwave frequency) network or non-network communication channels, or a combination of wired, optical, and/or wireless networks or non-network communication channels.

Mobile, manipulator robot 200 includes an interface to send and/or receive processor readable data or processor executable instructions via communication channels 104 to computer 103. In this manner, computer 103 can predict grasping poses (e.g., position and/or orientation and/or posture of the robotic picking arm) and send control instructions to manipulator robot 200 to execute the predicted grasping pose and grasp the product item. If the control instructions are unsuccessful in performing a task (e.g., grasping the item), or the remote computer determines that the predicted control instructions are unlikely to be successful, the system can automatically request intervention from the operator, allowing robot 200 to be teleoperatively controlled from a local or remote location.

As will be described in greater detail hereinafter, the present system allows a teleoperator to remotely pilot manipulator robot 200 and move the robot into a variety of grasping (or manipulation) poses to train the machine learning system to more accurately predict future autonomous robot control instructions.

Although FIG. 6A illustrates two robots 200 located within a single warehouse, it will be appreciated that the system can include a single robot or any number of robots located within a single warehouse, or one or more robots located within a plurality of warehouses. The robotic system is thus advantageously configured to allow one or more operators to teleoperatively pilot or control a plurality of manipulator robots 200, via one or more operator interfaces 102, from a site located local or remote to the warehouses in which the robots are contained.

Figure 6B:
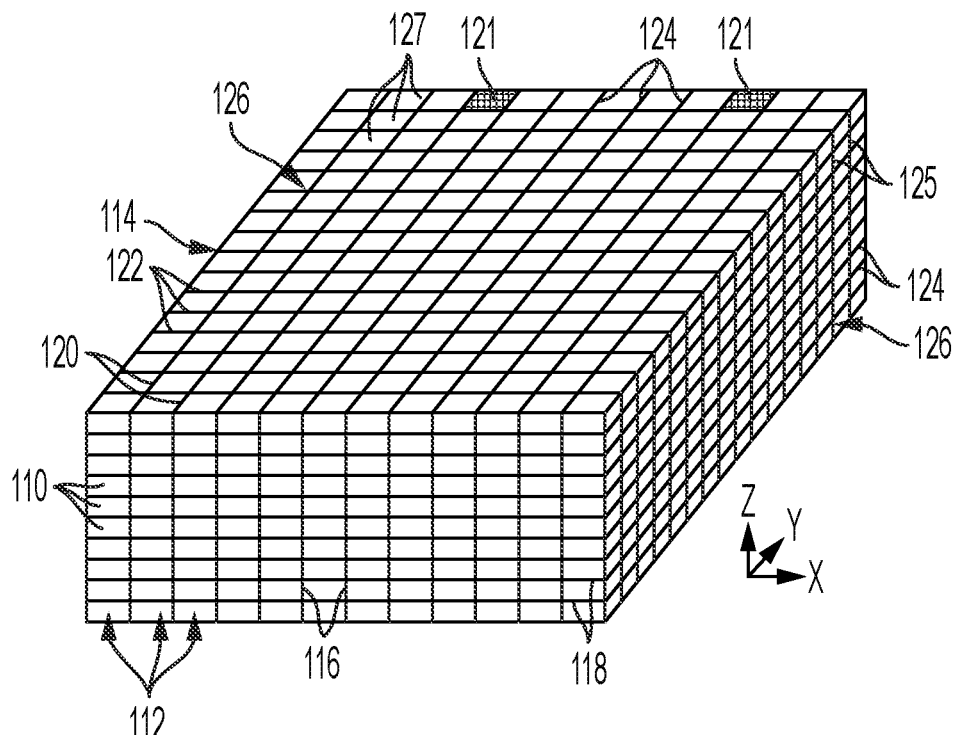
FIG. 6B is a schematic perspective view of the storage structure of FIG. 6A.

Storage structure 114, as shown in FIG. 6B, is configured to efficiently store stackable containers 110, also referred to herein as bins. Each bin 110 is configured to hold a plurality of product items (not shown) which may be identical, or of a variety of product types. Example product types include household items, apparel, consumer electronics, beauty products, groceries or any other product that may be stored and shipped from a warehouse. The products may be arranged within storage structure 114 in a number of ways to optimize picking/packing. For example, the products may be arranged based on product type (e.g., similar products are grouped together), the speed in which products need to be fulfilled, the environment (e.g., temperature) the items need to be stored within, the number of times a product is traditionally sold in a given time period, items size, items that are commonly purchased together, etc.

In situations where the product requires specific storage conditions (e.g., temperature or humidity) such as groceries, containers 110 may be packed with dry ice a similar mechanism to regulate the storage conditions of the specific product type. Alternatively, storage structure 114 may be constructed to include one or more isolated and insulated refrigeration or freezer areas. Each refrigeration or freezer area may rely on cryogenic cooling to achieve a desired temperature, or may alternatively utilize a separate refrigeration system formed, for example, of a condenser, a compressor and an evaporator configured to cycle gas through the system to refrigerate and/or freeze the insulated area. Product items such as groceries may be stored in containers 110 and arranged within storage structure 114 in either one of the frozen area, refrigerated area, and/or at room temperature based upon the storage requirements of the product type. In some instances, these freezer/refrigerated areas may be located on the lower levels of storage structure 114. Grocery products may be naturally slotted closer to or further from the frozen and refrigerated areas based upon their individual temperature and storage climate requirements. This configuration also isolates the robots positioned on top of storage structure 114 from the freezer/refrigerated areas. Nevertheless, should the robots, or a portion thereof, need to access the freezer or refrigerated area, the robot may include a heating component to regulate the temperature of its electronics and other systems.

Containers 110 preferably have an open end through which the products can be retrieved. The open end of container 110 may be an open top or an open lateral side. The bottom of containers 110 may have an inwardly tapered interior surface that facilitates the rolling and/or the sliding of inventory products toward the center of the container and away from the sidewalls of the container to facilitate picking. In some cases, the bottom of containers 110 may include slidable, pivotable or bomb bay doors to facilitate the dumping of inventory items from the container to other containers or elsewhere. The bottom of containers 110 may also be designed to nest within or against a rim that forms the upper surface of another container to prevent the containers from moving laterally relative to one another when stacked. Thus, storage structure 114 need not include any, or significantly less, support members than counterpart frame structure 14. As a result, storage structure 114 may cost less to manufacture and may be installed more quickly than frame structure 14.

Storage structure 114 may nevertheless include vertical members 116 that support a first set of horizontal members 118 extending in a first direction (e.g., the X-direction) and a second set of horizontal members 120 extending in a second direction (e.g., the Y-direction). Horizontal members 118 and horizontal members 120 form a plurality of horizontal spaces for housing stacks 112. The horizontal spaces are constructed to guard against lateral movement of the stacks of bins 110. Storage structure 114 may additionally include one or more ports 121 or shafts to transfer bins into or out of the storage structure. A conveyor belt or shuttle system (not shown) may be associated with each port 121 to transport bins 110 to an external location. For example, a bin containing products for shipment may be transported down port 121 to an external location for further packaging and/or shipment, while an empty bin may be transported down the port to a bin-filling station (not shown) for replenishment and then subsequently transported up the port and to one of the stacks 112 to restock the storage structure.

The uppermost level of storage structure 114 may include a first set of rails 122 extending in a first direction (e.g., X-direction) and/or a second set of rails 124 extending in a second direction (e.g., Y-direction). In embodiments in which storage structure 114 includes the first set of rails 122 and the second set of rails 124, the combination of the first and second set of rails forms a horizontally oriented grid 126 having a plurality of grid spaces 127. Rails 122, 124 allow one or more robots to move about the grid 126 above the stacks 112 of bins 110. At least one of the vertical members 116, horizontal members 118, horizontal members 120 or rails 122, 124 may define a channel that transports fluid such as compressed air to the robots installed on grid 126 as is discussed in further detail hereinafter.

Figure 6C:
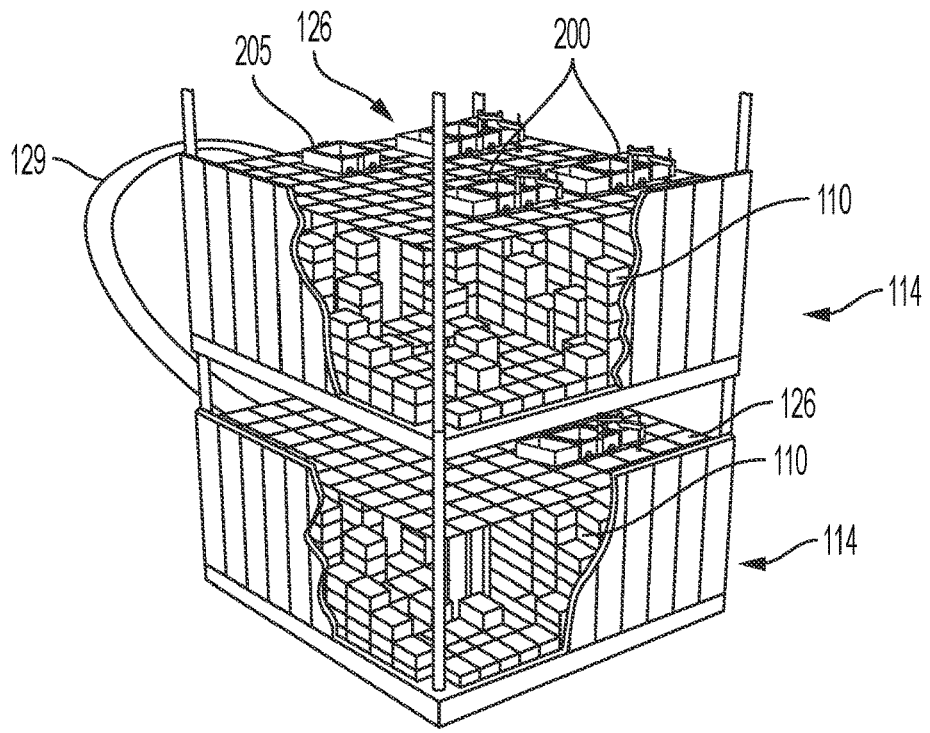
FIG. 6C is a schematic perspective view of two storage structures arranged on top of one another according to an embodiment of the present disclosure.

As shown in FIG. 6C, a plurality of similarly constructed storage structures 114 with shallower stacks (e.g., fewer containers per stack) may be layered on top of one another to reduce the time it takes to dig a target container 110b (e.g., the container storing a desired product), which in turn, increases the throughput of the system. In such scenarios, each storage structure 114, or level, would be spaced apart from an adjacent level with enough clearance between each level to allow one or more robots to move about a respective grid 126. One or more elevators and/or ramps having inclined and/or declined rails 129 (in the Z-direction) may be provided between the grids 126 of adjacent storage structures 114 to allow the robots to migrate between the levels as desired.

Referring to FIG. 6B, one or more of the lateral sides of storage structure 114 may additionally or alternatively include the second set of rails 124 extending in the second direction (e.g., Y-direction) and/or a third set of rails 125 extending in a third direction (e.g., Z-direction). In embodiments in which storage structure 114 includes the second set of rails 124 and the third set of rails 125, the combination of the second and third set of rails 124, 125 forms a vertically oriented grid 126 having a plurality of grid spaces 127. Manipulator robot 200 may traverse vertical grid 126, extract bins 110, and pick from the extracted bins housed in shelving, racks or stacks on the lateral sides of storage structure 114. When the term "grid" is used herein without an orientation qualifier (e.g., vertical or horizontal), the term may refer to any grid structure formed by a combination of rails 122, 124, 125, whether the grid be horizontally oriented or vertically oriented.

It is also envisioned that a plurality of similarly constructed storage structures 114 may be positioned laterally adjacent to one another (not shown), to increase storage capacity. In such scenarios, each storage structure 114 would be spaced apart from an adjacent storage structure with enough space between the adjacent storage structures to allow a robot 200 to traverse about a respective vertically oriented grid 126 and access containers 110 housed within either of the adjacent storage structures.

Figure 7A:
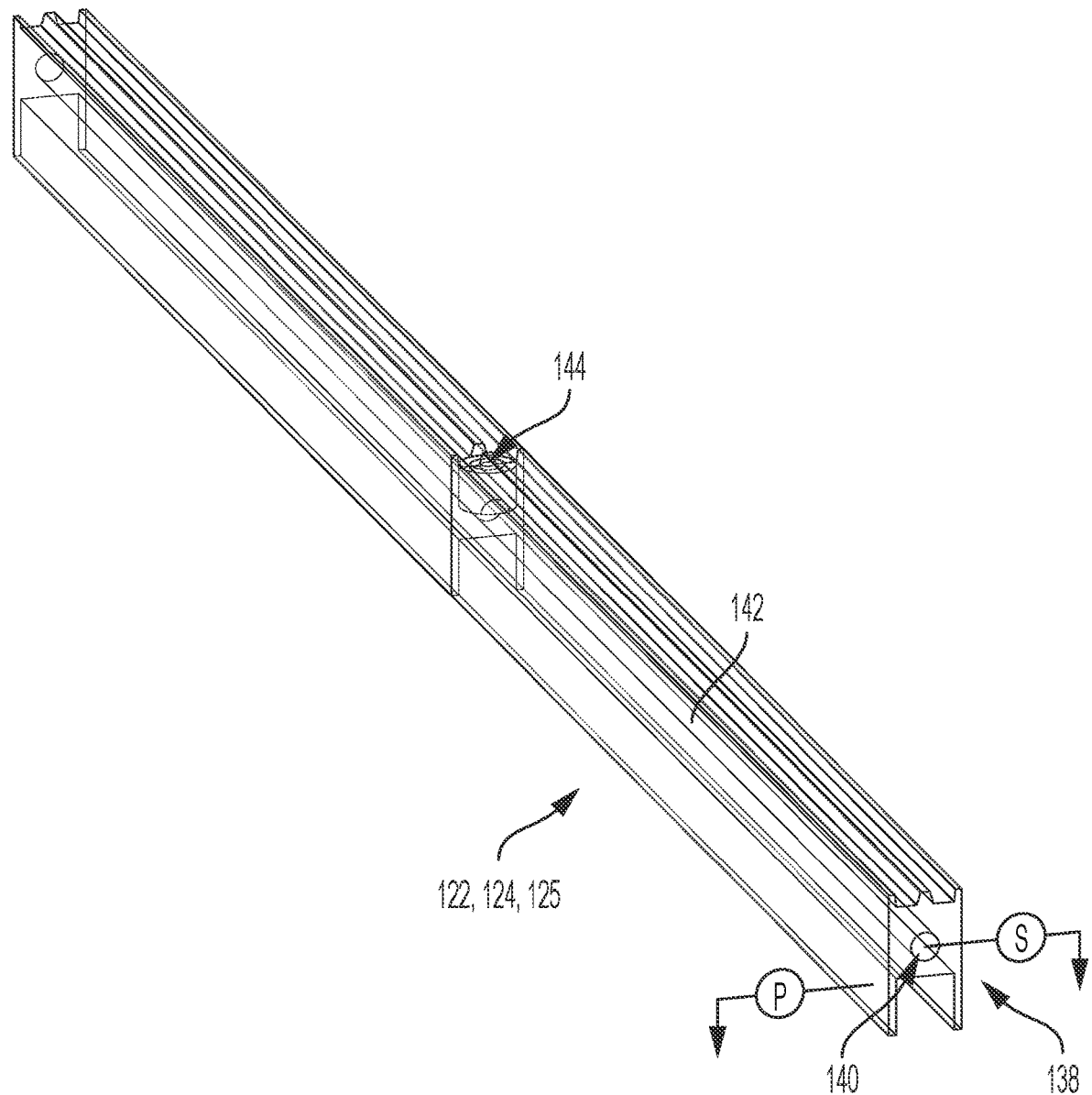
FIG. 7A is a perspective view of a rail illustrating a channel extending through the rail and a conduit extending from the channel to a surface of the rail.
Figure 7B:
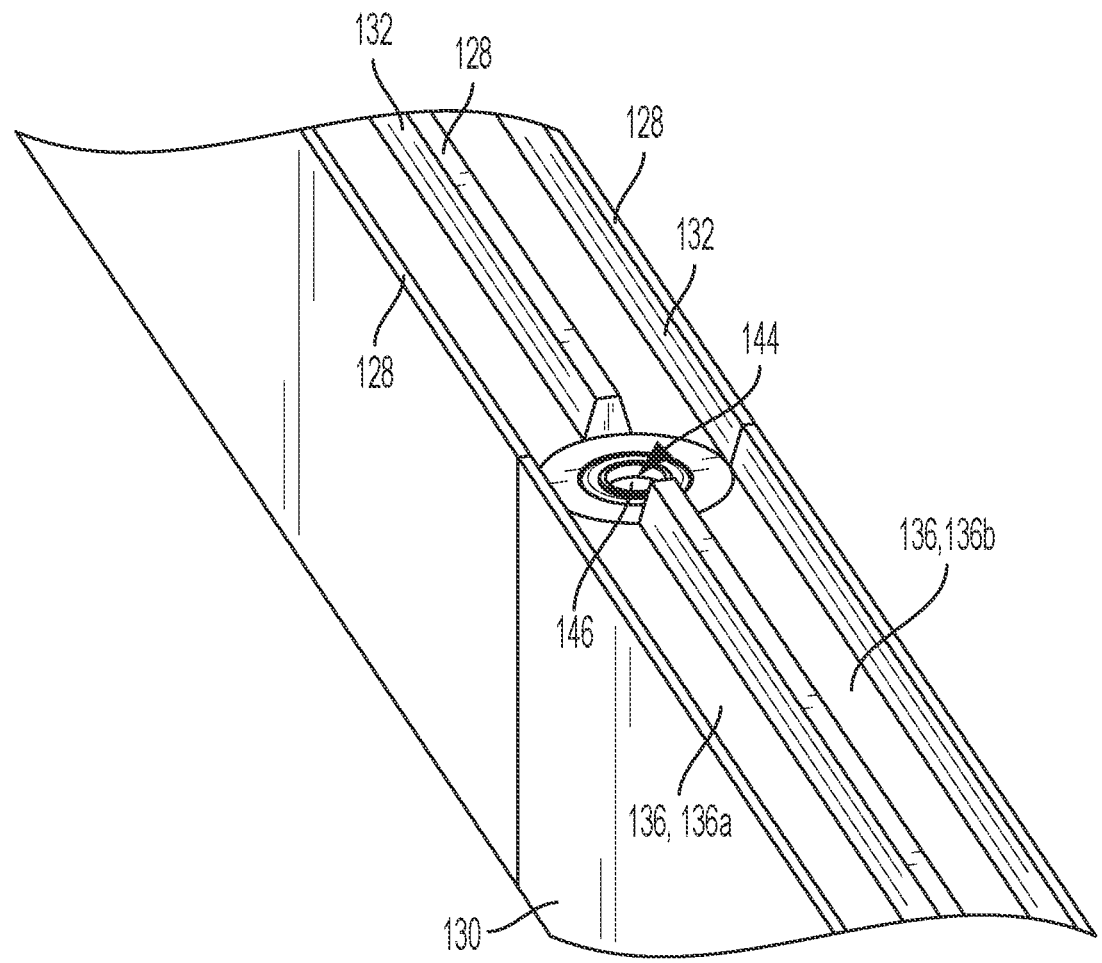
FIG. 7B is an enlarged view of a portion of the rail of FIG. 7A.

Referring to FIGS. 7A and 7B, each one of the rails 122, 124, 125 forming grid 126 may be extruded or otherwise formed from a highly conductive metal such as aluminum. A power source P may be coupled to grid 126 to supply a voltage to rails 122, 124, 125 and, in turn, to selectively provide a voltage to robot 200 to recharge small batteries or super/ultra-capacitors of the robot and/or directly power the various drive mechanisms of the robot. The power may be transferred from grid 126 to robot 200 in one of several methods. For example, grid 126 may have a single polarity such as a negative charge, while a structure or ceiling above the grid (not shown) is positively charged (or vice versa). In this embodiment, robots 200 may include an antenna 219 (shown in FIG. 9A) which contacts the positively charged structure or ceiling above grid 126 and completes the circuit between the opposite polarities. In an alternative arrangement, adjacent rails of one set of the parallel rails 122, 124 and/or 125 may have opposite polarities such that when robot 200 is disposed on the adjacent parallel rails, conductive brushes (e.g., contact elements) of the robot will complete the circuit. For example, a first one of the parallel rails 122 may have a positive polarity while an adjacent one of the parallel rails 122 may have a negative polarity. In this manner, robot 200 need not include the large onboard batteries associated with load handling device 30. As a result, robot 200 is less bulky and more maneuverable than its load handling device 30 counterpart.

Rails 122, 124, 125 may include a double u-channel or profiled track having an upper surface 128, outer surfaces 130, inner surfaces 132 and drive surfaces 136a, 136b (collectively "drive surfaces 136"). In this manner, two robots may traverse a single rail 122, 124, 125, increasing the number of robots capable of driving on grid 126 at any given time. For example, a first robot supported on drive surface 136a may pass a second robot supported by drive surface 136b. The upper surface 128, outer surfaces 130 and inner surfaces 132 of rails 122, 124, 125 may be anodized or painted with a non-conductive coating to prevent the robots or storage structure 114 from short circuiting and to minimize the risk of electrocution. In other words, the drive surfaces 136 of rails 122, 124, 125 may be the only surfaces of the rails that remain at least partially or entirely electrically charged (aside from the terminal ends, or a small section of the terminal ends of the rails, which are not anodized for the purpose of transmitting power along the rails of the grid).

Storage structure 114 further includes a fluid supply system 138 configured to supply fluid such as compressed air to robot 200 when the robot is installed on rails 122, 124, 125. Fluid supply system 138 thus eliminates the need for robot 200 to carry a bulky onboard air compressor or vacuum generator to operate its pneumatic gripping tool 248 (FIG. 9A) and grasp inventory items stored in containers 110. Fluid supply system 138 includes a fluid source S and a supply line 140. Fluid source S may be a compressor, such as a pneumatic compressor, to supply compressed air to supply line 140. Alternatively, fluid source S may be a vacuum pump or vacuum generator.

While supply line 140 is primarily described and illustrated herein as extending through the rails 122, 124, 125 of grid 126, it will be appreciated that the supply line may alternatively be formed by or extend at least partially through the channels of vertical members 116, horizontal members 118 or horizontal members 120 forming the frame of storage structure 114, attached to or otherwise coupled to an external surface of the rails and/or the frame structure, or otherwise be in close proximity of the rails so long as the fluid supply is accessible to manipulator robot 200 when the robot is positioned on the grid.

As shown in FIG. 7A, supply line 140 may include a series of channels 142, conduits 144 and ports 146. Channels 142 may extend along an entire length of rails 122, 124, 125, and are preferably, embedded within a lower portion of the u-channel such that the channels extend continuously in a longitudinal direction of a respective rail without interruption at the intersections of rails 122 and rails 124, or the intersection of rails 124 and 125. A plurality of conduits 144 may extend between channel 142 and a port 146 located at a surface of a respect rail. In a preferred embodiment, at least one of rails 122, 124, 125 that surrounds each one of grid spaces 127 has a conduit 144. Grid 126 is thus capable of supplying fluid such as compressed air to robot 200 irrespective of the robot's location on the grid.

Figure 8A:
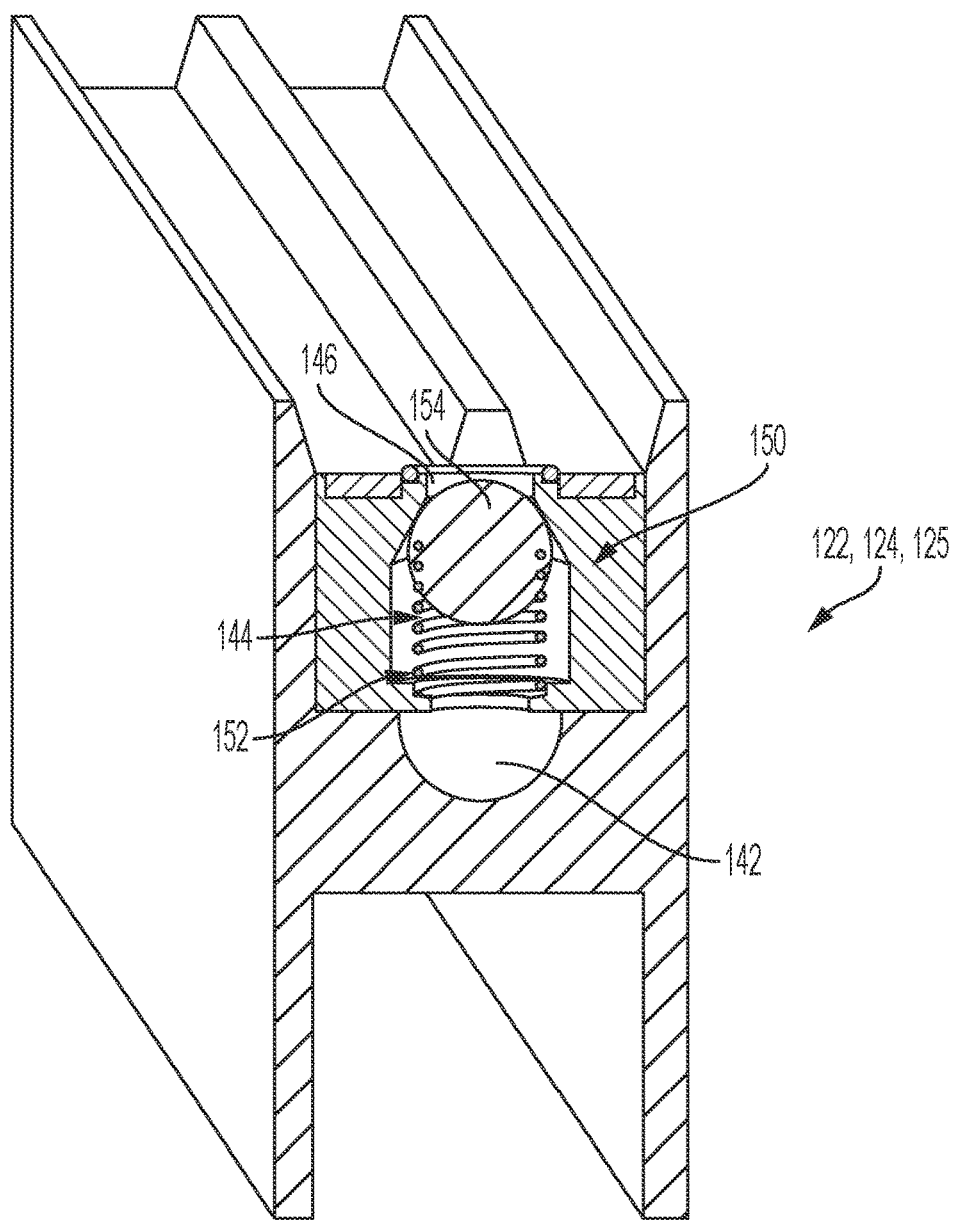
FIG. 8A is a cross-section view of a valve located within the conduit of FIG. 7A.
Figure 8B:
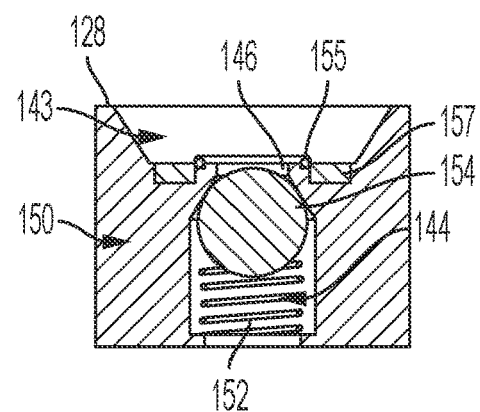
FIG. 8B is an enlarged view of the valve of FIG. 8A.

Referring to FIGS. 8A and 8B, a plurality of valves 150 may be disposed within supply line 140, for example, within the conduits 144 of rails 122, 124, 125 or within channels formed by vertical members 116, horizontal members 118, and/or horizontal members 120. Each valve 150 is transitionable between a closed condition in which the compressed air is contained within supply line 140 and an open condition in which the supply line is in fluid communication with the environment such that compressed air may be supplied to manipulator robot 200. Each valve 150 may include a biasing member 152, such as a spring, and a plug 154 coupled to the spring to seal port 146. When spring 152 is in a neutral or unbiased condition, the spring 152 biases the plug into the port 146, which seals the compressed air within supply line 140. Alternative valves may be used to seal compressed air within supply line 140. For example, the valve may be constructed as any passively or actively actuated valve capable of being transitioned between a closed condition and an open condition, such as an electrohydraulic servo valve.

With specific reference to FIG. 8B, the rails 122, 124, 125 of grid 126 may define a cavity 143 aligned with a longitudinal axis of conduit 144. Cavity 143 may include a tapered edge extending from the upper surface 128 of rails 122, 124, 125 toward port 146. A magnet 157, or other ferrous material, may surround port 146 to magnetically couple robot 200 to grid 126 during the transference of the compressed air from supply line 140 to robot 200. A gasket, such as an O-ring 155, may be provided around port 146 to seal the connection between robot 200 and grid 126, and/or at any other location surrounding the valves 150 to prevent compressed air from leaking out of supply line 140. The compressed air of supply system 138 may be selectively accessed by mobile, manipulator robot 200 to provide the necessary suction to allow the manipulator robot to piece-pick inventory items ranging in sizes, shapes, weights, materials, surface textures, densities, mass distributions, stiffnesses and fragilities.

Figure 9A:
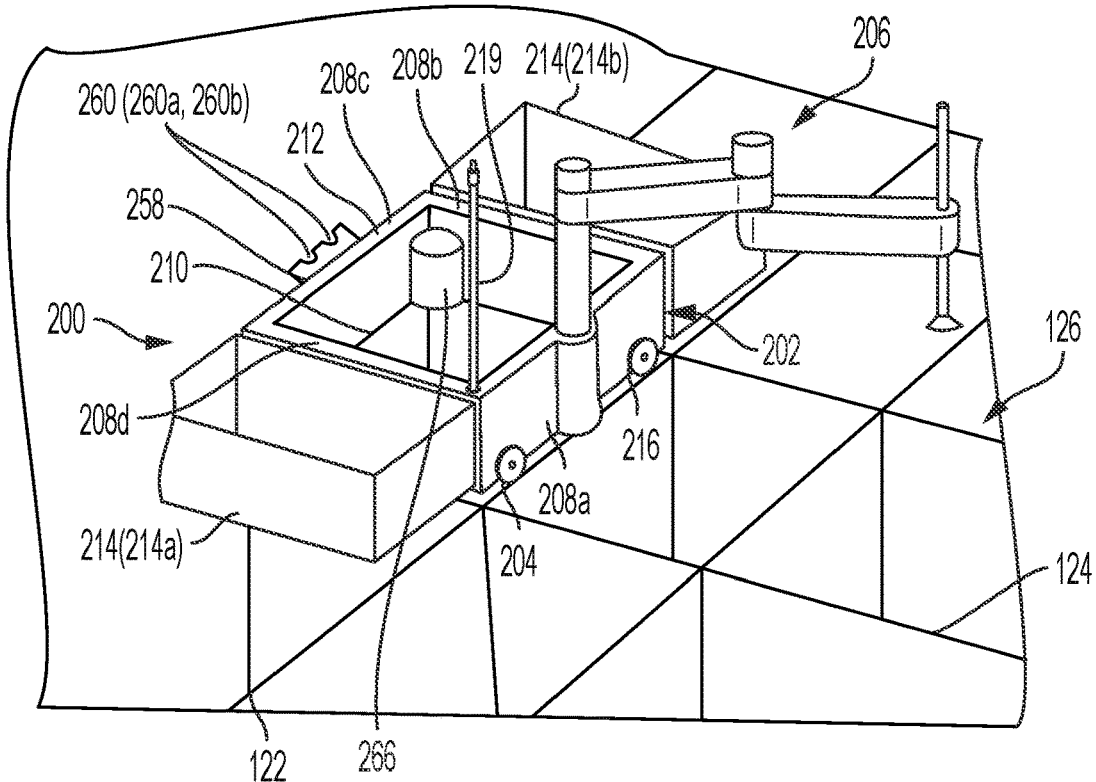
FIG. 9A is a schematic perspective view of a mobile, manipulator robot including a picking arm equipped with a pneumatic gripping tool and a tool holder, installed on top of the storage structure of FIG. 6B.
Figure 9B:
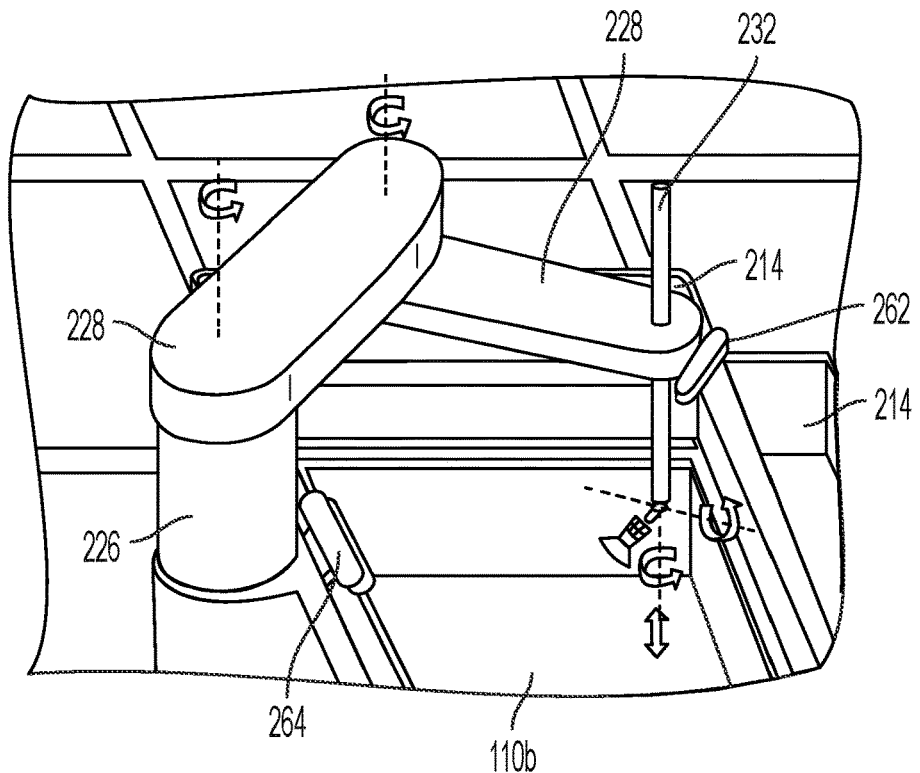
FIG. 9B is an enlarged view of a portion of the mobile, manipulator robot of FIG. 9A.

Referring to FIGS. 9A and 9B, manipulator robot 200 includes a vehicle body 202, a mobility assembly 204 configured to guide movement of the vehicle body along rails 122, 124, 125 and a picking manipulator 206 also referred to herein as a "picking arm". Manipulator robot 200 also includes a communication interface to send and receive data between the manipulator robot and remote computer 103 and/or the manipulator robot and operator interface 102. The data may include information obtained from a positioning sensor and relate to the position of the manipulator robot relative to storage structure 114 or the warehouse 101 in general to enable remote computer 103 to control movement of the robot about grid 126 or about the warehouse. The position sensor may be a global positioning system, a local/indoor positioning system, a local feature positioning system or a combination thereof. The global positioning system may be a GPS system. The local or indoor positioning system may be an indoor positioning system using different technologies, including light, radio waves, magnetic fields or acoustic signals to measure a distance or time of flight to nearby anchor nodes (nodes with known fixed positions such as WiFi/LiFi access points, Bluetooth beacons or Ultra-Wideband beacons, magnetic positioning, or dead reckoning) to actively locate mobile devices or tags to provide ambient location or environmental context. The local feature positioning system on the other hand may utilize conductive, capacitive, infrared (IR) or other sensors used to detect features within the warehouse, for example, a sensor to detect and count rail or grid space crossings, a magnetic sensor designed to detect magnets or ferrous material in grid 126, an imager to read barcodes or AR/QR codes on bins 110, the rails or other structures (which can subsequently be relayed to the remote processor 103 to determine the location of the mobile manipulator robot), an imager capable of performing simultaneous localization and mapping (SLAM), encoders in the mobility assembly 204 to measure distances traveled, magnetic, NFC, RFID, or any other type of positioning sensor within any of the mobile robots described herein and/or the grid so long as the remote computer can determine the location of each individual mobile robot and control the position of each individual mobile robot. The data may also include data obtained from a sensor relating to the inventory (hereinafter "Inventory Data") (e.g., location, dimensions, shapes, weights, materials, porosities, surface textures, colors, densities, mass distributions, stiffnesses, fragilities or the like) that assist the computer or a teleoperator in distinguishing between different products located in the container and/or predicting a grasping pose for grasping the product item.

Vehicle body 202 may be formed of four sidewalls 208a, 208b, 208c, 208d (collectively "sidewalls 208"), an open bottom end 210 and an open top end 212. The sidewalls 208 are preferably sized such that vehicle body 202 has a footprint of a single grid space 127. In other words, when robot 200 is positioned on the horizontal grid 126, two opposing sidewalls (e.g., 208a, 208c) are positioned over two adjacent rails 122 extending in the X-direction, while the other two opposing sidewalls (e.g., 208b, 208d) are positioned over two adjacent rails 124 extending in the Y-direction. In other embodiments, the vehicle body 202 of robot 200 may have a footprint that is larger than a single grid space 127. The open bottom end 210 and the open top end 212 of vehicle body 202 allow picking arm 206 to extend through the vehicle body and grasp a product contained in a target bin 110b, which may be located directly beneath the body (e.g., the bin located on the top of the stack of bins aligned with the vehicle body in the Z-direction). Picking arm 206 may alternatively be used to pick products contained in target bins located laterally adjacent to the vehicle body 202 as shown in FIG. 9A.

One or more of the sidewalls 208 of vehicle body 202 may optionally include a fixed or pivotable digging (hoist) plate (not shown) for digging into a stack 112 and pulling a target bin to the top of a particular stack and/or for transporting bins for replenishment purposes. The digging plate may be pivotable between a collapsed condition in which the digging plate lies flush against a respective interior or exterior surface of one of the sidewalls 208 of vehicle body 202 and an operating condition in which the digging plate extends radially away from and perpendicular to the respective sidewall of the vehicle body. The digging plate may be similar to gripper plate 44 of load handling device 30 in that the digging plate is configured to be lowered in the Z-direction and brought into engagement with any of the bins 110 located in stack 112. Like gripper plate 44, the digging plate may be adapted to pull bins 110 upwards by spooling cables, which are long enough to retrieve a target bin located at any depth within stack 112. However, robot 200 need not include a digging plate or another mechanism for digging the containers from stack 112. System 100 could instead rely on the combination of manipulator robot 200 and a separate robot specifically adapted to perform digging tasks. The digging robot may be known load handling device 30 or digging robot 205 (FIGS. 6C and 6D).

Figure 6D:
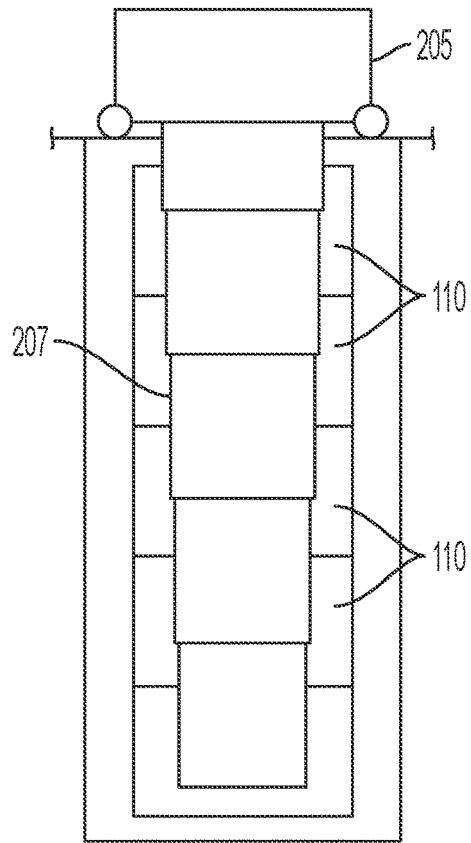
FIG. 6D is a schematic side elevation view of a digging robot performing a digging operation within the storage structure of FIG. 6B.

With specific reference to FIG. 6D, digging robot 205 may include a vehicle body having a container receiving cavity and a digger 207 extendable beneath the body. Digger 207 may be a scissor lift or include a series of telescoping beams or other compact linear actuators with long stroke. In this manner, digger 207 may reach beneath grid 126 to lift a single container 110, or a plurality of containers (e.g., a target bin 110b and each of the non-target bins 110a overlying the target bin) through the receiving cavity and above the grid in a single lift. Alternatively, digger 207 may be positioned on a single external side of digging robot 200 and include a latching device such as a hook for engaging with one or more lateral sides of containers 110. In this manner, digging robot 205 may reach beneath grid 126 to lift a single container 110, or a plurality of containers (e.g., a target bin 110b and each of the non-target bins 110a overlying the target bin) above the grid and on a lateral side of the digging robot (e.g., without lifting the containers through the container receiving cavity of the digging robot). The digger 207 of digging robot 205 may be electrically, pneumatically or otherwise actuated.

The internal surface of the sidewalls 208 of robot 200 may also include a latch, hook, digging plate or other mechanism (not shown) for coupling order bins 214a, 214b (collectively "order bins 214") within the vehicle body 202 of the manipulator robot such that the combination of the piece picking robot and the one or more order bins have a footprint of approximately one grid space 127. The latch, hook, digging plate or other mechanism may alternatively be placed on an external surface of one or more of the sidewalls 208 of vehicle body 202 to couple one or more order bins 214 around the vehicle body as shown in FIGS. 9A and 9B.

Each of the order bins 214 may correspond to one or more orders. If a single order bin corresponds to more than one order, the bin may be partitioned to separate the multiple orders in a single bin, or remain un-partitioned with all of the items from multiple orders mixed together. For example, order bin 214a may correspond to a first consumer's order and order bin 214b may correspond to a second consumer's order. Thus, after robot 200 has picked a product from target bin 110b, the product may be placed directly into the order bin corresponding to the order of the consumer who purchased the product. In one embodiment, the bottom end of order bins 214 may include slidable, pivotable or bomb bay doors to facilitate the dumping of items into other containers, areas, or down ports 121 for further sorting or processing. It will be appreciated, however, that piece picking robot 200 need not carry any order bins 214. Instead, piece picking robot 200 may be used only for grasping products, which may be subsequently placed into order bins 214 carried by a "transporting robot" (e.g., a robot tasked with carrying around order bins) (not shown). In this manner, both manipulator robot 200 and the transporting robot may move along grid 126 and meet at certain picking or transfer locations.

With specific reference to FIG. 9B, robot 200 further includes one or more sensors 262 such as an RGB or RGB-D camera, video recorder, Light Detection and Ranging (LIDAR), and the like, oriented to capture pictures, point clouds, video etc. (generally referred to herein as "an image" or "images") of the product item(s) stored within containers 110. Although, sensor 262 is illustrated as being coupled to picking arm 206, the sensor may alternatively be coupled to the body 202 of robot 200 or to gripping tool 248 (shown in FIG. 12B). The image(s) may be transmitted via network or non-network communication channels 104 to processor 103 which, in some instances, may additionally be relayed to operator interface 102. In this manner, processor 103 may implicitly or explicitly analyze the images and then execute a machine learning algorithm, located within storage device 105, to predict a grasping pose to grasp the desired product item, before transmitting the grasping pose control instructions to robot 200 via communication channels 104 which, when executed by the robot, causes the picking arm 206 of the robot to approach and attempt to grasp the item. Although the grasping pose can refer to a single pose, grasping an item often requires a set of consecutively run poses. As used herein, the term "grasping pose" may refer to a single pose or a set of consecutively run poses. The images are preferably continuously captured as robot 200 traverses grid 126 and transmitted to remote computer 103. In this manner, remote computer 103 may determine a grasping pose for the picking arm 206 of robot 200, or the picking arm of another manipulator robot, before the manipulator robot reaches the picking position, thus increasing throughput of robotic system 100.

Figure 9C:
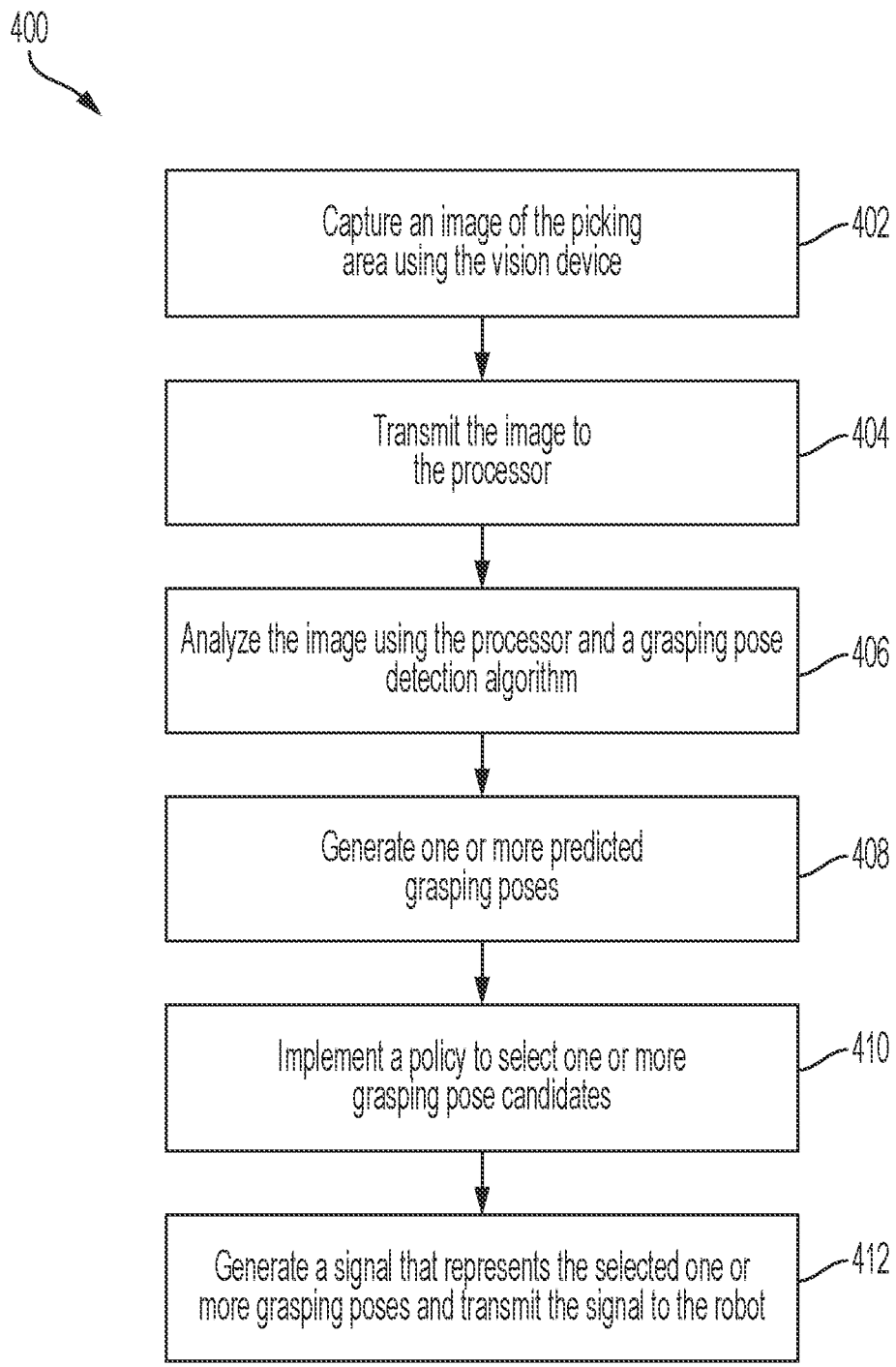
FIG. 9C is a flow chart showing an example method of determining a grasping pose of the picking arm of the mobile, manipulator robot of FIG. 9A.

FIG. 9C is a flow chart showing a method 400 of autonomously determining a grasping pose. The process for determining a grasping pose may begin, at block 402, with a command from processor 103 that instructs sensors 262 to capture an image of the inventory disposed within a target container 110b.

The image(s) may then be transmitted, at block 404, over network or non-network communication channels 104 to processor 103. Upon receipt of the image, processor 103 may analyze the images and the Inventory Data of the items stored within the target container 110b at block 406.

Based on the Inventory Data, processor 103 may execute one or more grasping pose detection algorithms (which can be neural networks or machine learning algorithms stored on storage device 105) to predict one or more grasping pose candidates at block 408. Processor 103 may then implement a policy, at block 410, which utilizes one or more metrics, checks and filters to select one or more of the predicted grasping pose candidates for robot 200 to execute sequentially or to add to its queue. Then, at block 412, processor 103 produces, makes, or generates a signal including processor readable information that represents the selected grasping pose and sends the signal through communication channels 104 to robot 200. It will be appreciated, however, that robot 200 can alternatively run part of, or the entirety of, the grasping model on an onboard computer rather than relying on remote computing and communications.

Figure 9D:
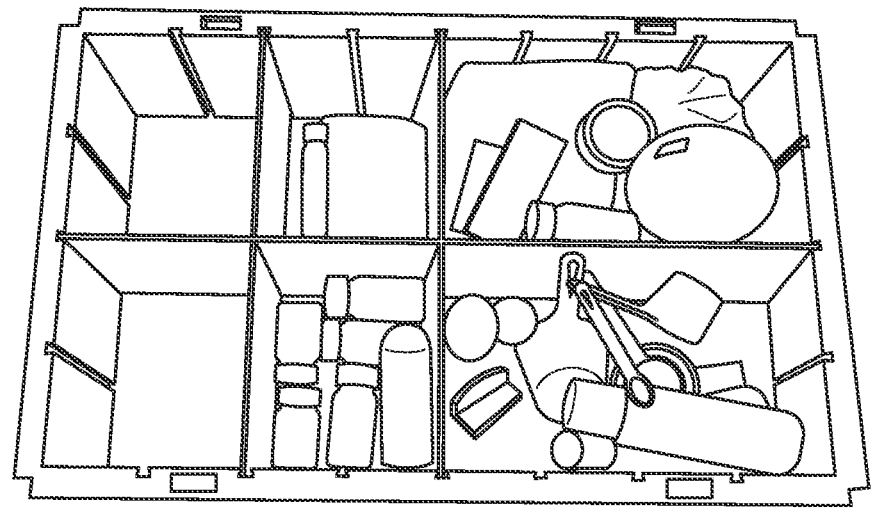
FIG. 9D is a schematic illustration of a plurality of product items located within a container.
Figure 9E:
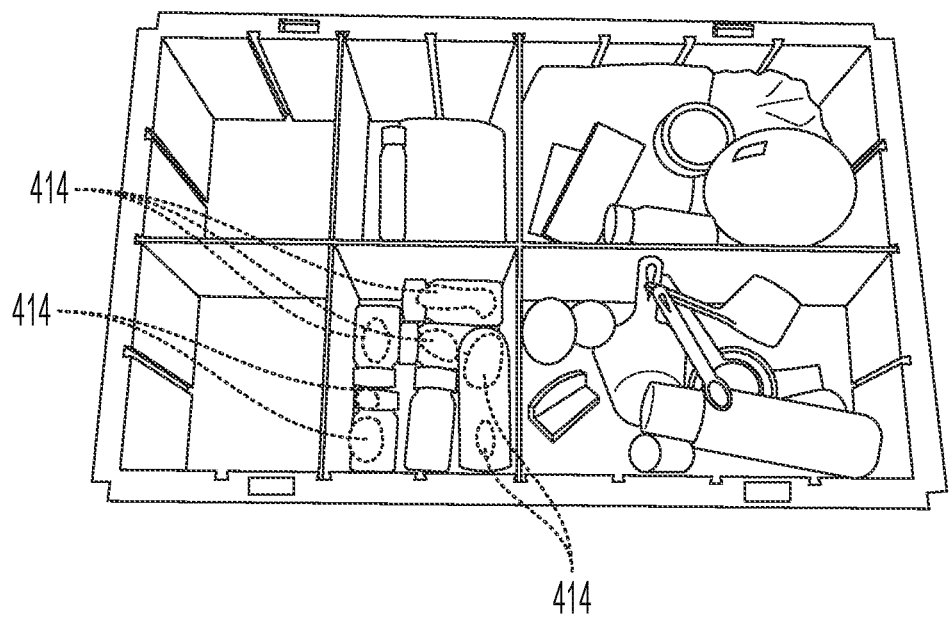
FIG. 9E is a schematic illustration showing grasping regions of the product items of FIG. 9D.

As shown in FIGS. 9D and 9E, sensors 262 and the grasping model may work in concert to identify a grasping region 414 of product items, defined as a specific area on the product item or packaging of the product item as a whole that manipulator robot 200 has a high likelihood of successfully grasping. Grasping region 414 may be a relatively non-porous and flat surfaced region of the product item and/or the product packaging when gripping tool 248 utilizes a suction force, antipodal surfaces when the gripping tool includes finger-like grasping elements, or a non-flat surface or edge when the gripping tool is a universal jamming gripper, or any other geometric properties conducive to being handled by a specific type of gripper capable of picking and handling items with specific geometric, material, and surface properties. FIG. 9D illustrates product items of different types within a target container 110b. FIG. 9E illustrates the identification of a grasping region 414 of the product items located within an area of the target container.

Figure 10A:
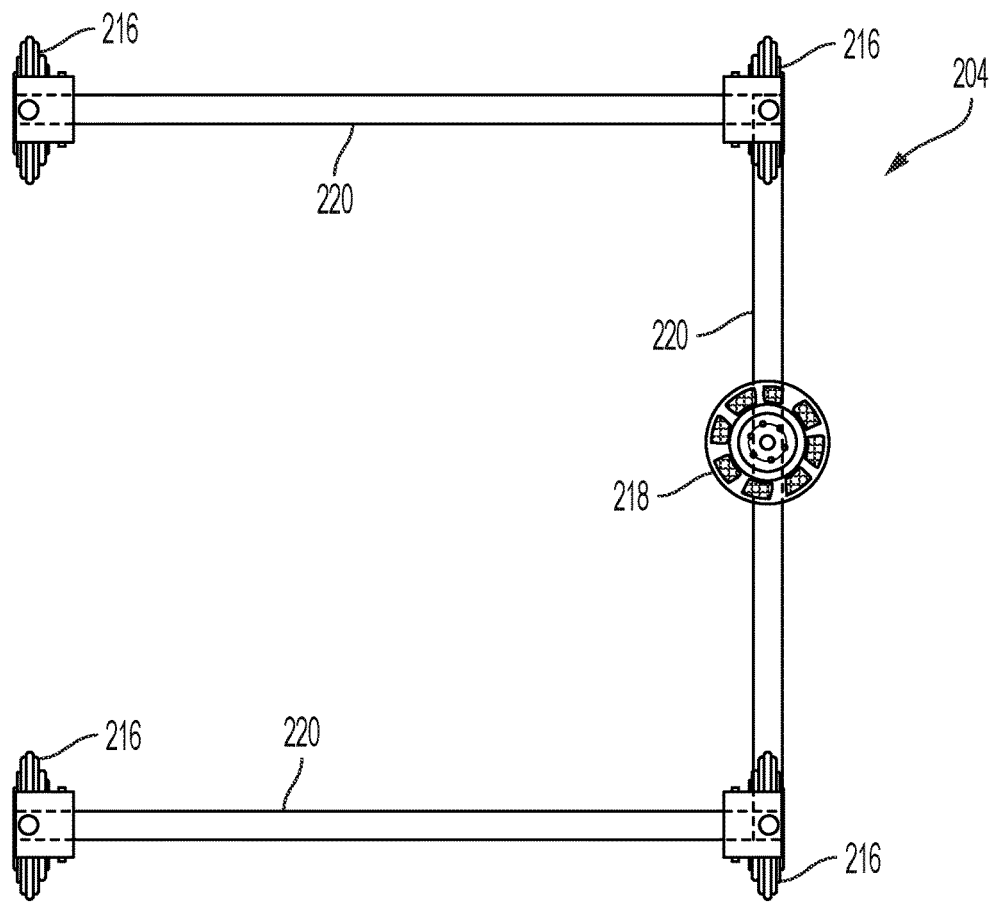
FIG. 10A is a top elevation view illustrating a mobility assembly of the robot of FIG. 9A.

Referring to FIG. 10A, mobility assembly 204 is configured to guide movement of vehicle body 202 along rails 122, 124, 125 and position robot 200 over, or laterally adjacent to a target bin 110b (e.g., a bin containing the product to be picked). Mobility assembly 204 may include a plurality of wheels 216, a motor 218 and one or more transmissions (belts or linkages) 220 operably coupling each one of the wheels to the motor. Wheels 216 may be configured with a smooth outer surface (e.g., cylindrical, disk, or spherical) or as a gear and may be formed of any material such as rubber, metal or plastic so long as the wheels can guide movement of vehicle body 202 along rails 122, 124, 125 to position robot 200.

Each one of wheels 216 may include a direct drive (not shown) or quasi-direct drive (not shown) actuator within a hub with a magnetic encoder, a hub motor (not shown) and a gear drive actuator (not shown) or a transmission drive actuator (not shown) to rotate wheels 216 and move vehicle body 202 along the rails 122, 124, 125 in which the wheels are positioned. Mobility assembly 204 may include four wheels 216, with one wheel being located at or adjacent to each one of the corners of vehicle body 202. The orientation of wheels 216 is controlled by motor 218 and transmission 220. More specifically, transmission 220 couples motor 218 to each one of wheels 216 directly or indirectly such that rotation of the motor simultaneously rotates/pivots the orientation of each one of the wheels 216 between a first orientation in which each of the wheels are oriented, for example, along rail 122, and a second orientation in which the wheels are aligned with rail 124 (e.g., 90 degrees). The four wheels 216 can thus be used to guide movement of vehicle body 202 in two directions, for example, along rails 122 (e.g., X-direction) and along rails 124 (e.g., Y-direction). Transmission 220 can also simultaneously pivot wheels 216 less than 90 degrees, or greater than 90 degrees, to orient the wheels and precisely control movement of robot 200 in any direction when the robot is not positioned on grid 126. Consequently, robot 200 need not include a second set of wheels or a separate drive mechanism for lifting and disengaging the second set of wheels each time the robot drives along a different rail, as is the case with known load handling device 30. Nevertheless, it will be appreciated that robot 200 may alternatively be constructed with two separate sets of wheels and drive mechanisms as described above with respect to load handling device 30. In one embodiment, wheels 216 may include magnets or electro magnets configured to act in concert with magnets or electro magnets in rails 122, 124, 125 to slightly levitate and propel the robot along the rails.

Figure 10B:
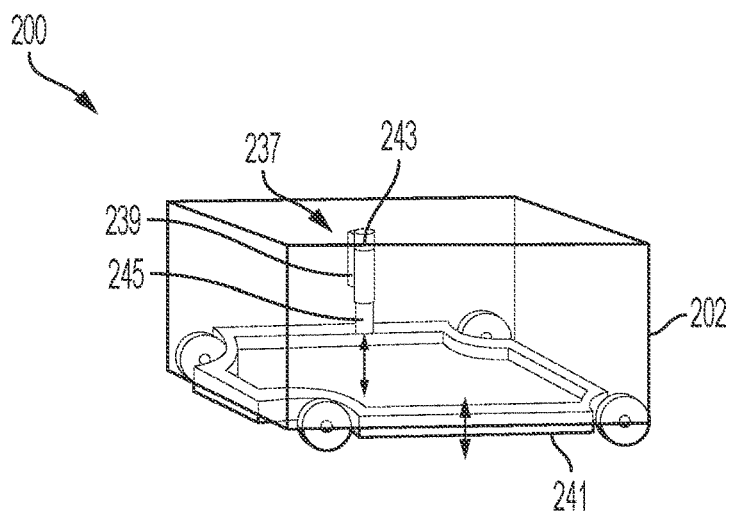
FIG. 10B is a schematic view of a prop mechanism that assists in rotating the wheels of the mobility assembly of FIG. 10A.

Manipulator robot 200 may further include a prop mechanism 237, shown in FIG. 10B, to align wheels 216 of mobility assembly 204 with rails 122, 124 and to prop the mobility assembly off of a driving surface. Prop mechanism 237 includes one or more linear or rotary actuators 239 designed to move one or more stands 241 in the z-direction relative to the body 202 of robot 200. Linear actuator 239 includes a housing 243 coupled to the body 202, preferably on an internal surface of one or more of the sidewalls 208 and a plunger 245 that is retractable toward the housing and extendable away from the housing. Plunger 245 is connected to stand 241 which may extend continuously or discontinuously around an inner surface of sidewalls 208 adjacent to the lower end 210 of body 202. When plunger 245 extends away from housing 243, stand 241 is moved downward and into contact with a drive surface such as the rails of grid 126 and positions the stand beneath that of wheels 216 which, in turn, transfers the load of manipulator robot 200 from the wheels to the stand. In this regard, the wheels 216 are suspended or floating above the drive surface so the orientation of the wheels can quickly and effortlessly be pivoted by motor 218 and transmission 220 as explained above. The plunger 245 may then be retracted to lift stand 241 away from the drive surface which, in turn, causes the wheels to re-engage the drive surface so that manipulator robot may then be moved.

The mobility assembly 204, or body 202, of manipulator robot 200 may further include one or more electrical brushes or conductive elements 221 (shown in FIG. 14B) to engage the inner drive surfaces 136a, 136b of rails 122, 124, 125 and transfer the charge from the rails to a relatively small onboard battery or super/ultra-capacitor and, in turn, to the drive motor or gear drive actuator of the robot. As a result, robot 200 may charge its battery or super/ultra-capacitor while the robot traverses grid 126. The throughput of the system is thus increased because robot 200 need not be removed from grid 126 and/or paused in order to charge or swap its battery or super/ultra-capacitor. The relatively small onboard battery or super/ultra-capacitor also allows robot 200 to be lighter, faster and safer than its load handling device 30 counterpart. Moreover, the small battery or super/ultra-capacitor may temporarily power the drive motor and/or gear drive actuator to drive wheels 216 even when robot 200 is removed from and driven off of grid 126. For example, robot 200 may be driven on the warehouse floor in any direction to navigate the robot between grids 126 and/or to other areas of the warehouse so that the robot may assist with other fulfillment tasks such as replenishment, picking/sorting inventory from shelving or a container (e.g., a bin, a tote, or any other structure holding inventory), for example, at a picking/sorting station, transporting items to a picking/sorting station (including completed orders, partially completed orders, or source totes containing items that need to be subsequently picked/sorted by that robot, another robot or an operator), and/or packaging the picked/sorted inventory.

Figure 11:
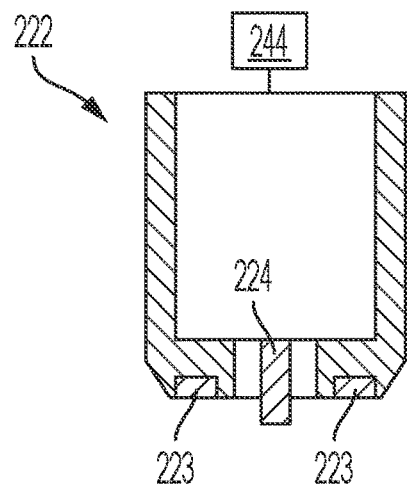
FIG. 11 is a schematic cross-section view of a coupler of the robot of FIG. 9A.

Referring to FIG. 11, robot 200 further includes a pneumatic coupler 222 adapted to receive a fluid, such as compressed air, from fluid supply system 138. Coupler 222 is preferably extendable from a position within the sidewall 208 of vehicle body 202 to a position outside of the sidewall of the vehicle body in a manner that allows the coupler to selectively engage and disengage with valve 150. When coupler 222 is positioned within the vehicle body 202 of robot 200, the coupler will not interfere with other robots positioned on grid 126 or other structural features of the storage system. Coupler 222 may be a generally hollow tube sized to be positioned within the cavity 143 of rails 122, 124, 125. The mating end of coupler 222 may be tapered and/or include a self-alignment or misalignment handling device to assist in positioning coupler 222 within cavity 143. The mating end of coupler 222 may also include an O-ring (not shown), a magnet 223 for magnetically engaging the magnet 157 or ferrous material disposed around port 146, and a device 224 for transitioning valve 150 between the closed and open conditions. Device 224 may be, for example, a mechanical member adapted to push plug 154 into conduit 144 (away from port 146), or any other device for electrically, magnetically, mechanically or otherwise transitioning valve 150, or another valve, between the closed and open conditions. For example, a similarly constructed coupler may include one or more conductive pads to provide power and actuate an electrohydraulic servo valve.

Robot 200 may optionally carry a small air tank 266 (FIG. 9A) for storing compressed air. In some embodiments, air tank 266 may be smaller than 20 cubic feet. The air tank 266 of robot 200 is in selective communication with coupler 222. In this manner, robot 200 need not access the compressed air of supply system 138 each time the robot desires to grasp a product item. Robot 200 may instead rely on the compressed air stored within air tank 266 to pick inventory items for a limited time, and need only couple to supply system 138 when the robot desires to refill the air tank. As a result, robot 200 can temporarily operate picking arm 206 on the grid without coupling to supply system 138 and/or when the robot is driven off of the grid to assist with other grasping and sorting tasks.

Figure 12A:
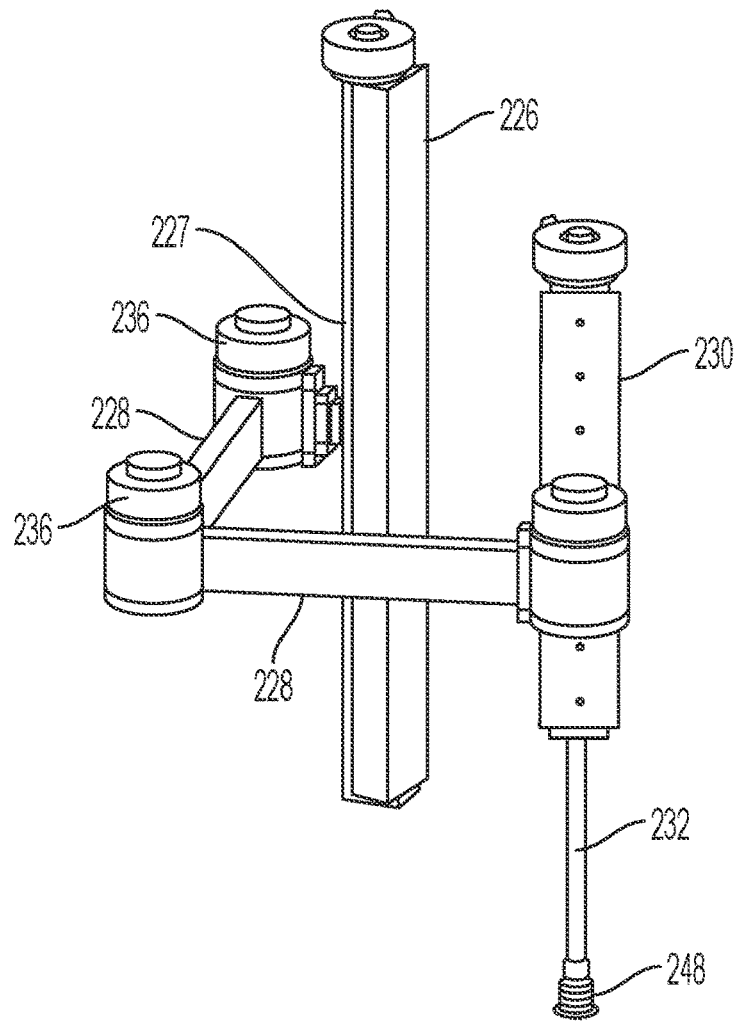
FIG. 12A is a perspective view of the picking arm of the robot of FIG. 9A.
Figure 12B:
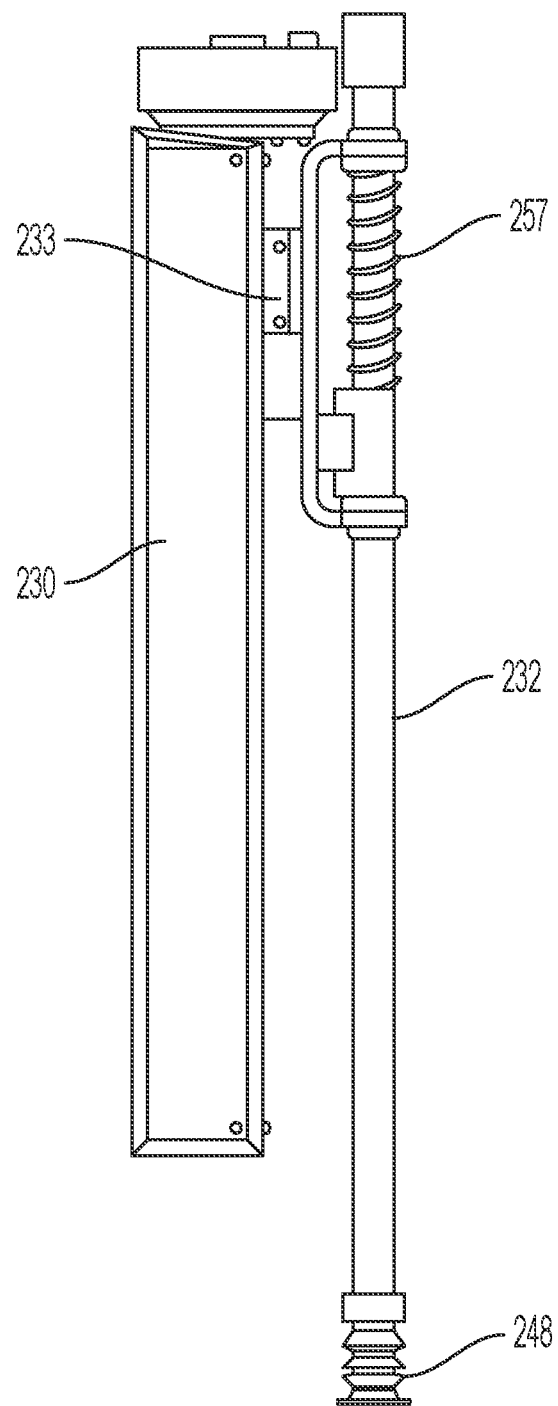
FIG. 12B is a side view of a portion of the picking arm of FIG. 12A.

FIGS. 12A and 12B illustrate an example embodiment of picking arm 206 coupled to pneumatic gripping tool 248. Picking arm 206 is moveable with several degrees of freedom to position pneumatic gripping tool 248 relative to inventory stored in any location within a container 110 and has long stroke (in the Z-direction) to allow robot 200 to lift any sized item from the container and to deposit the item in order bin 214. For example, picking arm 206 may include at least six degrees of freedom. In one non-limiting example, picking arm 206 includes 3 Cartesian degrees of freedom, a fourth degree of freedom in the yaw and fifth and sixth degrees of freedom for pitch and roll or to increase linear stoke in the z-direction. In the illustrative embodiment, picking arm 206 may include a base member 226, one or more horizontal extensions 228, a vertical extension 230 and a positioning arm 232 configured to removably secure pneumatic gripping tool 248. Positioning arm 232 may be a relatively thin tube that has a smaller diameter than gripping tool 248. This allows positioning arm 232 to freely position gripping tool 248 within container 110 without interference from other items or partitions disposed within the container. Positioning arm 232 may be coupled to vertical extension 230 via a coupling mechanism 233 that allows the positioning arm to translate along a "first linear pathway," such as a track, extending along the length of the vertical extension. One or more fluid lines 253 (FIG. 13B) are disposed within positioning arm 232 to fluidly couple gripping tool 248 and coupler 222 (FIG. 11). If more than one fluid line 253 is utilized, the fluid lines may be independent from one another.

Base member 226 may be attached to the vehicle body 202 and extend above the open top end 212 of the vehicle body. Base member 226 may include a "second linear pathway" 227, such as a track, extending along the length of the base member. Horizontal extensions 228 may be coupled to base member 226 in a manner that allows the horizontal members to move along the second linear pathway 227 to vertically position vertical extension 230. Horizontal extensions 228 are also rotationally coupled to base member 226, one another, and vertical extension 230 via joints 236, actuators and motors (not shown) that allow the pneumatic gripping tool to be positioned relative to the product items with several degrees of freedom. In an exemplary embodiment, the actuators may have magnetic encoders with diametrically polarized magnets coupled to the motor rotor. The motor may be in the form of a brushless motor and have a larger diameter than length. Picking arm 206 may alternatively be pneumatically or hydraulically actuated and utilize actuatable valves to control hydraulic or pneumatic rotary or linear actuators that control the pose of pneumatic gripping tool 248. As will be further explained with reference to FIG. 12C, in a preferred embodiment, the combination of the first and second linear pathways is equal to or greater than 2 times the height of containers 110, and preferably equal to or greater than 3 times the height of the containers.

Figure 12C:
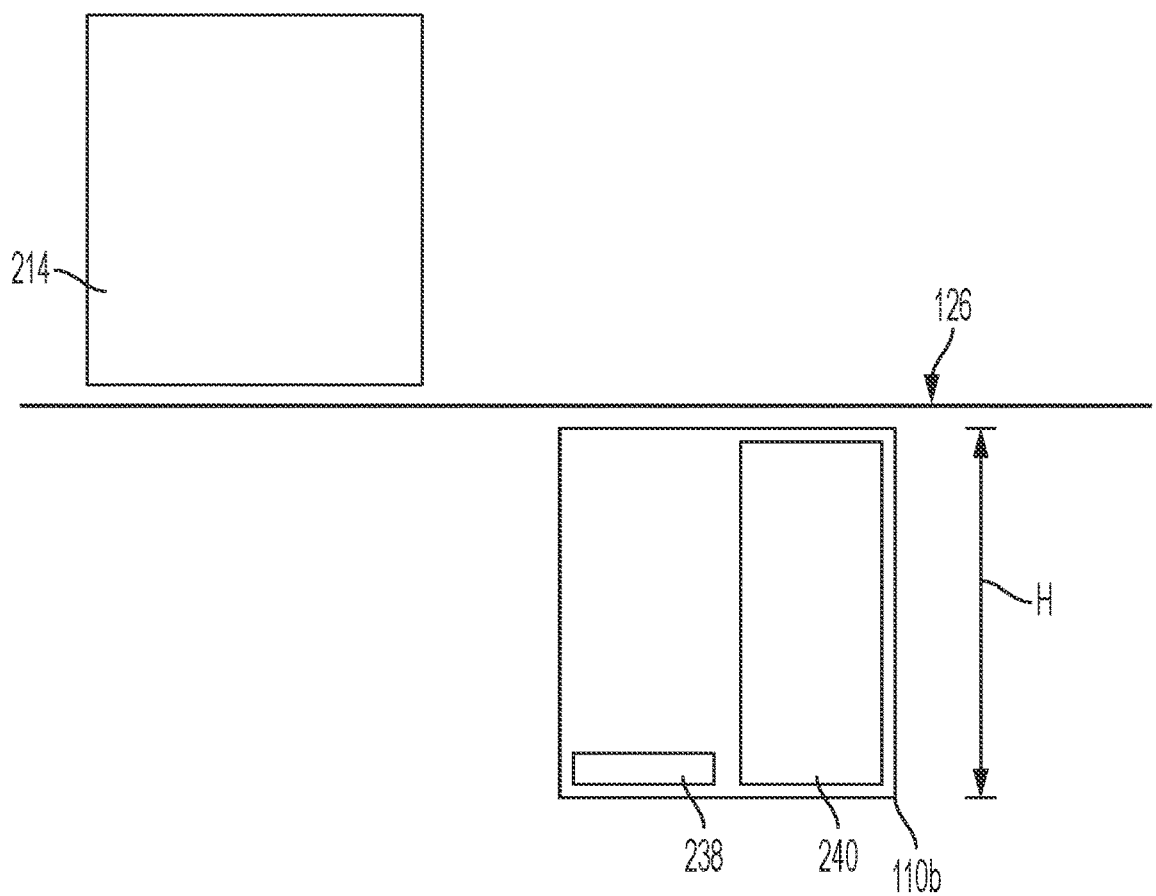
FIG. 12C is a schematic cross-section view of an order bin and a target container holding inventory items of different sizes.

FIG. 12C is a schematic, cross-section view illustrating a target container 110b holding a first, relatively small item 238 (in height) and a second, relatively large item 240 (in height) that is approximately the height of the container. The long stroke picking arm 206 of robot 200 is capable of picking both item 238 and item 240 from target container 110b (when the target container is positioned at the top layer of a stack 112 and just below grid 126) and depositing the items in order bin 214. For example, in picking item 238 from the bottom of target container 110b, gripping tool 248 must first be lowered a distance equal to the height of the robot body (shown in FIG. 9A) and then lowered approximately the height of target container 110b (e.g., a distance equal to approximately 2 times the height of the target container). Thus, in order to pick item 238, horizontal extensions 228 may be moved to the bottom of first linear pathway 227 and positioning arm 232 may be moved downward relative to vertical extension 230 and to the bottom of the second linear pathway to allow gripping tool 248 to contact and grasp the relatively small item 238. After item 238 has been grasped, positioning arm 232 may be moved upward and to the top of the first linear pathway and the horizontal extensions may be moved upwards along the second linear pathway 227, allowing the first item to be deposited within order bin 214.

On the other hand, to grasp the relatively large second item 240 and to deposit the second item in order bin 214, the gripping tool must be raised to a sufficient height that allows the bottom of the second item to clear the top of the order bin (e.g., gripping tool 248 must be positioned a distance equal to approximately the height of the container above the top of the order bin). Thus, after the relatively large second item 240 has been grasped by picking arm 206, positioning arm 232 may be retracted upwards relative to vertical member 230 along the first linear pathway and the horizontal members may move toward the top of second linear pathway 227 to allow the bottom of the second item 240 to clear the top of order bin 214. Thus, it will be appreciated that in order to grasp and deposit relatively small items such as item 238 and relatively tall items such as item 240, the stroke of picking arm 206 (in the Z-direction) must be at least 2 times the height of the containers and preferably 3 times the height. While the stroke length may be accomplished with a single linear pathway, dividing the stroke length into two or more linear pathways allows picking arm 206 to be more compact and have a smaller vertical profile.

It will be appreciated that further increasing the stroke of picking arm 206 in the z-direction will allow the picking arm to reach underneath grid 126 and pick items from a target container 110b located on the top of a stack but beneath the upper most level in the same manner as described above so long as no non-target containers 110a lie on top of the target container.

In a preferred embodiment, as shown in FIG. 12B, picking arm 206 also includes a spring 257 (and/or a back-drivable actuator, or a force controlled actuator such as a quasi-direct-drive, direct-drive, series-elastic actuator, or geared actuator with torque sensing that exhibits active compliance and functions as a virtual spring) or a compliant gripping tool 248 that provides passive or active compliance and that can be used to sense collisions and assist in performing manipulation tasks such as picking or dense packing. The spring 257 (and/or back-drivable actuator or force controlled actuator) may be provided between pneumatic gripping tool 248 and positioning arm 232, and/or at the coupling mechanism 233 that couples positioning arm 232 and vertical extension 230. Thus, if gripping tool 248 presses against a product or infrastructure of the storage structure with too great a force, the gripping tool or the positioning arm 232 will recoil to prevent damage to the picking arm 206 and/or the product. The compliance may also better position gripping tool 248 relative to the item during grasping.

It will be understood that picking arm 206 may be alternatively constructed and/or include fewer or additional components, so long as the pneumatic gripping tool is positionable with several degrees of freedom to grasp inventory items stored within target container 110b. For example, picking arm 206 may also include a load cell or a force-torque sensor to measure the payload of a grasped item and/or sense an external force applied to the gripping tool. In this manner, robot 200 can instantaneously determine and/or verify the identity of the grasped item to pick and densely pack inventory items.

As mentioned above, gripping tool 248 is in fluid communication with coupler 222 and thus in selective communication with fluid source S. In embodiments in which fluid source S is a pneumatic compressor providing compressed air, robot 200 may include one or more air ejectors, air aspirators, Venturi pumps 244 (FIG. 11) or similar devices (hereinafter "Venturi pump") capable of using the compressed air of supply system 138 to produce a vacuum or suction force. With reference to FIG. 13C an example pneumatic circuit is shown, one or more "bypass valves" may be provided between coupler 222 and gripping tool 248. The bypass valves are controlled by one or more valve actuators and are transitionable between 3 conditions: a closed condition, a first open condition and a second open condition. In the closed condition, the bypass valve prevents the compressed air from passing to gripping tool 248. In the first open condition, the bypass valve allows compressed air to flow from coupler 222, through Venturi pump 244 and to gripping tool 248. Thus, when the bypass valve is in the first open condition, the valve allows compressed air to flow through Venturi pump 244 such that the Venturi pump can generate a suction force to operate a gripping tool 248 that relies on suction for grasping. In the second open condition, the bypass valve allows compressed air to flow from coupler 222 to gripping tool 248 but diverts the compressed air around Venturi pump 244. Thus, when the bypass valve is in the second open condition, the compressed air bypasses the Venturi pump and allows robot 200 to utilize the compressed air to actuate a pneumatic gripping tool 248 such as clamp and/or one of the other tool elements discussed below. The compressed air may also be utilized to blow or dispel air from gripping tool 248 to reposition inventory items within containers 110 and/or to reposition inventory items within order bins 214 to facilitate packing. Additional valves ("variable valves") such as a throttle regulator may be provided upstream of the bypass valve (e.g., between coupler 222 and the "bypass valve") to precisely regulate airflow to the bypass valve and, in turn, to gripping tool 248. The variable valves and the bypass valves may be solenoid valves and may be selectively activated by a driver or relay controlled by a processor.

Figure 13A:
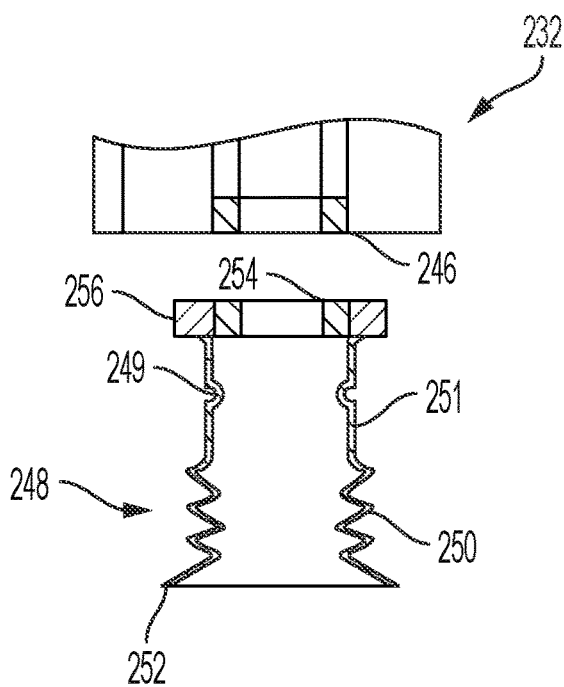
FIG. 13A is a cross-section view illustrating the coupling between the pneumatic gripping tool of FIG. 9A and the picking arm of FIGS. 12A and 12B.

Referring to FIG. 13A, positioning arm 232 includes a magnet 246, for example, a ring magnet 246 or a magnet arrangement that magnetically couples gripping tool 248 to the positioning arm. Gripping tool 248 may be any pneumatically actuated tool for grasping items. For example, gripping tool 248 may be a suction cup having a sidewall 251 formed of a resilient material such as rubber with bellows 250, and a groove 249 positioned above the bellows. The sidewall 251 of gripping tool 248 is thus adapted to compress when the gripping tool engages an object. Gripping tool 248 may further include a lip 252 formed from a resilient material, which also may be a rubber, such that the lip of the gripping tool is adapted to deform to and create a seal with the surface of a product in which it engages. A ring magnet 254 may be provided on gripping tool 248 to attract the magnet 246 of positioning arm 232 and to magnetically couple the gripping tool to the positioning arm. A gasket, such as an O-ring 256, may be provided on gripping tool 248 to seal the connection between positioning arm 232 and the gripping tool. In some embodiments, gripping tool 248 may additionally have a groove (not shown) to cooperate with a protrusion feature (not shown) on the positioning arm 232 to prevent rotational and axial movement of the gripping tool relative to the positioning arm when the gripping tool is coupled to the positioning arm. In other embodiments, gripping tool 248 may be coupled to positioning arm 232 via a mechanical connection such as a push/pull connection, snap fit connection, hook in slot connection, tab-in-slot connection, a twist/locked connection or any combination of male/female mechanical connections.

Figure 13B:
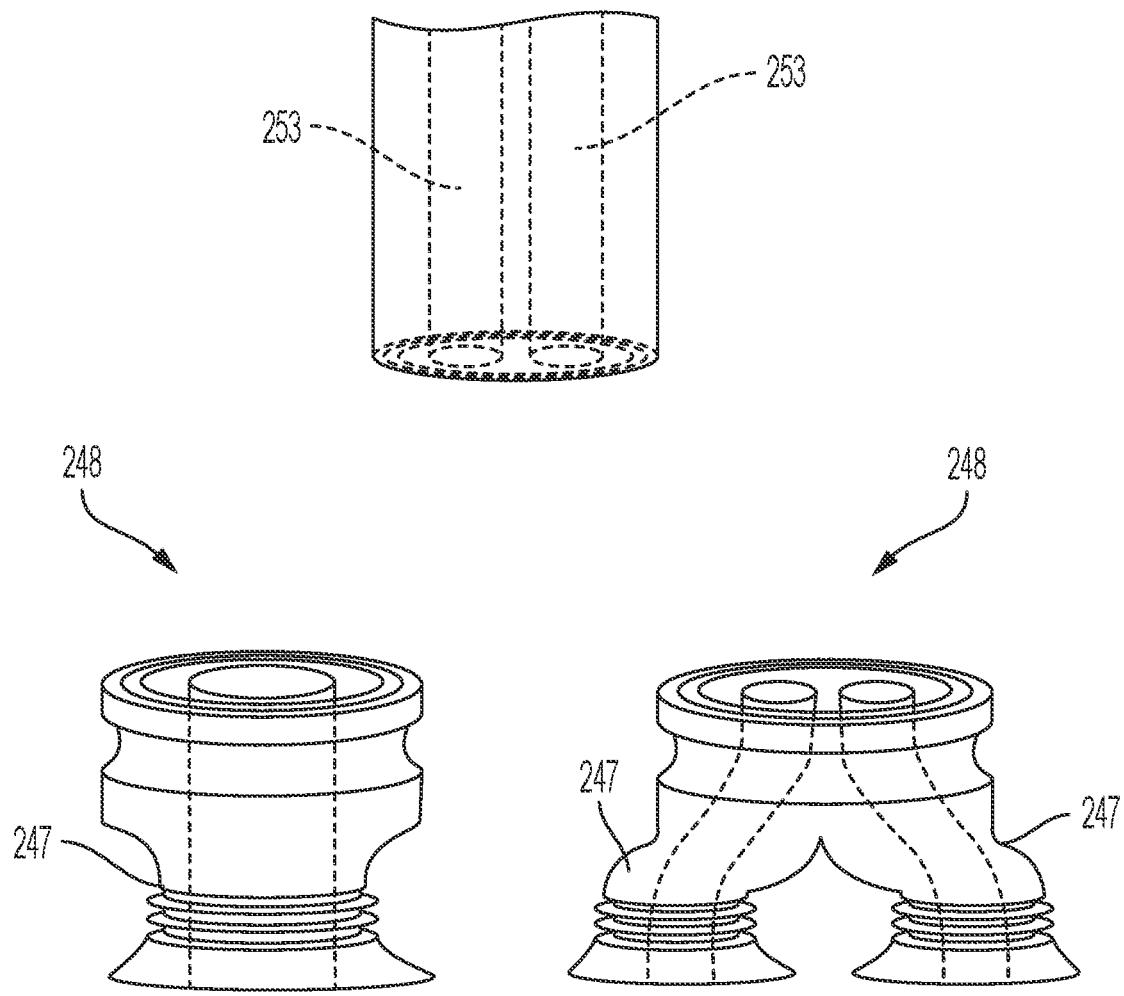
FIG. 13B is a schematic perspective view illustrating the coupling between the picking arm of FIGS. 12A and 12B and alternative pneumatic gripping tools.
Figure 13C:
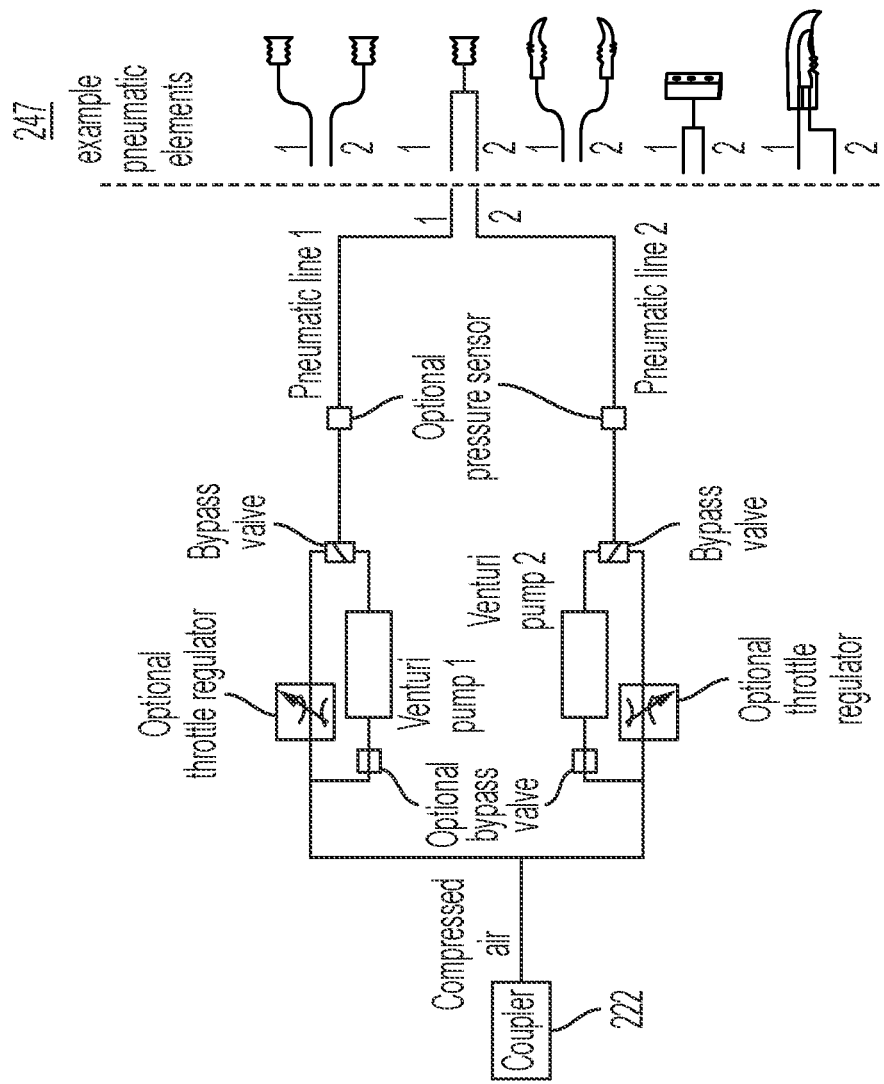
FIG. 13C is a schematic illustration showing two pneumatic supply lines of the mobile, manipulator robot of FIG. 9A coupleable to several example pneumatic tools.

Turning now to FIG. 13B, gripping tool 248 may include one or more elements 247 to assist in performing its gripping task. As used herein, the term "tool" means any device that is affixed to or coupleable to the picking arm 206 of robot 200 and designed to perform a fulfillment task such as grasping items, packing items, cutting boxes etc. In contrast, the term "element" denotes particular aspects of the tool as a whole. For example, gripping tool 248 may have one or more gripping elements such as a suction cup and/or fingers for grasping an item. In this example, the suction cup is an element and each of the fingers are individual elements forming the entire tool. As shown in FIG. 13A, the entire tool 248 can be formed of a single element (e.g., the suction cup). In other instances, it will be appreciated that tool 248 may include multiple elements such as suction cups, fingers and/or other elements for completing fulfillment tasks. The term "gripping tool" as used herein means that the tool includes at least one gripping element primarily designed to grasp items but does not exclude the tool from having additional elements designed primarily to complete other fulfilment tasks. Furthermore, the terms "pneumatic tool" and "pneumatic element" mean that the tool or the element is pneumatically actuated.

An exemplary gripping tool 248 may include a suction cup and/or a clamp (not shown) having a plurality of pneumatically actuated fingers. The fingers may be used in combination with the suction cup or in isolation of the suction cup to grasp products. In some embodiments, the fingers themselves may include suction cups. In other embodiments, as shown in FIG. 13B, gripping tool 248 may include a plurality of suction cups arranged on a single gripping tool. The plurality of suction cups may be arranged in an array to grip large and heavy inventory items at several discrete locations, thereby providing a more stable grasp than a single suction cup. The suction cups may also be arranged to grasp multiple items at once. In further embodiments, other gripping elements may be utilized. By way of example, these gripping elements may include universal jamming grippers, foam vacuum grippers, pneumatically inflatable fingers, variable stiffness fingers, pressure actuated fingers, pneumatically actuated linkage or piston driven grippers with rigid or compliant fingers or any other pneumatically driven or vacuum driven (positive or negative pressure) gripper elements. Gripping tool 248 can also include conductive target pads and push-pins on the gripping side of the gripping tool (or vice-versa) to provide power and communication signals to internal sensors and/or actuators of the gripping tool or to electrically supplement the pneumatic grasp. In other embodiments, the tool need not include a gripping element for grasping items. The tool may instead include an element such as a knife, a pneumatic rotary cutting tool (shown in FIG. 9G) or another pneumatically actuated cutting tool to cut open boxes. The tool may include any pneumatically actuated elements including but not limited to air caulk guns, spray gun, air chisels and punches, air cut-off tools, air drills, air files, air grinders and sanders, air guns, air hammers, air nailers, air nibblers and shears, air riveters, air routers, air scarifiers, air screwdrivers, air staplers, air tapping tools, air-powered saws, and air-powered ratchets and wrenches, or any air-driven motor, piston, or actuator.

As shown in FIG. 13B, the positioning arm 232 of picking arm 206 may include a plurality of discrete fluid lines 253 that are individually coupleable to one or more elements 247 on a single tool 248. For example, when the picking arm 206 of robot 200 is coupled to a gripping tool having a single element such as a single suction cup, each of the fluid lines 253 may be in communication with the single suction cup. On the other hand, when the picking arm 206 of robot 200 is coupled to a gripping tool having a plurality of elements such as a plurality of suction cups, each fluid line 253 may be in communication with a respective suction cup allowing the suction cups to be independently actuated. Each fluid line 253 may have a Venturi pump 244, bypass valve and one or more variable valves associated with the fluid line 253 to control the suction force or the force of compressed air as explained above with reference to FIG. 13C. As is shown in FIGS. 13B and 13C, multiple fluid lines 253 may provide a pneumatic supply to each element on a multi-element tool for actuation or gripping purposes. For example, a variable stiffness finger may be in communication with 2 fluid lines to independently control finger position and finger stiffness. Alternatively, multiple fluid lines 253 may be in fluid communication with a single element tool such as a tool with one suction cup to provide a higher flow rate to that tool.

Figure 13D:
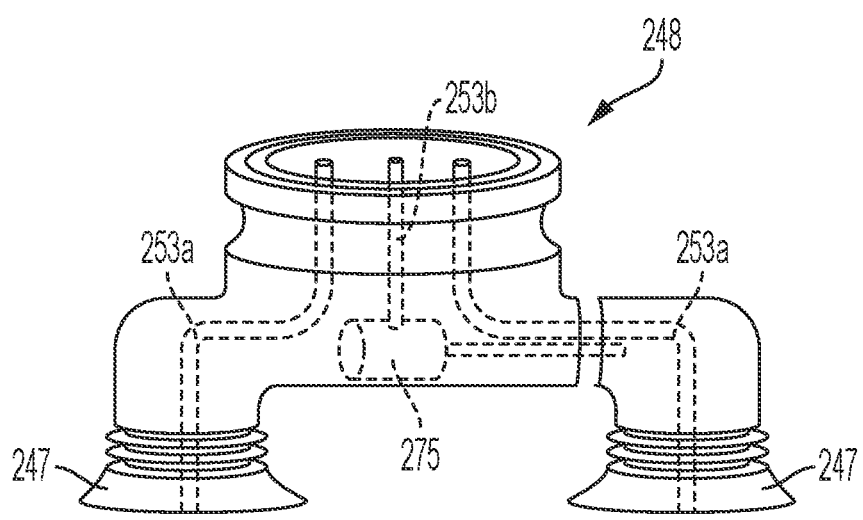
FIG. 13D is a perspective view illustrating a pneumatic gripping tool having a plurality of gripping elements moveable relative to one another.

Referring now to FIG. 13D, when gripping tool 248 includes a plurality of gripping elements 247, the gripping elements may be adjustable to one another. In one embodiment, gripping tool 248 includes a plurality of gripping elements 247 and an adjustment mechanism or linkage, such as an extendable and retractable piston 275, to move the gripping elements relative to one another. Each gripping element 247 may have a discrete supply line 253a permitting that gripping element to be actuated independently from the other gripping elements. Gripping tool 248 may further have a separate and discrete supply line 253b in fluid communication with piston 275 to control the extension and the retraction of the piston arm and, in turn, the relative distance between the gripping elements. For example, piston 275 may be extended to increase the distance between gripping elements 247 and retracted to decrease the relative distance between the gripping elements. Although FIG. 13D illustrates two gripping elements 247 and a single piston, it will be understood that the gripping tool may alternatively be formed with more than two gripping elements and one or more adjustment mechanisms configured to adjust the spatial relationship of the one or more of the gripping elements. It will also be understood that piston 275 may be disposed in any orientation to adjust the relative position of the gripping elements in any direction including along the x-axis, y-axis, z axis, a combination of any of the foregoing, and/or a rotation about any axis.

Any one of the pneumatic elements described above, or a combination thereof, may be used to grasp one or more objects at a time, pack grasped objects, swap battery packs on the robot, activate bomb bay doors on a bin, lift and attach an order bin to a container, cut or seal boxes, manipulate items within an order bin, for example, by nudging, blowing or toppling the items, or perform any other tasks that facilitate order fulfillment.

Figure 9F:
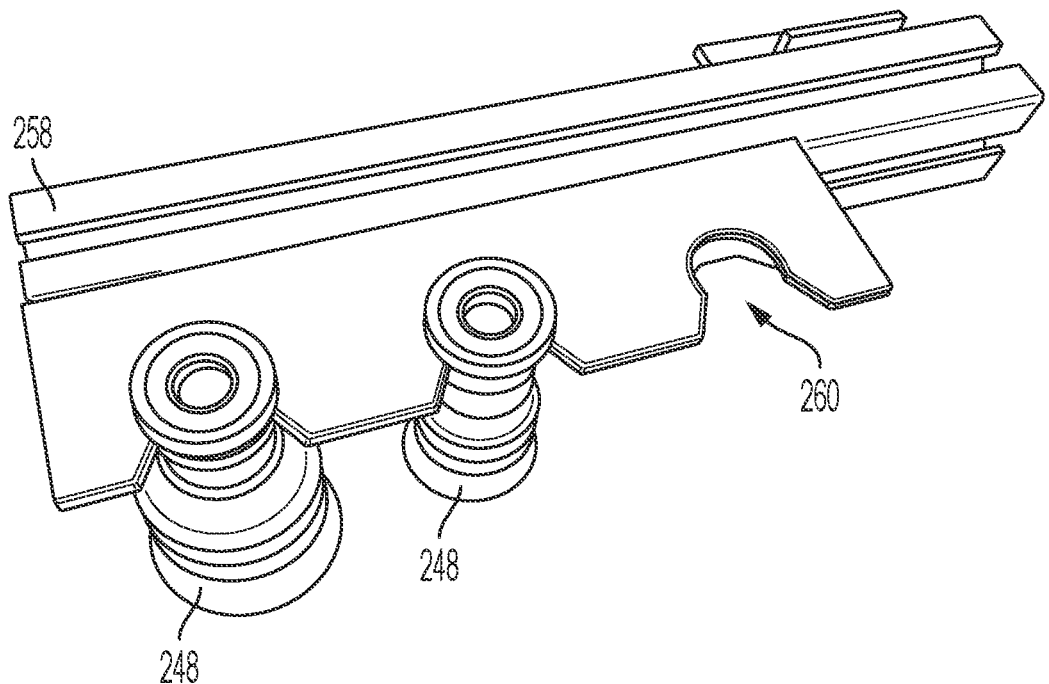
FIG. 9F is a perspective view of a first set of pneumatic gripping tools stored in the tool holder of FIG. 9A.
Figure 9G:
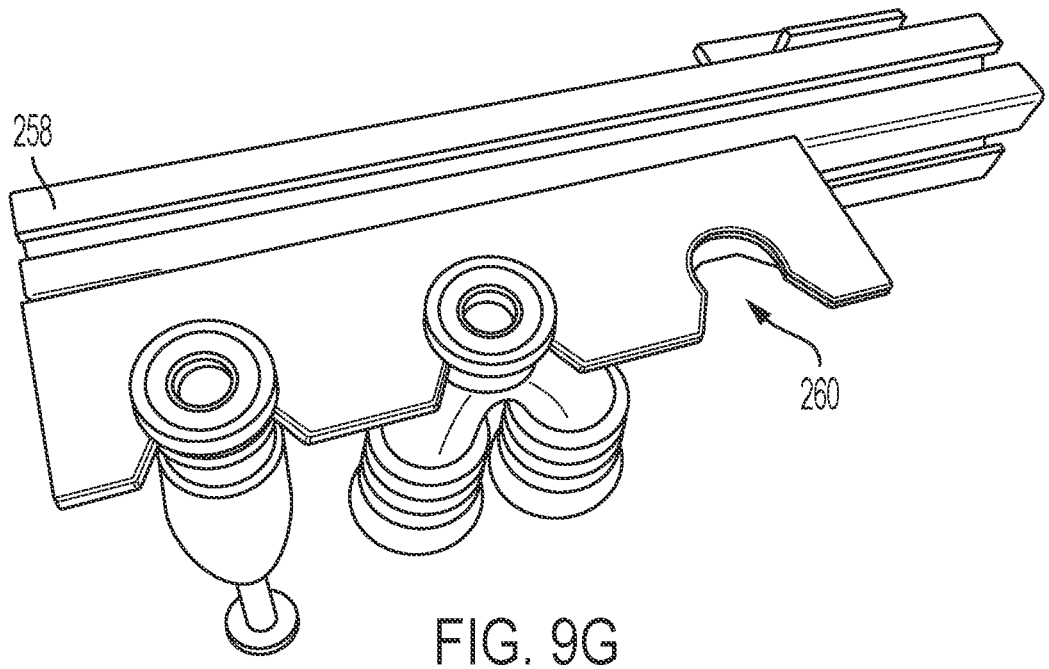
FIG. 9G is a perspective view of a second set of pneumatic gripping tools stored in the tool holder of FIG. 9A.

Referring to FIGS. 9A, 9F and 9G, the vehicle body 202 of robot 200 may include a tool holder 258 for holding a plurality of tools 248. Tool holder 258 may include a plurality of retainers 260a, 260b (collectively "retainers 260") such as arcuate or rectangular cutouts for receiving the groove 249 of gripping tool 248, or a holding area such as a cup for receiving the bottom or sidewall 251 of the gripping tool. In this manner, a plurality of different tools 248 (e.g., tools having different tool elements and/or number of or configurations of tool elements, or suction cups having lips of different sizes, materials, shapes, configurations or orientations) may be interchangeably coupled to positioning arm 232 and to tool holder 258 when not in use, such that the picking arm 206 can select a particular gripping tool based upon the size, shape, material or weight of the product in which the robot is tasked with grasping. In some embodiments, tool holder 258 may be magnetic to assist in securing tools 248. Tool holder 258 may alternatively, or additionally, include a compliant member to secure tools 248 within retainers 260 via a snap-fit connection. Each of one of the tools 248 may include an RFID, AR tag, calibrated weight, QR code or similar identifier capable of being identified by a sensor or the load cells of picking arm 206. In this manner, robot 200 can determine if tool 248 is secured to picking arm 206 and can verify that the secured tool is the desired tool.

In other embodiments, tool holder 258 may be provided at dedicated "tool holder stations" on or adjacent to particular areas of grid 126 or at other areas within warehouse 101. Robot 200 may thus drive to a tool holder station to swap individual tools or to swap one tool holder 258 for a completely different tool holder having a different set of tools. In this manner, robot 200 can swap tool holders based upon its upcoming set of tasks such that the robot does not need to carry each tool that it may ever be instructed to utilize.

Referring back to FIG. 9B, one or more sensors 264, such as a scanner, may be positioned on the vehicle body 202 or the picking arm 206 of robot 200 to scan picked products and determine and/or verify which order bin 214 the picked product should be deposited. The scanning field of the scanners may be multiplied by positioning mirrors on the inner surfaces of sidewalls 208. Sensors 264 or another sensor may be used to capture an image or data of a grasped product after it has been picked (and before it has been deposited in order bins 214) to identify and/or determine the size and dimensions of the item. This information can be transmitted to remote computer 103 which can then instruct manipulator robot 200 to deposit the grasped item within a particular location of one of order bins 214 and/or in a particular orientation to facilitate dense packing. In some embodiments, vehicle body 202 may also include a shelf or ledge-like feature upon which a grasped item may be temporarily placed and, subsequently re-grasped from a different orientation, to facilitate packing based upon the properties of the grasped item and the other items needing to be subsequently placed in that container. Alternatively, a gripping tool 248 having a plurality of gripping elements 247 with one or more gimbal degrees of freedom between the elements may be manipulated to adjust the gripping elements relative to one another to re-grasp the earlier grasped item in a desired orientation. It will be appreciated that the grasping, re-grasping, packing, or any other manipulation task of one or more items (or containers) may also be accomplished using two or more gripping tools 248 provided on two or more robots 200.

Figure 14A:
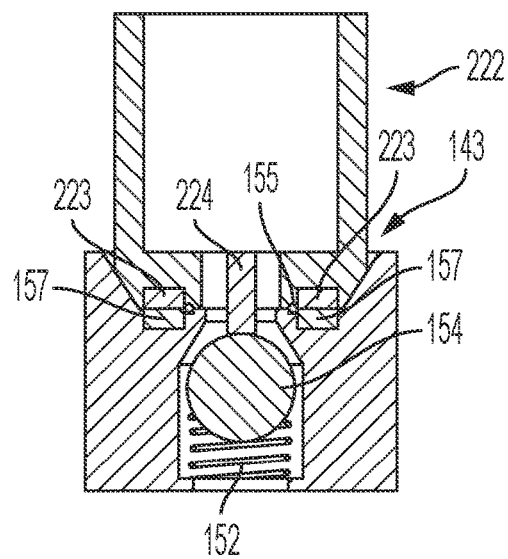
FIGS. 14A and 14B are schematic cross-sections illustrating the coupling between the coupler of FIG. 11 and the conduit of FIG. 7A.
Figure 14B:
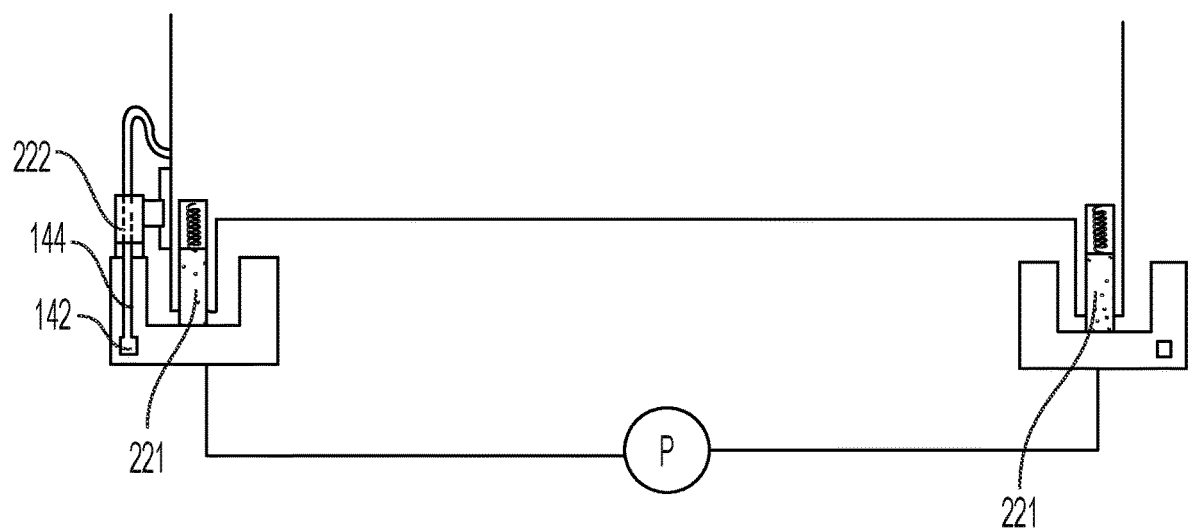
Figure 14C:
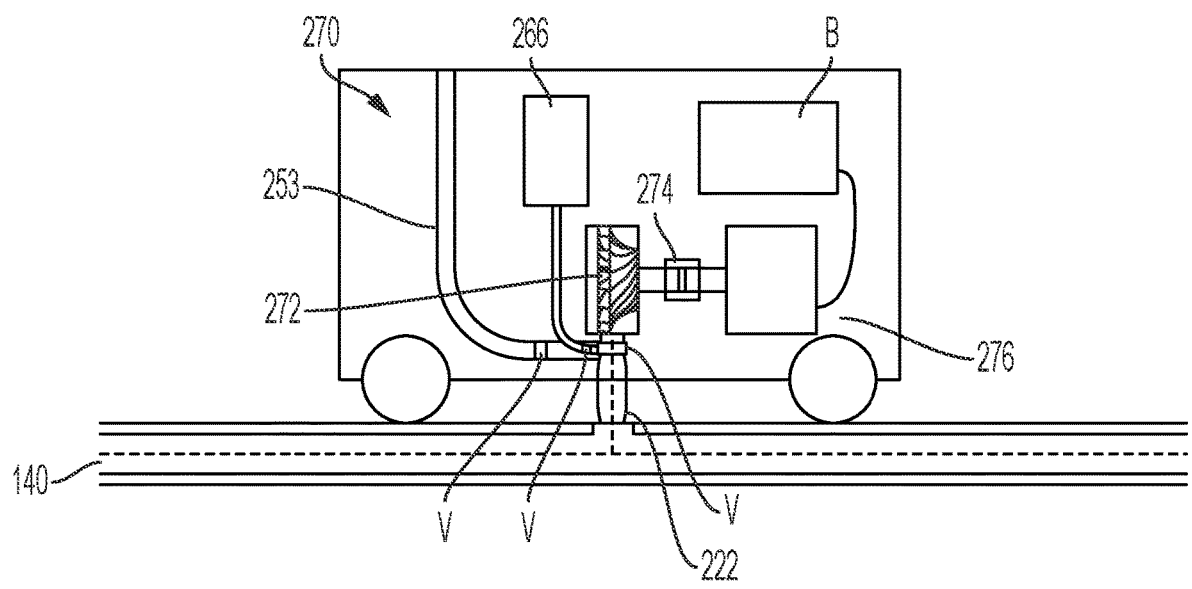
FIG. 14C is a schematic illustration of a robot having a pneumatic charging system.

Referring to FIG. 14C, a pneumatic charging system 270 can be incorporated into any one of the mobile robots disclosed herein including robot 200, robot 205 or robot 600 (discussed below with reference to FIG. 16A). Pneumatic charging system 270 can be used to charge an energy source such as the relatively small onboard battery B or super/ultra-capacitor of the robot and may be used in addition to electrical brushes 221 (shown in FIG. 14B) or as a replacement for the electrical brushes or conductive contacts.

Pneumatic charging system 270, as shown in FIG. 14C, includes a coupler 222, a pneumatic actuator 272, and an electromagnetic device 276 (e.g., a generator or electric motor) electrically connected to the energy source. A plurality of valves V, transitionable between an open condition and a closed condition, are positioned upstream from the mating end of coupler 222 to selectively divert pneumatic air from the coupler toward or away from the one or more pneumatic systems of the robot. For example, a first valve may be positioned between coupler 222 and the one or more fluid supply lines 253 that are in communication with Venturi pump 244 and gripping tool 248, a second valve may be positioned between the coupler and air tank 266 and a third valve may be positioned between the coupler and pneumatic actuator 272. In this manner, pneumatic air can be regulated to any of the pneumatic systems of the robot when desired.

In one embodiment, pneumatic actuator 272 is an air motor that is designed to convert energy from the pneumatic supply (e.g., compressed air) to mechanical work through linear motion (performed by a diaphragm or piston) or rotary motion (performed by a vane type air motor, a piston type air motor, an air turbine or a gear type motor). The air motor is coupled to a rotor of electromagnetic device 276 via a shaft 274 (e.g., a single shaft or a plurality of shafts coupled to one another). In this manner, when the third valve (e.g., the valve between coupler 222 and the air motor) is in the open condition and, pneumatic air is flowing through the coupler into the air motor, the pneumatic air will force the air motor to perform mechanical work such as rotate a turbine. The mechanical work, whether linear or rotational, will cause shaft 274 to move in a corresponding manner which in turn rotates the rotor of electromagnetic device 276 thereby generating a voltage and charging the battery or super/ultra-capacitor. As a result, pneumatic charging system 270 allows the robot to charge its battery or super/ultra-capacitor while the robot is coupled to supply line 140 and during the normal course of its operation (e.g., while the robot is digging, picking, and/or idling). Pneumatic charging system 270 thus eliminates the need for other charging equipment and reduces the overall cost of robotic system 100 while increasing the throughput of the system because the robots need not be removed from the grid 126 and/or paused in order to charge or swap energy sources.

Alternatively, pneumatic actuator 272 may be a piezo. In this embodiment, shaft 274 and electromagnetic device 276 are eliminated. The piezo is placed downstream of the coupler and electrically coupled to the energy source. When the third valve is in the open condition and, pneumatic air is flowing through the coupler, the pressure from the pneumatic air will cause the pizeo to vibrate and produce a voltage to charge the energy source.

Use of robotic system 100 to piece pick individual product items from containers 110 will now be described. Robot 200 may use its picking arm 206 to grasp one or more order bins 214 and attach the bins to its own vehicle body 202 or the vehicle body of another robot. Alternatively, order bins 214 may be attached to robot 200 by the digging plate or another device on the robot, or external to the robot, or with the assistance of an operator. Robot 200 may then be autonomously positioned on grid 126 and operated under the control of a remote computer 103, which continuously logs the location of each of the robots, containers 110 and products contained within the containers. Remote computer 103 is additionally designed to efficiently control the movement of robots 200 and may employ a series of safety checks to teleoperator instructions and autonomous commands to prevent the robots and robotic systems described herein from colliding with one another as they move about the warehouse.

When one or more orders are received, the computer assigns each of the orders to one or more of the manipulator robots 200 based upon the current order volumes of each of the robots and the locations of the products contained in the order. An order may, for example, be assigned to a single robot. That is, a single robot may be tasked with completing all of the required fulfillment task such as digging each of the target bins 110b from a stack 112 (if necessary) and picking each of the items to complete the order from the target bins. Alternatively, the tasks of a particular order may be split amongst two or more robots. For example, the order may be assigned to a plurality of robots where each robot has a dedicated role (e.g., digging, picking, a combination of multiple fulfillment tasks etc.). Still yet, a plurality of orders may be assigned to a plurality of robots each of which are tasked with completing at least one task pertaining to at least one of the orders. In this regard, a plurality of mobile manipulator robots may work in concert to pick each of the orders. For example, a manipulator robot can batch pick a plurality of orders into a single order bin 214 and then transport the entire order bin (or one or more items from the order bin) to a second manipulator robot tasked with sorting the items into a plurality of orders (of course, if order bin 214 were partitioned, subsequent sorting would not be necessary). Alternatively, each of the robots could be assigned a specific zone or area of the grid and tasked with completing specific order fulfillment tasks only within that particular zone before transporting the items to a central location (on or off the grid) where the items are subsequently sorted into individual orders.

If a product is located beneath one or more non-target bins 110a, robot 200, or a separate digging robot 205 located nearby, may pull target bin 110b to the top of stack 112. For example, digging robot 205 may position itself over a stack 112 containing the target bin 110b. Digging robot 205 may then extend digger 207 underneath the digging robot and between vertical members 116 and stack 112 (on a single or both lateral sides of the stack) to grasp the target bin 110b and each of the non-target bins 110a positioned between the target bin and grid 126. Each of the grasped bins may then be lifted such that the non-target bins are lifted, for example, through the receiving cavity of the digging robot and the target bin is positioned within the receiving cavity. Digging robot 205 may then drive to a location over a separate stack 112 that is missing a single container and release target bin 110b on the top of that stack such that manipulator robot 200 can pick items from the target bin. In releasing target bin 110b, digging robot 205 may release only the target bin (e.g., never release non-target bins 110a) or release the target bin and the non-target bins to stack the non-target bins on top of the target bin such that the bottom most non-target bin is positioned within the receiving cavity of the digging robot and the other non-target containers are stacked above the receiving container of the digging robot, before and again securing all of the non-target bins, driving back to the original stack and depositing the non-target bins in the original stack and in the original order, less the target bin.

With target bin 110b at the top of stack 112, the remote computer 103 then autonomously directs the assigned robot 200 to a first position on grid 126 located above or adjacent to the target bin. Mobility assembly 204 allows robot 200 to navigate rails 122, 124, 125 and move to the desired position on grid 126. Robot 200 may then transition valve 150 to its open condition to receive pneumatic air to pick from target bin 110b.

More specifically, as is shown in FIG. 14A, coupler 222 is positioned within cavity 143 such that the magnet 223 of the coupler engages the magnet 157 surrounding port 146. Insertion of coupler 222 into cavity 143 may be aided by the tapered edges of the coupler and the tapered edges of the cavity. In this manner, if coupler 222 is slightly misaligned with respect to port 146, the tapered edge of the coupler will slide down the tapered edge of the cavity to guide the coupler into proper alignment with the port.

Alignment may also be aided by the magnetic connection between the magnet 223 of coupler 222 and the magnet 157 or ferrous material surrounding port 146. The magnetic connection also aids in securing coupler 222 within cavity 143 and against the upwardly directed force of compressed air that is created as device 224 compresses plug 154 into conduit 144 (away from the upper surface 128 of rails 122, 124, 125) while valve 150 is transitioned to the open configuration, thereby allowing pneumatic air to flow around the plug and into the coupler. In the event that the valve is an electrohydraulic servo valve, the coupler may be similarly engaged with the valve such that the conductive target pads provide power to electrically transition the valve from the closed condition to the open condition. The electrohydraulic valve may alternatively be transitioned by a voltage received from grid 126 upon receiving a signal from robot 200 or remote computer 103.

With fluid supply system 138 coupled to robot 200, the robot may immediately use the compressed air for grasping and/or store the compressed air within air tank 266 for later use. In embodiments in which pneumatic gripping tool 248 relies on a suction force to grasp objects, the one or more Venturi pumps 244 can use the compressed air provided by pneumatic air source S to generate a suction force for operating gripping tool 248.

Upon arrival at a desired grid space 127, the picking arm 206 and pneumatic gripping tool 248 may immediately be positioned in the grasping pose as instructed by the remote computer 103, as explained above with reference to FIG. 9C, or as instructed by a teleoperator.

Figure 15:
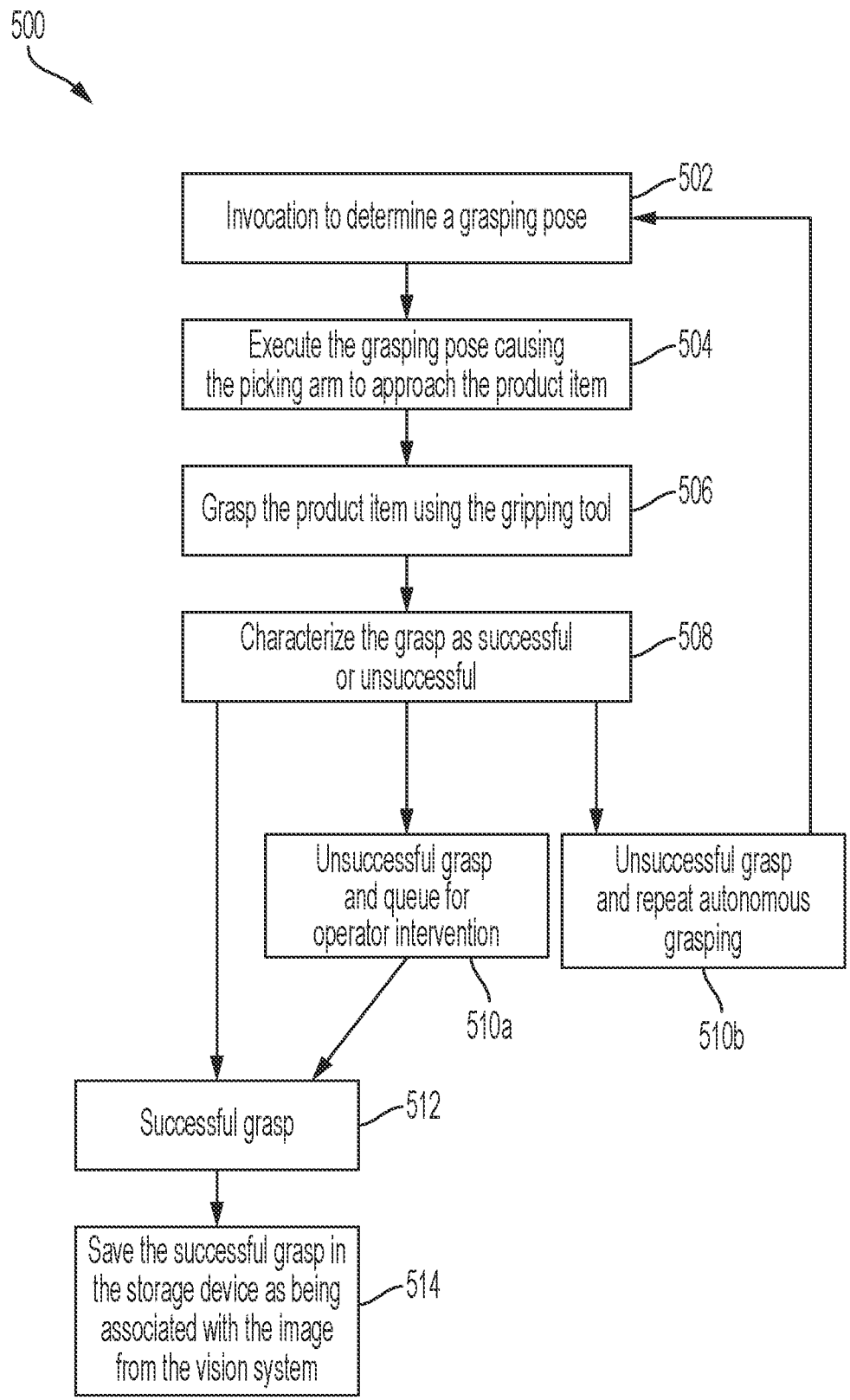
FIG. 15 is a flow chart showing a method of grasping a product item using the picking arm and the pneumatic gripping tool of FIG. 13A.

The method of grasping a product item will now be explained with further reference to FIG. 15 and flowchart 500. If robot 200 has not predetermined the grasping pose before the robot 200 is in the picking position, the method will begin, at 502, with a command from processor 103 that instructs sensors 262 to capture an image of the inventory disposed within a target container 110b. After manipulator robot 200 receives the selected grasping pose signal, the robot executes the signal, at 504, causing picking arm 206 to perform the selected gasping pose. That is, gripping tool 248 approaches the product item, as instructed by processor 103, and contacts grasping region 414 of the product item. After the grasping attempt, one of the sensors such as a pressure sensor (shown in FIG. 13C), characterizes the grasp, at 508, as either successful or unsuccessful. That is, if the picking arm 206 of robot 200 is able to successfully grasp and remove the product item from target container 110b, the pressure sensor will characterize the grasp as successful and transmit a successful grasp signal to processor 103 via communication channels 104. On the other hand, if the picking arm 206 of robot 200 is unable to remove the item from the container, or the picking arm drops the item before the processor 103 instructs robot 200 to release the item, the pressure sensor will characterize the grasp as unsuccessful and transmit an unsuccessful grasp signal to the processor via communication channels 104. Upon characterizing the grasp as unsuccessful, processor 103 can either: (1) immediately signal to teleoperator interface 102, at 510a, and request operator intervention; or (2) attempt to determine a new or modified grasping pose, at 510b, to autonomously pick up the product item based upon the new or modified grasping pose. If processor 103 elects to autonomously determine a grasping pose, the steps described above, with respect to FIG. 9C, may be repeated until either the grasp is characterized as successful, at 512, or until operator intervention is requested at 510a.

Figure 21:
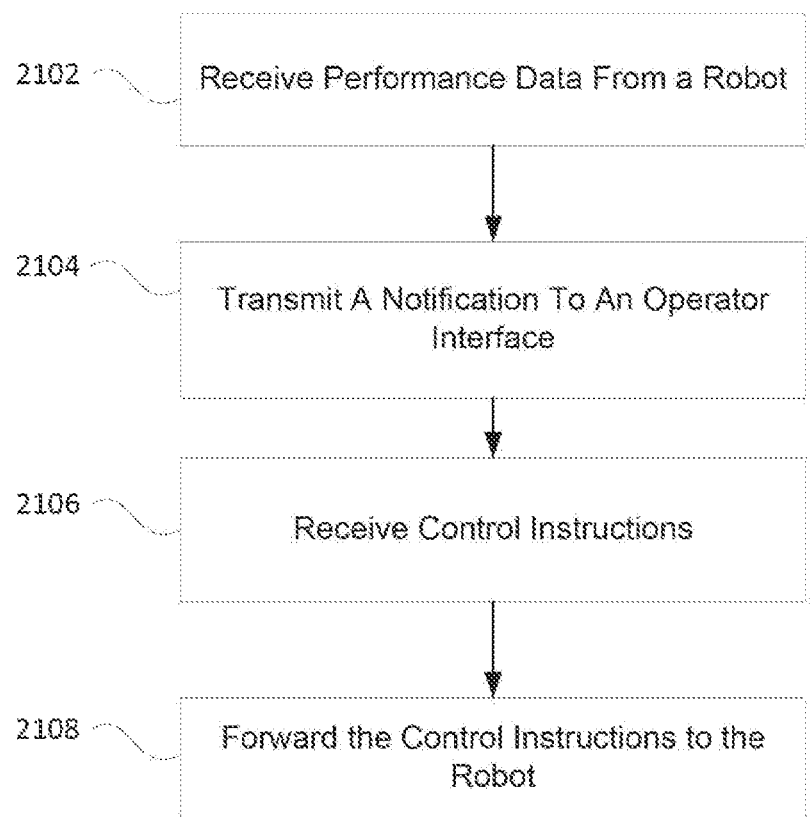
FIG. 21 is a flowchart illustrating an example method of using a computing system to control the operation of the mobile, manipulator robot of FIG. 9A or the mobile, manipulator robot of FIG. 16A.

FIG. 21 is a flowchart 2100 illustrating a high-level overview of an example method for controlling the operation of a mobile piece picking robot, such as piece picking robot 200, by a computing system, such as computing system 103, and an operator interface, such as operator interface 102, when operator intervention is requested at 510a. As shown in block 2102, the computing system 103 receives performance data from a robot. The performance data may include inventory data relating to an inventory item stored in a container within storage structure 114 that the robot is tasked with manipulating or grasping. Performance data may also include an assistance request from a robot indicating that the robot requires assistance in manipulating or otherwise grasping an object or other performance statistics received from the robot, such as grasp success rate, the number of consecutively failed grasps, etc. The computing system 103 then transmits a notification to operator interface 102, as shown in block 2104. The notification may be transmitted in response to receiving the performance data. The notification may correspond to the performance data and include inventory data or other information regarding the inventory item the robot is tasked with manipulating or grasping. The computing system receives control instructions, as shown in block 2106. The control instructions are received from the operator interface and may include at least one of a partial pose for a gripping element of the robot, an identified manipulation or grasping region on the inventory item, or a selection of a gripping element to be used by the robot for manipulating and/or grasping the inventory item. The computing system then forwards the control instructions to the robot for execution to manipulate or grasp the inventory item, as shown in block 2108.

Figure 22:
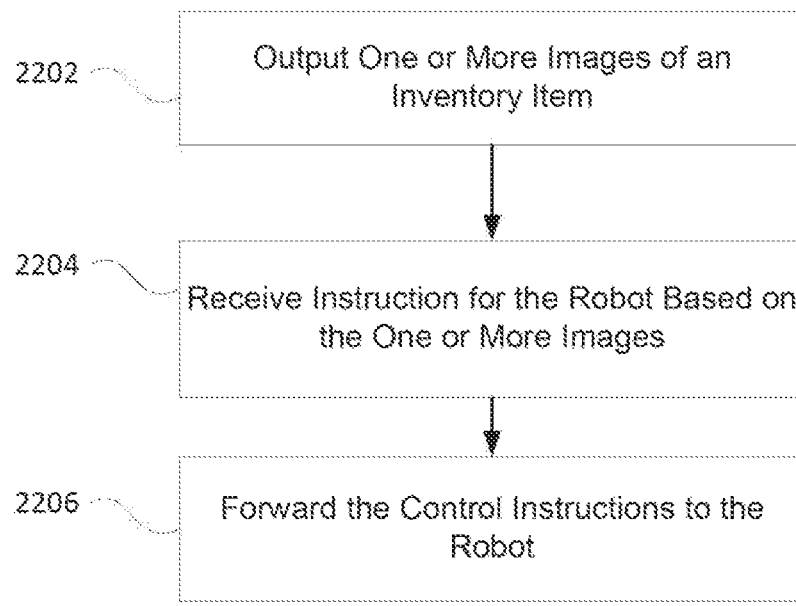
FIG. 22 is a flowchart illustrating an example method of using an operating interface to control the operation of the mobile, manipulator robot of FIG. 9A or the mobile, manipulator robot of FIG. 16A.

FIG. 22 is a flowchart 2200 illustrating a high-level overview of an example method for controlling the operation of a mobile piece picking robot, such as piece picking robot 200, by a system, such as operator system 102. As shown in block 2202, the system outputs one or more images of an inventory item. The system receives control instructions for the robot based on the one or more images, as shown in block 2104. The system then forwards the control instructions to the manipulator robot, as shown in block 2106.

At a more detailed level, when processor 103 signals for intervention, the signal may be sent directly or indirectly to operator interface 102. In situations in which operator interface 102 is communicatively coupled to a plurality of manipulator robots 200, each of the robots may be indirectly coupled to operator interface 102 via a "broker". The broker may be part of processor 103, or a separate processor, tasked with ordering the help requests from each robot within a queue of the operator interface. The broker may run an algorithm to determine a "needs help score" to determine the priority of the queue or the broker may connect a teleoperator directly to a particular robot based on the "needs help score" generated by the robot. The algorithm may be based on several factors including the number of prior grasp failures, elapsed time from start of task, the level of task difficulty, the level of precision needed, the product/SKU to be manipulated, the task to be performed (e.g., picking, packing, auditing inventory, or correcting other errors) and the like.

Once the help request signal has been received by operator interface 102, an operator can remotely pilot the picking arm 206 of robot 200 and direct the picking arm to execute a specified grasping pose to grasp the product item. Specifically, the operator can view the items on the output device (e.g., the display) of operator interface 102 and directly control the picking arm 206 of robot 200 to grasp the grasping region 414 of the item by manipulating the input device of the operator interface. In some instances, the operator may also prompt picking arm 206 to grasp a product item in combination with an automated motion sequence calculated by a motion planner. In this manner, the operator may simply select a pixel on the image feed representative of the grasping region 414 while processor 103 autonomously determines and instructs robot 200 to execute a selected grasping pose as described above with reference to FIG. 9C.

The pressure sensors or other sensors can then characterize the grasp as either successful or unsuccessful as described above at 508. The operator can additionally, or alternatively, make the same characterization. If the sensor (or the operator) characterizes the grasp as successful, the grasping data (e.g., grasping pose, grasping region, gripping tool, inventory data, other sensor or robot information, etc.) used to grasp the product item may be saved within storage device 105, at 514, for future use. Robot 200 can thus learn to infer or predict new grasping poses to improve automation of the grasping process.

There is not a single gripping tool that can optimally handle a large variety of inventory. For this reason, robot 200 may autonomously decide, or be instructed from the teleoperator, to switch gripping tools. Gripping tool 248 may be selected based upon the type of task or the product type (which may be determined by the remote computer through inventory tracking of the product types in each bin), analysis of the image data and/or as a result of historical data relating to successful picks of that product or similar constructed products. More specifically, the remote computer 103, or an operator, may instruct manipulator robot 200 to couple a particular gripping tool 248 to picking arm 206 that can engage the grasping region 414 of the item with minimal leakage between the gripping tool and the surface of the item.

With reference to FIGS. 9F and 13A, if robot 200 or the teleoperator determines that it is desirable to switch gripping tools 248, the robot will move picking arm 206 to position the groove 249 and/or the sidewall 251 of the gripping tool attached to the picking arm within one of the retainers 260 of tool holder 258. Subsequently, the picking arm 206 may be retracted or moved upward to decouple the magnet 246 of the picking arm from the magnet 254 of gripping tool 248. The picking arm 206 may then be positioned over another one of the gripping tools, positioned within tool holder 258, to magnetically couple the picking arm to the other one of the gripping tools before moving the picking arm laterally to slide the coupled gripping tool out of its respective retainers 260. It will be appreciated, however, that other mechanical mechanisms for swapping gripping tools such as a push-pull connection or a twist-locked connection may also be utilized and the picking arm 206 of robot 200 may be manipulated in any manner that facilitates disconnection of a first gipping tool within the tool holder 258 and the connection of a second gripping tool within the tool holder.

As gripping tool 248 is brought into contact with the product item, the lip 252 of the gripping tool deforms and conforms to the surface of the product as a suction force is applied to grasp the product. Additionally, the compliance in gripping tool 248 and/or picking arm 206 will compensate for inaccuracies of the sensing system or grasping algorithm to position the gripping tool in a better grasping pose upon contact with the product. With the product grasped, picking arm 206 may then lift the target product from container 110 and optionally position or wave/rotate the product in front of scanners 264 to scan an identifier such as a barcode or RFID located on the target product for the purpose of confirming that the correct product has been grasped and/or to inform the picking arm as to which order bin 214 the product should be released. During this time, one of the sensors may additionally collect data relating to the size and dimension of the product and transmit this information through communication channels 104 to remote computer 103.

In some instances, remote computer 103 may then autonomously instruct, or the teleoperator may manually instruct, picking arm 206 to release or place the grasped item in a particular location and/or orientation within order bin 214. Gripping tool 248 and/or other elements of the gripping tool may then be used to push, blow on, or otherwise manipulate the product to a particular location or orientation within bin 214. In this manner, subsequently picked items may be efficiently packed within order bin 214 such that smaller order bins may be utilized. This increases the overall amount of order bins that may be transported by a single robot and, in turn, increases the throughput of the system. While this disclosure has primarily described the processor (whether remote or onboard) as configured to implicitly or explicitly analyze images and execute machine learning algorithms and policies for the purpose of predicting grasping poses, determining grasping regions or desired gipping elements/tools, it will be appreciated that the processors are additionally configured to implicitly or explicitly analyze images of order containers 214 to determine packing poses, desired packing regions within the order bins, or desired packing tools that facilitate dense packing. Similar algorithms and analysis can be used to assist in the performance of other manipulation tasks. Finally, these images and/or teleoperator commands in response to the images may be saved within storage device 105 as being associated with a particular manipulation task for future use. Robot 200 can thus learn to infer or predict how to perform manipulation tasks (e.g., grasping or packing).

After robot 200 has sequentially picked up each of the products corresponding to a particular order, order bins 214 may be transported out of storage structure 114, for example, via shafts 121 and the associated conveyor belts, for additional processing, sorting, packaging and/or shipping. If robot 200 is tasked with picking multiple consumers orders at once, robot 200 need not pick all of the products pertaining to the first consumers order before beginning to pick the second consumer's orders. In fact, the remote computer will direct robot 200 to pick items based upon the storage locations of the products irrespective of the consumer who ordered the product and in an order that will facilitate dense packing of the items.

Figure 16A:
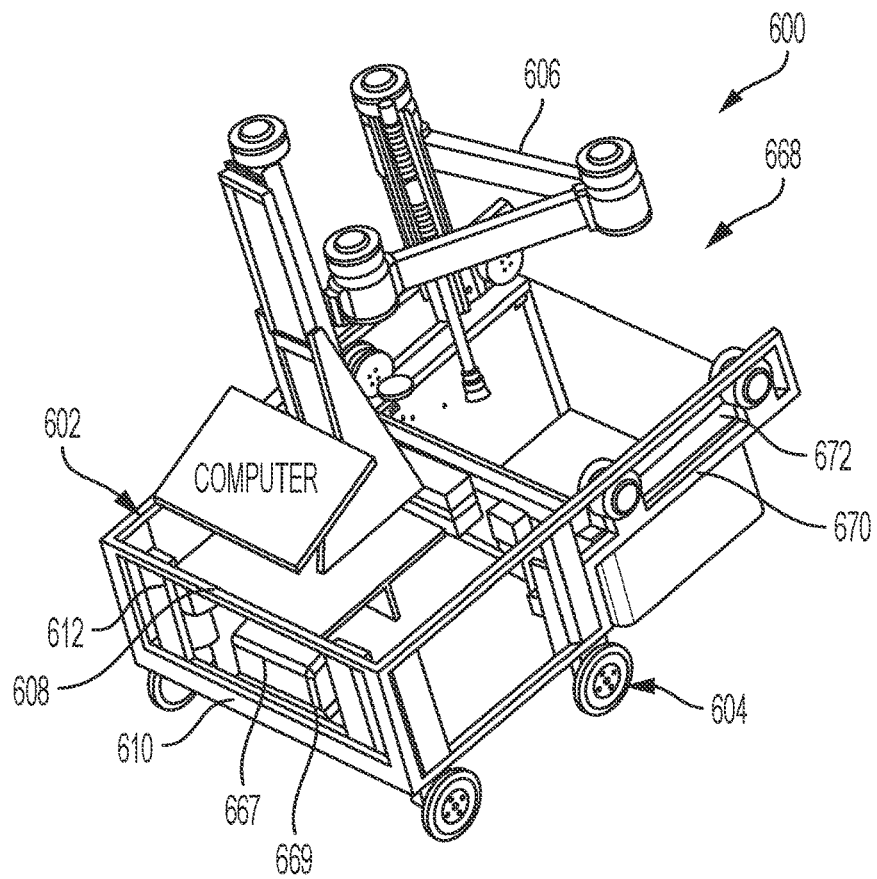
FIG. 16A is a schematic perspective view of a mobile, manipulator robot including a container retrieval device having a hoist plate according to another embodiment of the present disclosure.

FIG. 16A shows a mobile, manipulator robot 600 (sometimes referred to hereinafter as "manipulator robot" or "robot") according to another embodiment of the present disclosure. Manipulator robot 600 may include any of the features described above in connection with robot 200 and any of the additional features described below. Common features between manipulator robot 200 and manipulator robot 600 are not described again in detail hereinafter. Instead, when such features are discussed in connection with manipulator robot 600, the features are merely referenced with a corresponding 600 series numeral. For example, manipulator robot 600 includes a mobility assembly 604 and a picking arm 606 which may respectively be configured as described above with respect to mobility assembly 202 and a picking arm 206 in connection with manipulator robot 200.

Manipulator robot 600 includes a vehicle body 602 which may be formed of four sidewalls 608. The vehicle body 602 of manipulator robot 600 may have an open or closed bottom end 610 and an open or closed top end 612. The sidewalls 608 are preferably sized such that vehicle body 602 has a footprint of a single grid space 127. In other words, when robot 600 is positioned on the horizontal grid 126, two opposing sidewalls are positioned over two adjacent rails 122 extending in the X-direction, while the other two opposing sidewalls are positioned over two adjacent rails 124 extending in the Y-direction. In other embodiments, the vehicle body 602 of robot 600 may have a footprint that is larger than a single grid space 127. For example, the vehicle body 602 of robot 600 may have a footprint equal to 1×2 grid spaces, 2×2 grid spaces 3×3 grid spaces. Hardware and other components may be stored within a cavity of the vehicle body. For example, the cavity of vehicle body 602 may house a small air tank and/or a relatively small battery 667 or super/ultra-capacitor and/or a heating element.

Picking arm 606 of robot 600 may be configured to engage and disengage battery 667 to a conductive contact 669. In this regard, when battery 667 is low, picking arm 606 can disconnect the battery from conductive contact 669 and place the battery on a charging station (not shown). Picking arm 606 can then grab a charged battery from the charging station (not shown) and place the charged battery into contact with conductive contact 669 to transfer power from the charged battery or super/ultra-capacitor to the robots various drive mechanisms. Battery packs may also be "swapped" or exchanged without using picking arm 606. For example, battery packs may be swapped by moving robot 200 in a first direction to bring the battery into a secured engagement with a "battery swap port" (not shown) and manipulating the robot relative to the battery swap port in a manner that disengages the battery from the conductive contact and allows the robot to drive away from the battery swap port without the battery. In one example, after battery 667 has been engaged with the battery swap port, the plunger of the prop mechanism may be extended which, in turn, lifts the body of the robot and causes the battery to disengage its conductive contact 669. Alternatively, a battery swap mechanism onboard or external to the robot may be used to swap battery packs.

Figure 25:
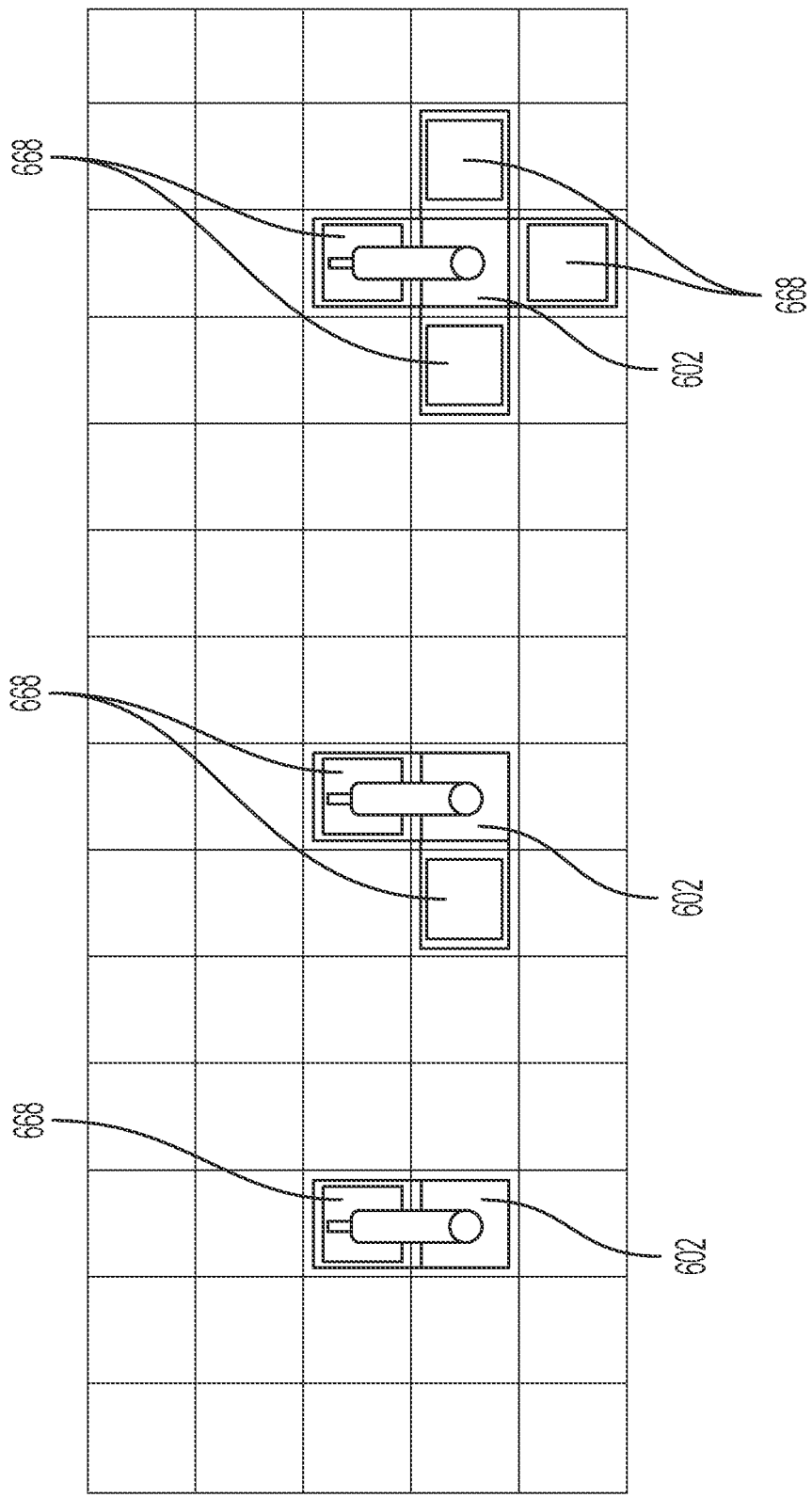
FIG. 25 is a schematic top elevation view of a plurality of the mobile, manipulator robots of FIG. 16A including one or more container retrieval devices.

One or more container retrieval devices 668 may be permanently affixed or detachably coupleable to vehicle body 602. In other words, manipulator robot 600 may autonomously add or remove container retrieval devices as desired and may carry zero to four container retrieval devices at any one time (as shown in FIG. 25). In this regard, when manipulator robot 600 includes multiple container retrieval devices, the container retrieval devices can be used to simultaneously carry multiple order bins, simultaneously perform multiple digging operations (e.g., including replacing earlier extracted containers back into the stacks) and/or perform a combination of the foregoing.

Figure 16B:
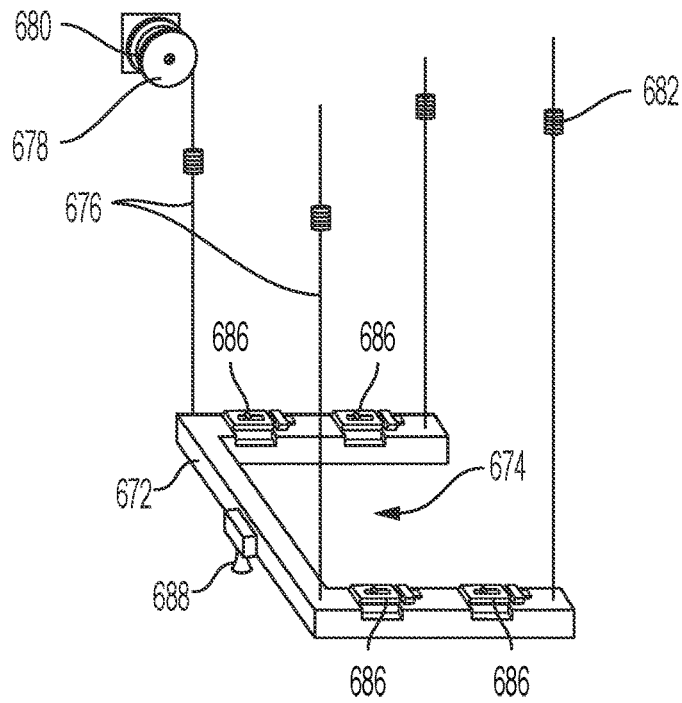
FIG. 16B is a schematic perspective view of the hoist plate of FIG. 16A.

Container retrieval device 668 includes a pair of opposing support arms 670 affixed to or coupleable to vehicle body 602 and a hoist plate 672 designed to engage and secure containers 110. With additional reference to FIG. 16B, hoist plate 672 has an open lateral side and defines an aperture 674 extending through its upper and lower surfaces such that picking arm 606 can access the interior of a container secured by the hoist plate. Aperture 674 is preferably slightly larger than the outer perimeter of containers 110 to allow hoist plate 672 to slide about a stack 112 of containers 110. In this regard, as hoist plate 672 is lowered along a stack 112 of containers 110, the stack of containers will automatically align the hoist plate relative to the containers in a lateral direction.

Hoist plate 672 may be coupled to and suspended from support arms 670 by cables 676 which are connected to a winding mechanism 678 such as a spool, hoist, or winch of container retrieval device 668. The cables 676 can be wound and unwound or spooled into or out from support arms 670 to adjust the hoist plate 672 with respect to the support arms in the z-direction. An encoder 680 may be coupled to the spool or winding mechanism to measure the distance hoist plate 672 moves in the z-direction. The spool or winding mechanism may also include a torque sensor 682 to measure the weight of a container 110 supported by hoist plate 672 or to detect when a container 110 is in contact with stack 112. Alternatively, cables 676 or support arms 670 may include load cells, force sensors, strain gauges, or other sensor configured to detect the weight of a container. As a result, inventory audits can be performed autonomously while a container is being lifted or held by hoist plate 672 to determine or confirm the number of product items that have been removed from the container or to ascertain when the container is running low on particular product types and needs to be replenished. Similarly, the sensors may be used to ensure that the manipulator robot 600 does not attempt to lift one or more containers with a total load greater than it can handle.

Hoist plate 672 is adapted to engage with the top and/or one or more sides of container 110 to grip the container. For example, hoist plate 672 may include sliding or pivotable hooks 686 that are engageable with the rim of containers 110 and/or engagement features 689 such as apertures (shown in FIG. 24) formed in the rim or sides of the containers. The hooks are driven into engagement with a container 110 by a suitable drive mechanism housed within plate 672, which may be powered and controlled by signals carried through cables 676, through a separate control cable (not shown), or wirelessly. In one example, cables 676 may be made from conductive metal strips to transfer power and electrical signals between the hoist plate 672 and the support arms 670.

Container retrieval device 668 may further include a sensor 688 such as a camera, depth imager, or similar device to align the hoist plate to the top of container 110. The sensor can use markers such as AR tags or barcodes on containers 110, or otherwise use features of the container itself, to facilitate proper alignment. Sensor 688 is preferably located on the hoist plate 672 but may also be located on support arms 670. In addition to facilitating alignment, the camera can continuously capture images of adjacent grid spaces and, in turn, inventory stored inside of adjacent storage containers as manipulator robot 600 traverses grid 126. These images may then be transmitted via network 104 to remote processor 103 to assist in inventory auditing or to predict grasping poses for one of the manipulator robots before that robot reaches target container 110b to increase throughput of the system. Moreover, sensor 688 may be used to continuously track the items within an order bin 214 supported by the hoist plate 672. In this manner, when inventory items pertaining to multiple orders are contained within a single un-partitioned order bin 214, the items can continuously be tracked so that the processor knows which item is associated with which order so that the items can be later sorted into individual orders without having to scan each of the product items.

In embodiments in which the container retrieval device 668 is detachably coupleable to the vehicle body 602 of manipulator robot 600, the manipulator robot can autonomously swap (upon receiving control instructions from processor 103 or operator interface 102) one container retrieval device having a first hoist plate for another container retrieval device having a differently configured hoist plate. Each container retrieval device may have its own set of motors, actuators, sensors, processors, circuits, batteries and power systems and can mate with the vehicle body 602 of robot 600 using an electromechanical interface configured to transmit mechanical loads and electrical communications. For example, container retrieval device 668 with hoist plate 672, shown in FIGS. 16A and 16B, may be swapped for container retrieval device 690 with hoist plate 692, shown in FIG. 16C, or container retrieval device 694 with hoist plate 696, shown in FIGS. 16D and 16E. Hoist plate 692 includes an array of suction cups (instead of the hooks 686 of hoist plate 672), each of which may be formed similar to the suction cup illustrated and described with reference to FIG. 13C, to engage and lift boxes, cartons and the like.

Hoist plate 696 may be similar to hoist plate 668 and may further include one or more suctions cups attached to the plate by an extendable and retractable arm 698. The arm 698 may also be laterally moveable about the hoist plate in the X and Y directions. It will be appreciated that hoist plate 696 may be lowered and arm 698 may be extended (shown in FIG. 16D) to freely position the suction cup with multiple degrees of freedom within a target container 110b located at any depth within storage structure 114 to grasp and pick individual items from the target container so long as there is not a non-target container 110a positioned on top of the target container. The arm 698 may be retracted as shown in FIG. 16E (e.g., upwards in the z-direction) so as to not interfere with hoist plate 696 engaging a container 110.

Figure 16F:
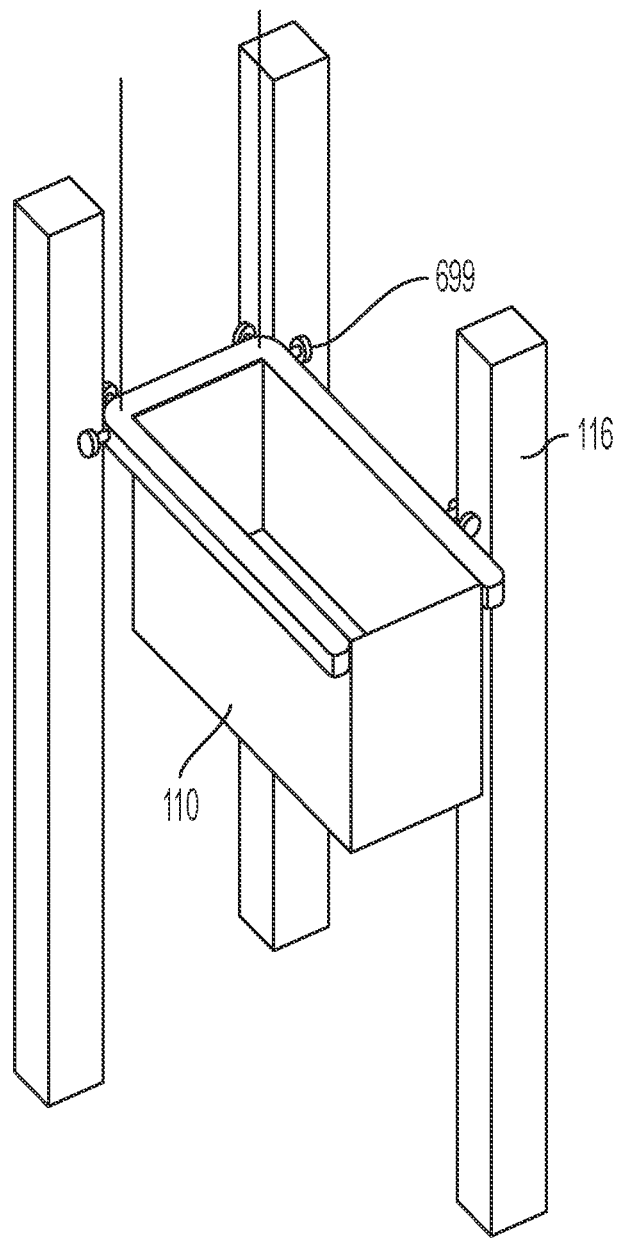
FIG. 16F is a schematic perspective view of a hoist plate including a plurality of rollers.

Referring to FIG. 16F, any of the above described hoist plates, may include one or more rollers 699 designed to contact and roll against storage structure 114 and/or containers 110 to laterally stabilize and prevent the hoist plate (and a container attached thereto) from tilting as the hoist plate is lowered into or raised from the storage structure. As shown in FIG. 16F, one or more rollers 699 may be placed at, or adjacent to, one or more corners of the hoist plate. Each of the rollers 699 are thus positioned to roll along vertical members 116 to stabilize the hoist plate as the hoist plate is lowered around a stack 112 and to prevent the hoist plate from laterally swaying and/or tilting while extracting one or more containers from the stack. Rollers 699 can alternatively be provided between adjacent corners and arranged in an outward facing or inward facing direction. For example, each of the outwardly facing rollers 699 are arranged to roll against a stack 112 of containers 110 adjacent to the stack of containers in which target container 110b is disposed. On the other hand, inwardly facing rollers are arranged to roll along the stack 112 of containers 110 in which the target container 110b is stacked. Regardless of whether rollers 699 are arranged in an outwardly facing direction or an inwardly facing direction, the rollers are designed to engage the vertical members 116 of storage 114 and/or a stack 112 containers 110 as the hoist plate travels in a vertical direction and to prevent the hoist plate from tilting while extracting one or more container (which may otherwise be susceptible to tilting due, in part, to the unbalanced weight of the inventory items contained therein).

Any of the above described hoist plates may be outfitted with additional sensors (e.g., a temperature sensor, a thermal camera, humidity sensor and like) to monitor the storage conditions within the various sections of storage structure 114 to verify that the sections are being regulated appropriately based upon the product types being stored in that section.

The vehicle body 602 of manipulator robot 600 may contain a payload management system designed to transfer the payload from one or more of the container retrieval devices to the chassis of the vehicle body. The payload management system may rely on one or more actuators which may be non-backdriveable or that utilizes mechanical brakes to allow the actuator to be unpowered while holding and transporting bins. Alternatively, a separate non-backdriveable container engagement mechanism on the body of the robot may be used to engage with a container while the container is held by the hoist mechanism.

Figure 16G:
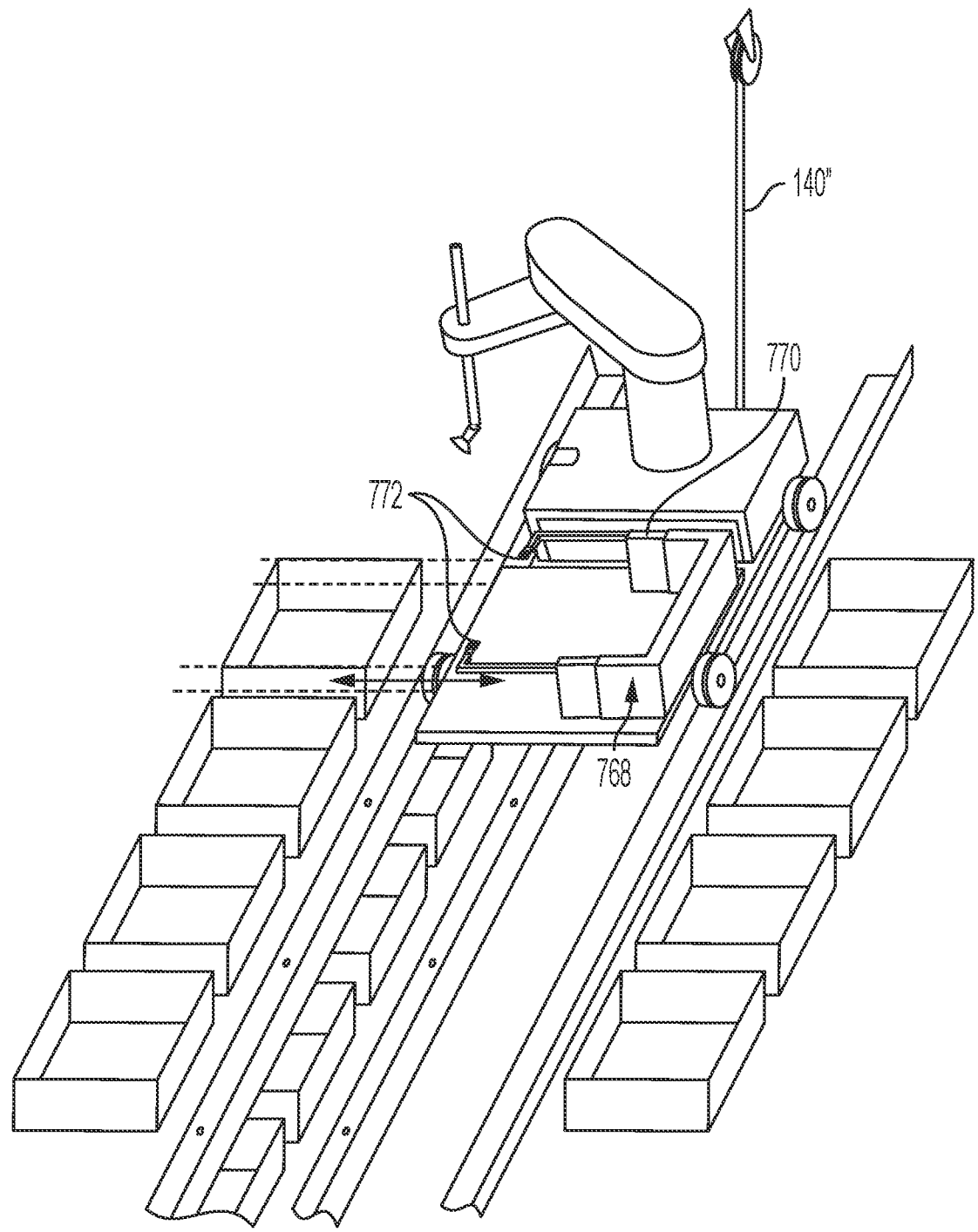
FIG. 16G is a schematic perspective view of two storage structures arranged in a side by side relationship and depicting a mobile, manipulator robot traversing the lateral sides of the storage structures.

Container retrieval device 668, or any of the other container retrieval devices mentioned herein, may also be swapped for a container retrieval device 768 including a pair of opposing arms 770 designed to directly engage and a secure a container 110 (shown in FIG. 16G). Of course, container retrieval device 768 may alternatively be permanently affixed to the manipulator robot. Each arm 770 may be extendable away from the vehicle body in a lateral direction and include a hook or latch 772 a distal end of the arm which may be rotatable or pivotable such that the hooks surround and engage target container 110b. In this manner, arms 770 are designed to extend and retract in a horizontal direction to directly engage a container 110 and pull the target container off of a shelf located within the warehouse (e.g., on a lateral side of storage structure 114 or any another shelf located within the warehouse) so long as the container is located laterally adjacent to the body of the robot as shown in FIG. 16G.

Use of manipulator robot 600 will now be described only with reference to container retrieval device 668 as manipulator robot 600 is otherwise operated as previously described above with respect to robot 200. To retrieve a target container 110b from a stack 112, manipulator robot 600 is moved about grid 126 to position container retrieval device 668 over the stack containing the target container 110b. The hoist plate 672 may then be lowered by un-spooling cables 676 such that each non-target container 110a (if any) passes through aperture 674 until the hoist plate is located adjacent to a non-target container located exactly one level above the target container 110b. With hoist plate 672 at the appropriate height, hooks 686 may then be slid towards the non-target container located exactly one level above the target container 110b to engage with the engagement features 689 or other features of that non-target container and to secure the container to the hoist plate.

Each of the non-target containers 110a located on top of the target container 110b may then be lifted by hoist plate 672 by spooling cables upwards until the bottom most non-target container (the container secured to the hoist plate) is located between support arms 670. Manipulator robot 600 may then be driven to a location over any other stack and can release each of the non-target bins that it is carrying. Because hoist plate 672 is three sided (e.g., has an open side), manipulator robot 600 will be able to release all of the non-target containers 110a that the robot is carrying and move away the released non-target containers even if one or more of the containers is located above grid 126. This would not be possible if hoist plate 672 was fully enclosed. It will be appreciated that any of the hoist plates or digging apparatuses described herein may have an open side similar to hoist plate 672. After manipulator robot 600 has released the stack of non-target container 110a, the manipulator robot (or another robot) may retrieve target container 110b from the stack. Manipulator robot 600 may pick items directly from the target container 110b into an order bin secured by another container retrieval devices 668 held by the robot or alternatively place the target bin 110b on the top of another stack before it picks from the target bin and places the grasped item in an order bin that the robot is carrying or that is otherwise nearby.

Alternatively, manipulator robot 600 can extract the target bin 110b and each of the non-target bins 110a in a single lift. A single lift extraction may be accomplished by lowering hoist plate 672 around each of the non-target bins, securing the latches 686 of the hoist plate to the target bin and lifting the hoist plate until the target bin is held between support arms 670 (e.g., within a container receiving cavity of container retrieval device 668) and the non-target bins are positioned above the container retrieval device. Manipulator robot 600 may then position its container retrieval device 668 over another stack of containers missing exactly one container before lowering and releasing all of the containers such that the target container 110b is positioned just beneath grid 126 (e.g., at the uppermost level where it can be picked from) and each of the non-target containers are positioned on top of the target container and stacked above the grid. The hoist plate 672 may then grab each of the overlying non-target containers 110a and move the non-target containers to any other stack, which again need not be a stack missing containers in an amount equal to or greater than the amount of non-target containers secured by manipulator robot 600. In other words, manipulator robot 600 can optionally release each of the non-target containers simultaneously, even if one or more of the containers will be positioned above the grid, because the open side of hoist plate 672 will allow manipulator robot 600 to drive away from the non-target containers 110a after they have been released to perform other tasks.

Figure 24:
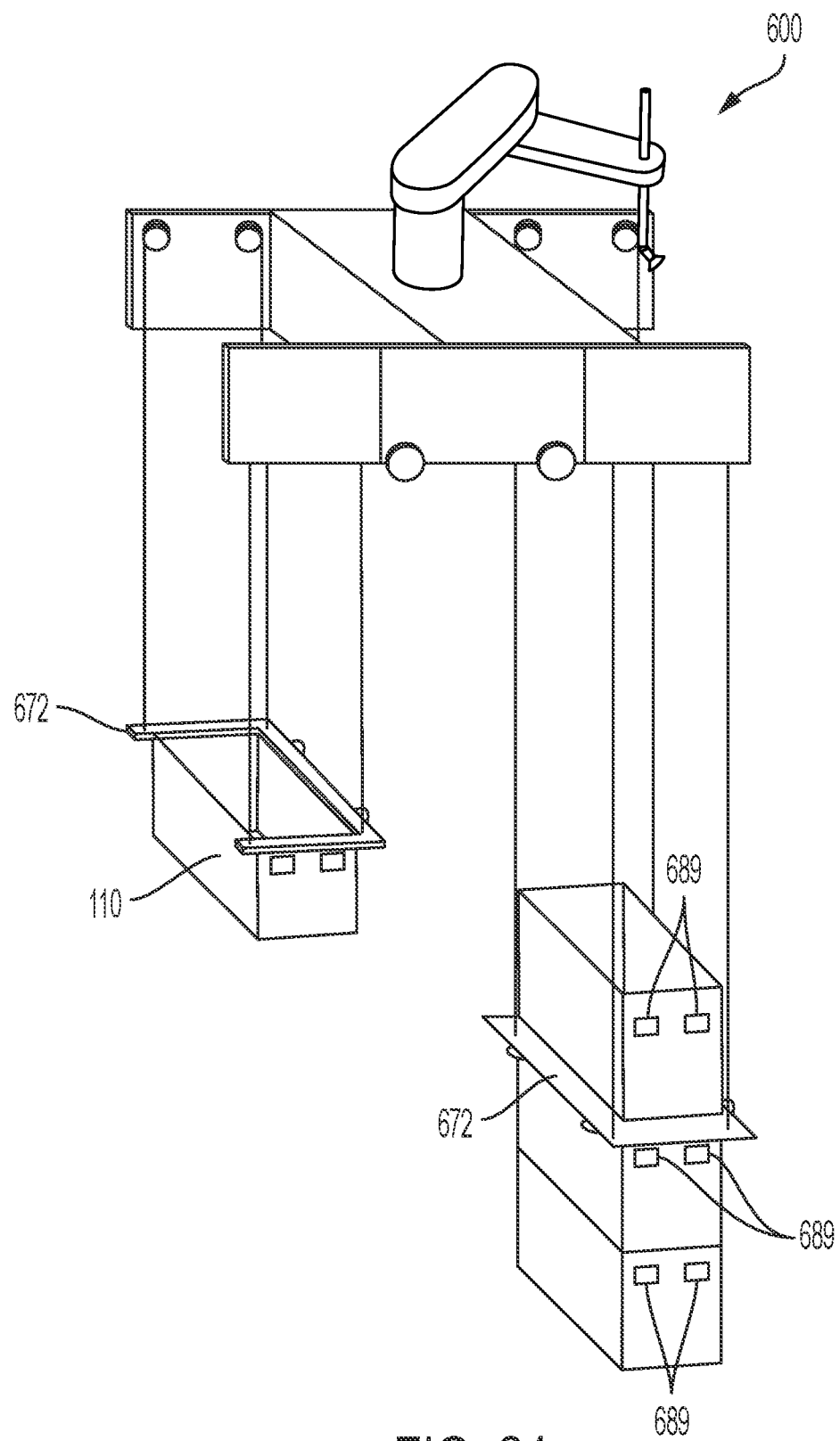
FIG. 24 is a schematic perspective view of the mobile, manipulator robot of FIG. 16A performing a digging operation.

When manipulator robot 600 has more than one container retrieval device 668, the container retrieval devices may independently or simultaneously perform a digging operation (as shown in FIG. 24). For example, when manipulator robot 600 is outfitted with three (or more) container retrieval devices 668, the robot can secure an order bin to a first one of the container retrieval devices and drive to a stack 112 containing a target container 110b. Robot 600 may then position a second one of the container retrieval devices over the stack 112 and extract all of the non-target containers 110a located on top of the target container 110b in a single lift. While holding the order bin with the first container retrieval device and each of the non-target container 110a with the second container retrieval device, robot 600 may then be repositioned to align a third one of the container retrieval devices above stack 112. The third container retrieval device may then be used to extract the target container 110b. With target container 110b secured to the third container retrieval device above grid 126, robot 600 may use its picking arm to pick items from the target container and place them into the order container. After the desired items have been picked, robot 600 may replace the target container 110b in the original stack and then replace the non-target containers 110a on top of the target container in their original order (or in another order for more ideal slotting). The robot may then drive to another stack and repeat the above-described process. In this regard, a single robot can dig all of the non-target containers 110a, the target container 110b, and pick items from the target container and place them into an order container without driving around the storage structure to find another stack that can accommodate the temporary placement of the containers. This significantly improves the throughput of the system.

Figure 17:
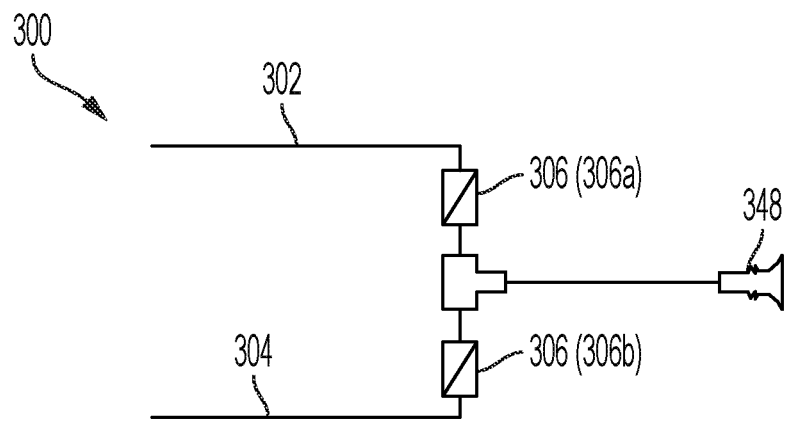
FIG. 17 is a schematic illustration of an alternative pneumatic system for use with the mobile, manipulator robot of FIG. 9A or the mobile, manipulator robot of FIG. 16A.
Figure 18:
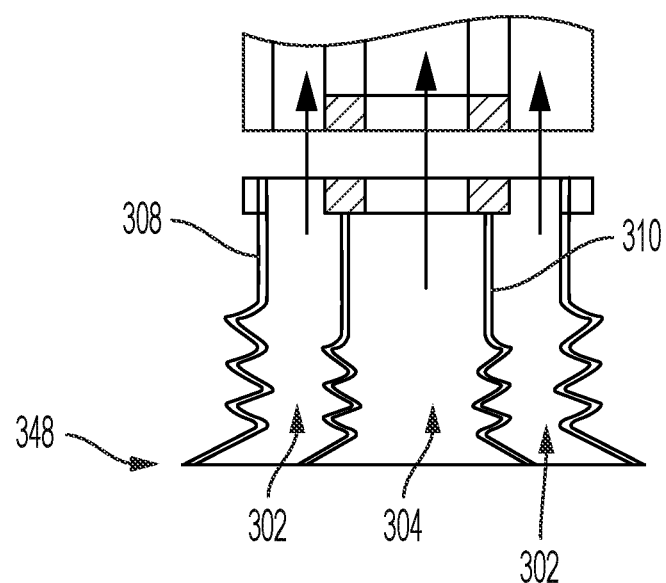
FIG. 18 is a cross-section view of a modified gripping tool for use with the alternative pneumatic system of FIG. 17.

In a variant aspect, a manipulator robot may include any and all of the features of manipulator robot 200 and manipulator 600 but for the particulars of its pneumatic system as discussed below. The pneumatic system 300 of the variant robot is schematically illustrated in FIG. 17. In this variant, the robot does not rely on pneumatic air from the storage structure, instead the robot may have a modified pneumatic system coupled to the vehicle body of the robot. The pneumatic system may include a single or two-tiered vacuum having a first vacuum 302 and a second vacuum 304 in selective communication with a gripping tool such as a single suction cup or a modified gripping tool 348 (FIG. 18). First vacuum 302 may be a vacuum with high flow rate (capable of displacing large volumes of air per minute) while second vacuum 304 may be a strong vacuum generator capable of producing a larger pressure differential with atmospheric pressure (which increases the payload or force that can be held by the suction cup). Pneumatic system 300 further includes two valves 306a, 306b (collectively "valves 306"), for example, servo-valves that may be toggled between an open condition and a closed condition for controlling communication between the first and second vacuums and gripping tool 248 or modified gripping tool 348.

As shown in FIG. 18, modified gripping tool 348 includes a first suction cup 308 and a second suction cup 310, which may be concentrically positioned within the first suction cup. The first suction cup 308 and the second suction cup 310 are otherwise formed generally as previously described with respect to the suction cup of gripping tool 248, and therefore, are not again described in detail. The only difference being that that modified gripping tool 348 is a dual suction cup as opposed to the single suction cup of gripping tool 248. First vacuum 302, or the high flow rate vacuum, may be in selective communication with first suction cup 308, while second vacuum 304, or the high pressure vacuum, may be in selective communication with second suction cup 310. It is emphasized that the any of the battery swap mechanisms described with respect to manipulator robot 200 and manipulator robot 600 may be incorporated in the variant robot with pneumatic system 300 because even the above-described single or two-tiered vacuum systems (or an onboard compressor system) will utilize significantly more battery than manipulator robot 200 or manipulator robot 600 which access a pneumatic supply from an external source.

Use of the pneumatic system 300 will now be described only with reference to the grasping task as the variant robot is otherwise operated as previously described above with respect to robot 200 and/or robot 600. Before grasping a product, valve 306a may be transitioned to its open position, providing the first suction cup 308 with a high flow rate vacuum suction force as the lip of the first suction cup deforms to correspondingly match the surface of the target product. After an initial seal has been initiated, the high pressure vacuum line of vacuum 304 is enabled by transitioning valve 306b to the open condition. The high pressure suction force enables the picking arm to support larger payloads than would otherwise be possible with the high flow rate vacuum alone. In this manner, a firmer grasp may be provided. Of course, valves 306a and 306b could both be set to their open positions during initial grasping of the target product and until the robot desires to release the target product. Alternatively, valves 306a and 306b could be toggled back and forth and between open, closed and partially closed conditions in order to achieve a desired grasp of the target product.

By utilizing two relatively small vacuum sources, a high flow rate vacuum and a high pressure vacuum, to respectively create an initial seal and to firmly grasp products, the physical size of the vacuums may be reduced such that the vehicle body of the robot need not be as dramatically modified. In this manner, the variant robot may be used to piece pick products stored within storage structure 114 or within frame structure 14 discussed with respect to the prior art.

Figure 19:
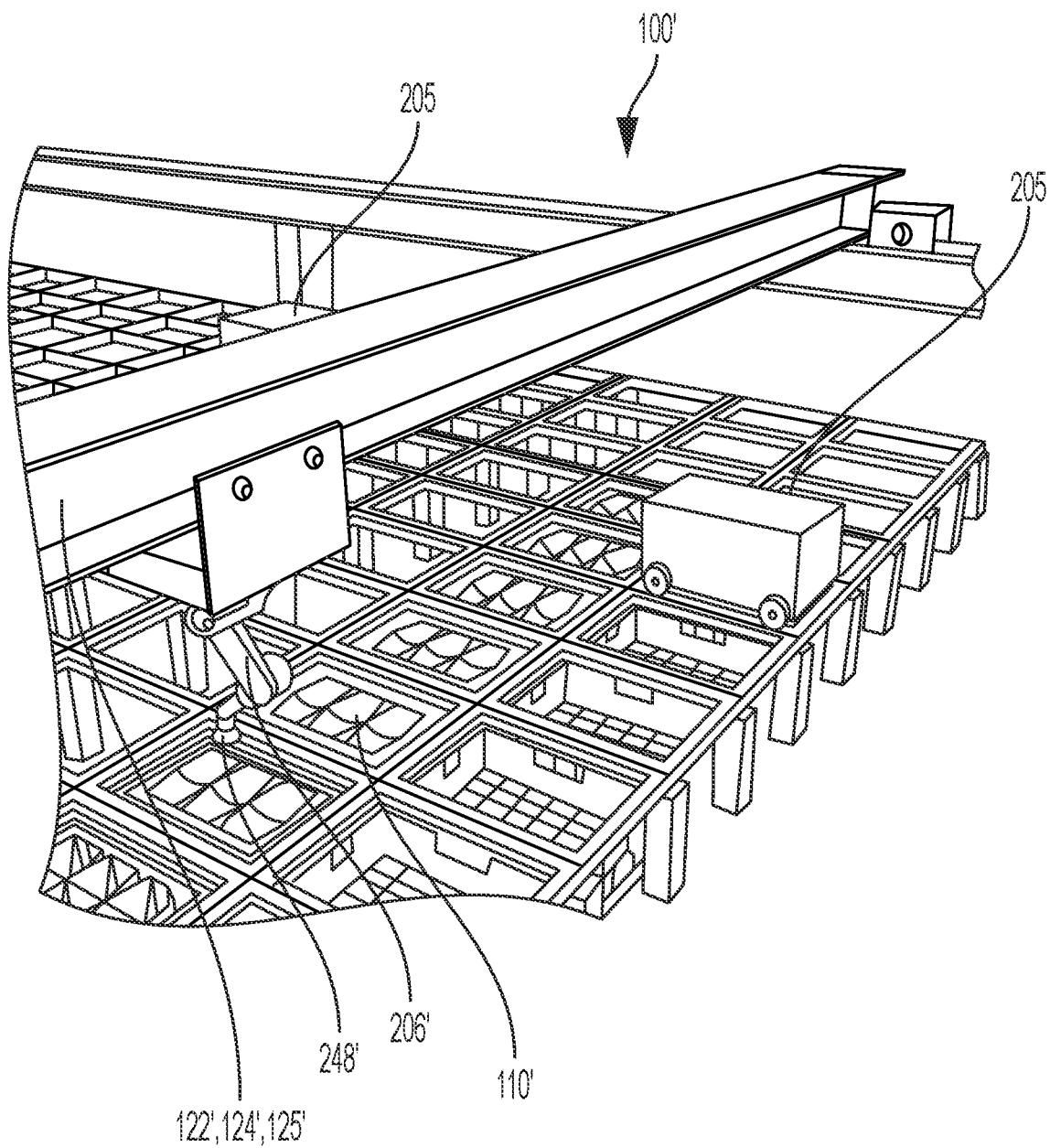
FIG. 19 is a partial perspective view of a modified storage structure including a gantry frame supporting a robotic picking arm equipped with a pneumatic gripping tool.

FIG. 19 is a perspective view of a modified robotic system 100' configured to efficiently store a plurality of stacked containers 110'. Modified robotic system 100' includes all of the above described features of system 100 and the additional features described hereinafter. For example, additional rails 122', 124', 125' may extend above the grid 126 (supporting manipulator robot 200, manipulator robot 600 and/or digging robot 205) and alone, or in combination with additional support members, form a gantry frame that supports one or more robotic picking arms 206' equipped with a pneumatic gripping tools 248' in a manner that permits the picking arm 206' to move about the gantry frame and piece pick inventory from containers 110'. In this manner, compressed air may flow through rails 122', 124', 125', and/or the additional rails, to the pneumatic gripping tool 248' of picking arm 206' for grasping products from containers 110'. Rails 122', 124', 125', or the additional support members positioned above the grid, may also include one or more valves similar to valve 150, such that the valves are accessible to manipulator robot 200 or manipulator robot 600 (positioned on the grid) to allow manipulator robot or manipulator robot 600 to selectively couple to the pneumatic supply system.

Alternatively, robotic picking arms 206' may be fixed on a frame above the grid and digging robot 205 or another bin carrying robot may transport a target container 110' to the fixed picking arm, which may grasp the desired item(s) and place the grasped items into an order bin carried by a transporter robot. In this manner, containers 110' need not be transported down the ports and back-and-forth from the picking/sorting stations.

Figure 20A:
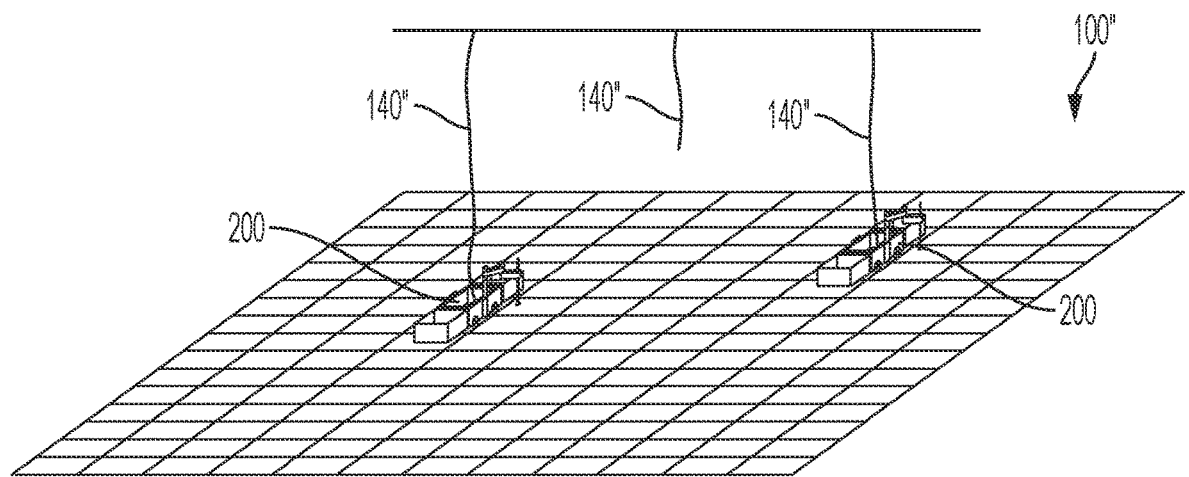
FIG. 20A is a schematic illustration of another modified storage structure including an assembly positioned above the storage structure and pneumatic supply lines extending from the assembly toward the storage structure.

FIG. 20A is a perspective view of yet another alternative robotic system 100" configured to efficiently store a plurality of stacked containers. Robotic system 100" includes all of the above described features of robotic system 100 and the additional features described hereinafter. Manipulator robot 200, or another manipulator robot, such as manipulator robot 600, may be positioned at a station on grid 126 (e.g., so as to not move), configured to move only within a specific area of the grid or otherwise stationed or configured to move about the warehouse. These robots may be permanently or selectively coupled to supply lines 140" that hang from a structure, such as the ceiling of warehouse 101, or otherwise extend toward the surface of grid 126 or toward the floor of the warehouse to provide the robots with access to a pneumatic supply when the robot is located on the grid or otherwise positioned off the grid within the warehouse, for example, on the warehouse floor. In some embodiments, supply lines 140" may be retracted, for example, via a drag chain cable carrier, a cable reel retractor or similar device to manage cable slack in the supply lines. Supply lines 140" may additionally include a power cord, or other mechanism, to supply a voltage to the manipulator robot when the robot is coupled to the supply lines. A container carrying robot, such as digging robot 205 or robot 600, can transport a container 110 to the manipulator robots stationed within a particular area of the grid, before inventory is picked from the container and deposited into other containers such as order bins 214 as described above with respect robot system 100.

Figure 20B:
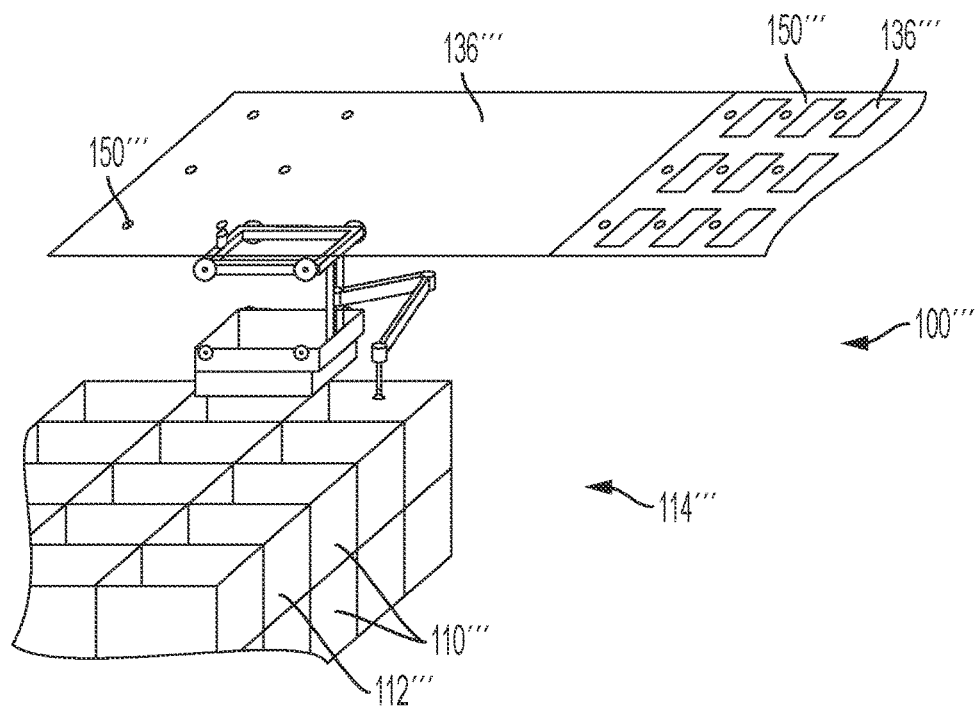
FIG. 20B is a schematic illustration of yet another modified storage structure in which the driving surface is spaced from the stacked containers.

FIG. 20B is a perspective view of still another alternative robotic system 100''' configured to efficiently store a plurality of stacked containers. Robotic system 100''' is substantially similar to robotic system 100 except for the differences in their respective storage structures and robots. Storage structure 114''' of robotic system 100''' need not include a grid, or any of the support members, used in connection with storage structure 114. Instead, containers 110''' are nested within each other and arranged in adjacent stacks 112'''. A driving surface 136''' is provided above the stacks. Driving surface 136''' may be formed of a ferrous or otherwise magnetic material and may be a solid surface (as shown on the left of FIG. 20B) or formed as a series of grid-like beams (as shown on the right of FIG. 20B). In either instance, driving surface 136''' may magnetically couple an inverted manipulator robot and/or an inverted digging robot to the surface, allowing the robot to traverse above the stacks 112''' of containers 100''' and to pick items from the containers 110 and/or dig the containers as described above with respect to robotic system 100. Any of the robots used in robotic system 100''' would be formed substantially as described above with respect to robotic system 100 except that their mobility assembly would be formed at a top portion of the robot body.

Driving surface 136''' may alternatively be formed of a non-magnetic material so long as the wheels of the inverted robots were positioned above the driving surface (with the body of the inverted robot positioned thereunder). As shown in FIG. 20B, driving surface 136''' may also include valves 150''' which allow the robot to access a pneumatic supply for any reason disclosed herein.

Figure 23:
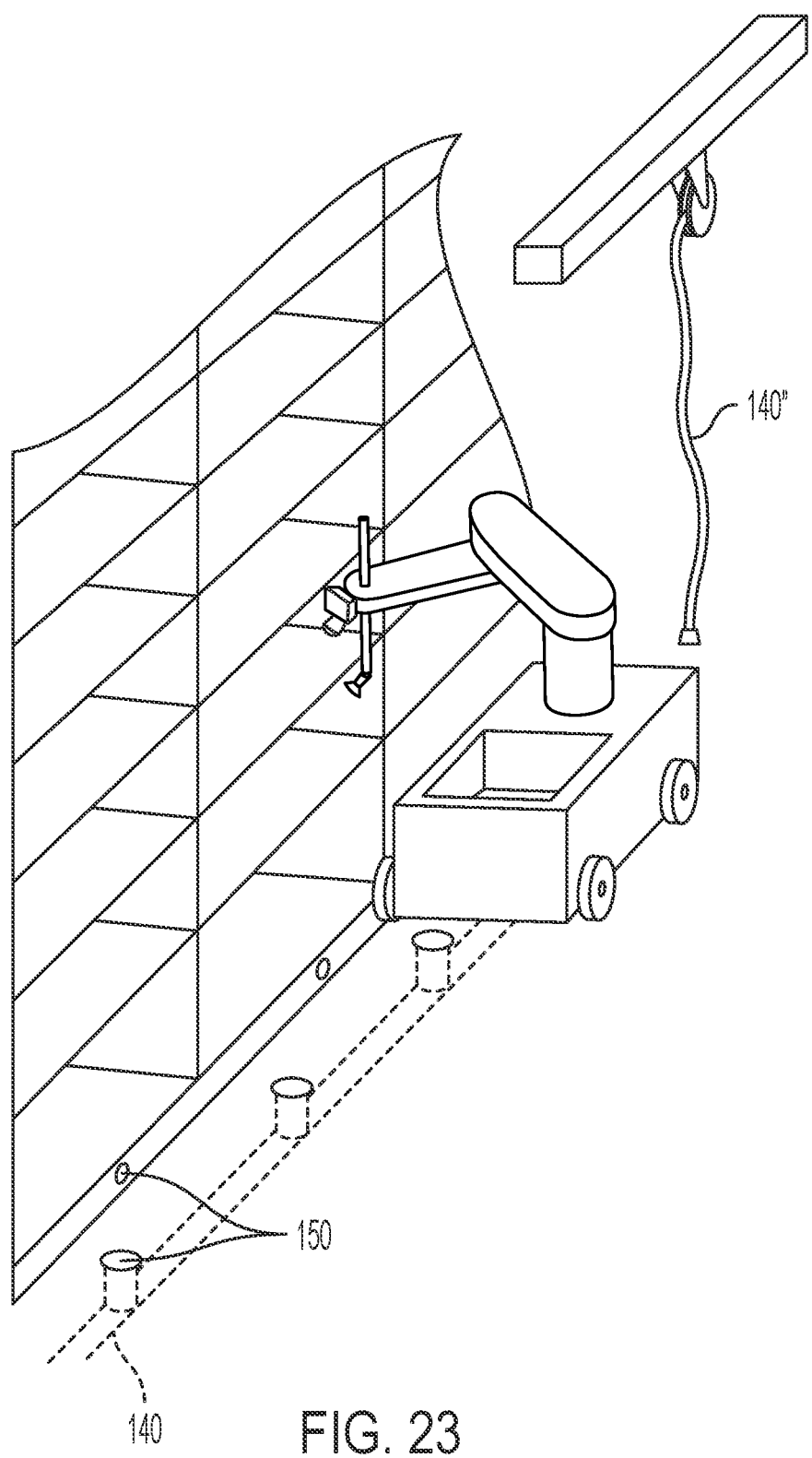
FIG. 23 is a schematic perspective view illustrating a mobile, manipulator robot traversing a warehouse floor and picking inventory items from a shelf.

Referring to FIG. 23, it will be appreciated that pneumatic air can also be supplied to a manipulator robot, such as robot 200 or robot 600, when the manipulator robots are positioned off of grid 126 and in other areas of the warehouse to facilitate product manipulation and/or piece picking and/or any other tasks such as packaging, unpackaging, fabrication, or manufacturing tasks. For example, a pneumatic air supply line may be provided within a shelf and/or within a warehouse floor and/or within a line or hose extending from a structure above the robot and downwards towards the robot so long as it is accessible to the coupler of any one of the manipulator robots disclosed herein. In this manner, when the robot is driven off of grid 126 to assist with other fulfillment tasks such as picking inventory from shelving and/or packaging the picked/sorted inventory at a picking/sorting station, the robot has access to a pneumatic supply to actuate its pneumatic tools. As a result, the same compact robots can be used in various areas of the warehouse to accomplish various order fulfillment tasks and can be driven in any direction across the warehouse floor without needing to carry large onboard air compressors or being permanently tethered to a flexible supply lines that could tangle up with other supply lines during movement of the respective robots.

Figure 28:
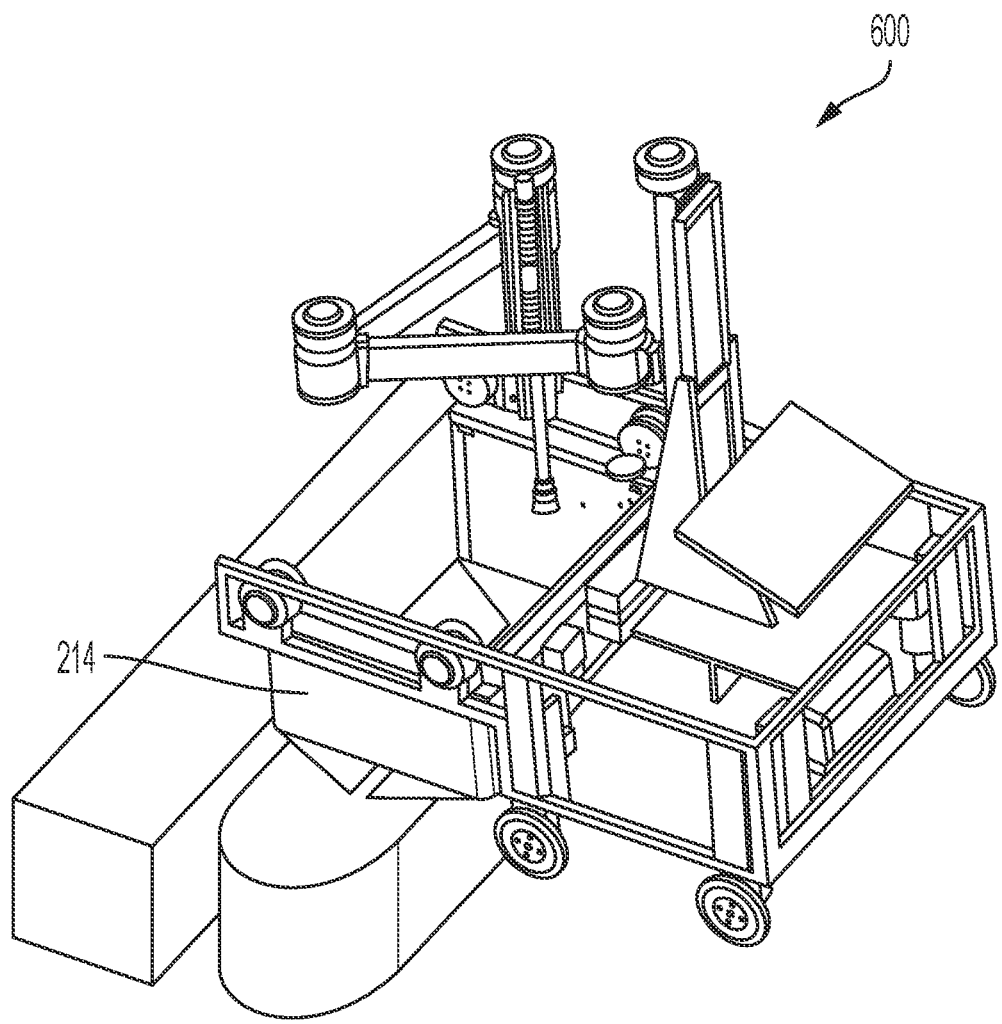
FIG. 28 is a schematic perspective view illustrating the manipulator robot of FIG. 16A depositing items into an auto-bagger.
Figure 29:
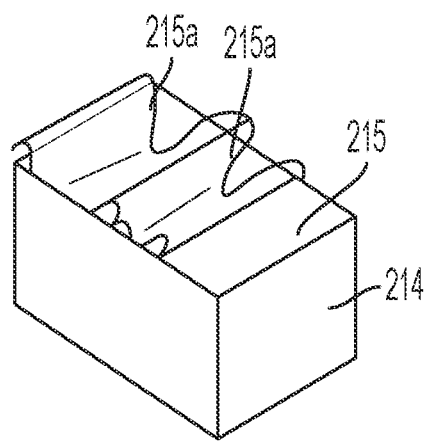
FIG. 29 is a schematic perspective view of a packing material for lining the inside of an order container.

Improved auto-bagging methods are discussed herein with reference to FIGS. 28 and 29. Turning to FIG. 28, any of the robots disclosed herein, such as robot 200 or robot 600, may carry an order bin 214 having slidable, pivotable or bomb bay doors at the bottom of the order container to facilitate the dumping of inventory items from the order container directly into an open bag, onto a packing surface or inside of a packing lining 215. Once the items have been deposited into the bag, an auto-bagger machine may wrap the items or seal the open end of the bag, thereby sealing the items therein. Alternatively, the robot can carry a small auto-bagging machine onboard. The onboard auto-bagging machine is preferably positioned and arranged to drop sealed items directly into the order bin 214. That is, after an item has been picked, the picking arm of the robot can place the item directly into the onboard auto-bagger which would seal the item before dropping the sealed item into order bin 214.

FIG. 29 illustrates the bag, or packing lining 215, in more detail. The packing lining 215 is designed to be placed within order container 214. Packing lining 215 may form one or more receiving spaces 215*a* having an open end through which inventory items can be inserted. With packing lining 215 disposed within order container 214, a manipulator robot such as robot 200 or robot 600 can pick items and place the items directly into the one or more receiving spaces which can subsequently be sealed by the robot or a separate sealing device.

Figure 26:
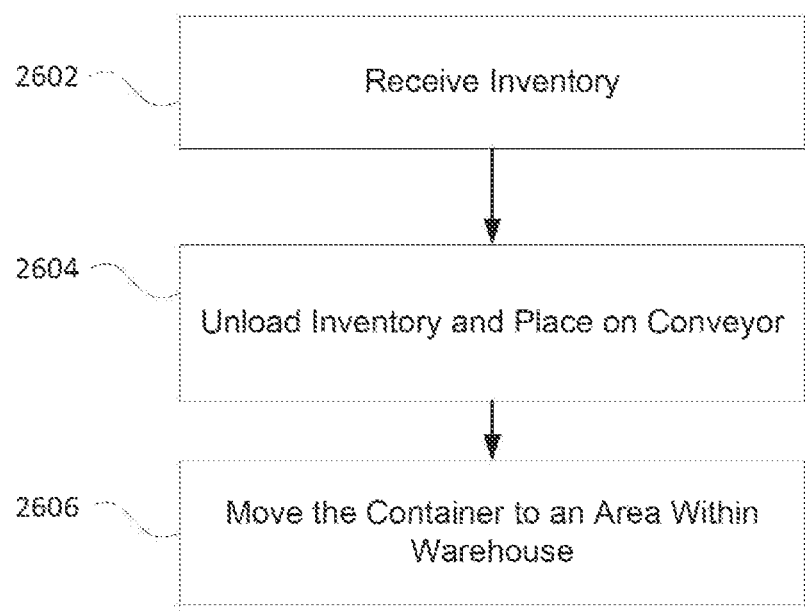
FIGS. 26 and 27 are flowcharts illustrating example order fulfillment processes.

FIG. 26 is flow chart 2600 illustrating the steps of an example order fulfillment process. As shown in block 2602 inventory arrives at a warehouse, such as warehouse 101, via a truck which may drive up to the warehouse dock door. The vendor cartons or containers are unloaded from the truck, at block 2604, either manually or using a robotic system within the truck and placed onto a conveyor. At block 2606, the conveyor or another operator moves the container to an area within warehouse 101, where any one of the robot described herein can use their container retrieval devices to pick up the containers and transport them to a different and desired area of the warehouse as represented by block 2608. In one example, the top or bottom face of the vendor carton may then be cut from the rest of the container ("de-lidded") and dumped into container 110 by any one of the mobile manipulator robots disclosed herein or manually by an operator. Alternatively, the entire "de-lidded" vendor carton may be placed inside of a tote. If the open face of the carton is an open top-face, the carton may be left inside of the tote and transported to a desired location within the warehouse. If the open face of the carton is an open bottom-face, the carton may be lifted from the tote which will automatically dump the contents of the carton into the tote. To ship an item from the warehouse, the inverse order is performed. In other words, the containers are transported by the container retrieval device of the robot, to the conveyor and then to the truck.

Figure 27:
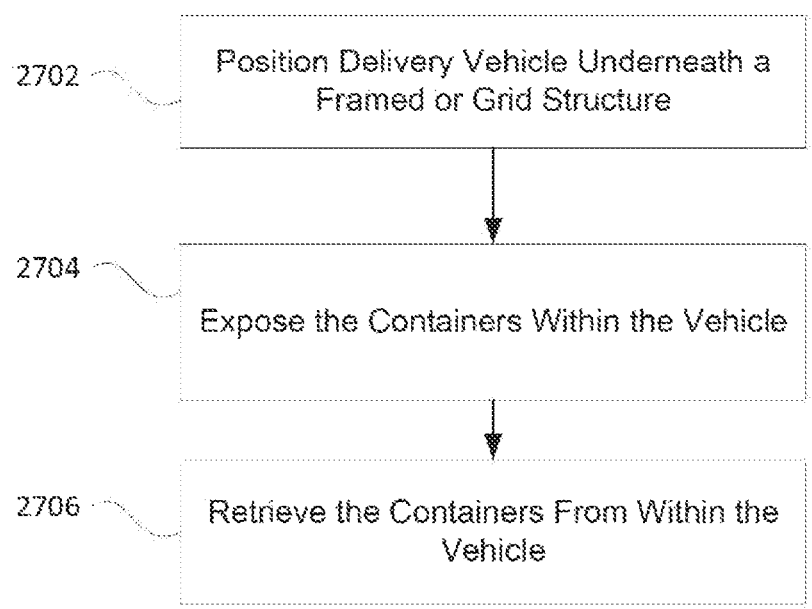

FIG. 27 is a flow chart 2700 illustrating the steps of another example order fulfillment process. As shown in block 2702, a truck drives inventory to a warehouse, such as warehouse 101, and arrives underneath a framed or "grid" structure similar to grid 126 described above. The truck may have a convertible top, a floor that is moveable relative to its top, or a removable pallet, pod or shipping container. At block 2704, the truck may remove its top, move its floor relative to its top, or otherwise exposes its pallet, pod or shipping container. Any of the robots having container retrieval devices described herein may then drive on the grid above the exposed containers and directly retrieve the containers from the truck bed, pallet, pod or shipping container, at block 2706. Once again, to ship an item from the warehouse, the inverse steps are performed. More specifically, the robots may carry containers from the warehouse to the grid above the truck and lower the containers directly into the truck bed.

Although the disclosure herein has been described with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A mobile robot, comprising:
   an energy source; and
   a charging system to charge the energy source, the charging system comprising:
   a coupler having a mating end configured to selectively mate with a valve of an external pneumatic supply system to access a pneumatic supply and selectively disengage with the valve; and
   a pneumatic actuator disposed downstream of the coupler, the pneumatic actuator configured to convert energy from the pneumatic supply to charge the energy source.

2. The robot of claim 1, wherein the pneumatic actuator is a piezo.

3. The robot of claim 1, wherein the energy source is a battery or a super/ultra-capacitor.

4. The robot of claim 1, wherein the pneumatic actuator is an air motor configured to convert the energy from the pneumatic supply to mechanical work.

5. The robot of claim 4, further comprising an electromagnetic device electrically connected to the energy source, the electromagnetic device having a rotor and configured to convert the mechanical work to electrical energy to charge the energy source.

6. The robot of claim 5, wherein the air motor is coupled to the rotor of the electromagnetic device by a shaft.

7. The robot of claim 4, wherein the air motor includes a rotational component configured to convert the energy from the pneumatic supply to the mechanical work via rotational motion.

8. The robot of claim 7, wherein the rotational component is a turbine.

9. The robot of claim 4, wherein the air motor comprises a diaphragm or a piston actuator to convert the energy from the pneumatic supply to the mechanical work via linear motion.

10. The robot of claim 1, further comprising a picking manipulator coupleable to a pneumatically actuated tool.

11. The robot of claim 10, further comprising at least one valve disposed downstream of the coupler and upstream of the pneumatic actuator and/or downstream of the coupler and upstream of the pneumatically actuated tool.

12. The robot of claim 1, further comprising an air tank.

13. The robot of claim 12, further comprising at least one valve disposed downstream of the coupler and upstream of the pneumatic actuator and/or downstream of the coupler and upstream of the air tank.

14. The robot of claim 1, further comprising a wheel assembly including a plurality of wheels configured to guide movement of the robot along a first profiled track extending in a first direction and a second profiled track extending in a second direction substantially orthogonal to the first direction.

15. The robot of claim 14, further comprising a first hoist plate extendable in a vertical direction relative to the body to secure and lift a container.

16. The robot of claim 15, wherein the first hoist plate is arranged to lift the container to a location positioned internally within the body.

17. The robot of claim 15, wherein first hoist plate is arranged to lift the container to a location positioned laterally outside of the body.

18. The robot of claim 15, further comprising a second hoist plate extendable in the vertical direction relative to the body to secure and lift a container.

19. A method of charging an energy source of a mobile robot comprising:
 selectively engaging a mating end of a coupler of the mobile robot to a valve of an external pneumatic supply system;
 accessing a pneumatic supply from the external pneumatic supply system;
 converting energy from the pneumatic supply to electrical energy; and
 charging the energy source.

20. The method of claim 19, wherein the converting step is performed by a piezo.

21. The method of claim 19, wherein the converting step comprises:
 (a) converting the energy from the pneumatic supply to mechanical work; and
 (b) converting the mechanical work to the electrical energy.

22. The method of claim 19, wherein the step (a) is performed by an air motor and the step (b) is performed by an electromagnetic device.

* * * * *